United States Patent
Hofmeister et al.

(10) Patent No.: US 12,109,737 B2
(45) Date of Patent: *Oct. 8, 2024

(54) NANOSTRUCTURES FROM LASER-ABLATED NANOHOLE TEMPLATES

(71) Applicant: ULTRA SMALL FIBERS, LLC, Wartrace, TN (US)

(72) Inventors: William Hudson Hofmeister, Nashville, TN (US); Alexander Yuryevich Terekhov, Murfreesboro, TN (US); Jose Lino Vasconcelos da Costa, Tullahoma, TN (US); Kathleen Stacia Lansford, Manchester, TN (US); Deepak Rajput, Tullahoma, TN (US); Lloyd M. Davis, Tullahoma, TN (US)

(73) Assignee: ULTRA SMALL FIBERS, LLC, Wartrace, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/139,335

(22) Filed: Apr. 25, 2023

(65) Prior Publication Data
US 2023/0405885 A1 Dec. 21, 2023

Related U.S. Application Data

(63) Continuation of application No. 17/492,862, filed on Oct. 4, 2021, now Pat. No. 11,667,062, which is a (Continued)

(51) Int. Cl.
*B32B 3/10* (2006.01)
*B29C 33/38* (2006.01)
(Continued)

(52) U.S. Cl.
CPC ........ *B29C 41/003* (2013.01); *B29C 33/3842* (2013.01); *B29C 41/02* (2013.01); *B29C 41/38* (2013.01); *B29C 41/42* (2013.01); *B82Y 10/00* (2013.01); *B82Y 40/00* (2013.01); *C08B 3/06* (2013.01); *C08B 5/02* (2013.01); *C08F 110/02* (2013.01); *C08F 120/18* (2013.01);
(Continued)

(58) Field of Classification Search
None
See application file for complete search history.

(56) References Cited

U.S. PATENT DOCUMENTS

| | | |
|---|---|---|
| 4,047,290 A | 9/1977 | Weitze et al. |
| 2005/0011873 A1 | 1/2005 | Withford |

(Continued)

OTHER PUBLICATIONS

Hongbo Lan and Yucheng Ding, Nanoimprint lithography https://www.intechopen.com/chapters/8680 (Year: 2010).*

(Continued)

*Primary Examiner* — Christopher M Polley
(74) *Attorney, Agent, or Firm* — Eric B. Fugett; Mark A. Pitchford; Pitchford Fugett, PLLC

(57) ABSTRACT

Solution casting a nanostructure. Preparing a template by ablating nanoholes in a substrate using single-femtosecond laser machining. Replicating the nanoholes by applying a solution of a polymer and a solvent into the template. After the solvent has substantially dissipated, removing the replica from the substrate.

14 Claims, 62 Drawing Sheets

Related U.S. Application Data continuation of application No. 14/560,833, filed on Dec. 4, 2014, now Pat. No. 11,155,007, which is a continuation of application No. 13/769,575, filed on Feb. 18, 2013, now abandoned.

(60) Provisional application No. 61/599,926, filed on Feb. 16, 2012.

(51) Int. Cl.
    *B29C 41/00* (2006.01)
    *B29C 41/02* (2006.01)
    *B29C 41/38* (2006.01)
    *B29C 41/42* (2006.01)
    *B82Y 10/00* (2011.01)
    *B82Y 40/00* (2011.01)
    *C08B 3/06* (2006.01)
    *C08B 5/02* (2006.01)
    *C08F 110/02* (2006.01)
    *C08F 120/18* (2006.01)
    *C08F 120/40* (2006.01)
    *C08G 63/08* (2006.01)
    *C08G 63/664* (2006.01)
    *C08G 77/04* (2006.01)
    *G03F 7/00* (2006.01)
    *B29K 1/00* (2006.01)
    *B29K 31/00* (2006.01)
    *B29K 33/00* (2006.01)
    *B29K 67/00* (2006.01)
    *B29K 71/00* (2006.01)
    *B29K 83/00* (2006.01)
    *B29L 31/00* (2006.01)

(52) U.S. Cl.
CPC ............ *C08F 120/40* (2013.01); *C08G 63/08* (2013.01); *C08G 63/664* (2013.01); *C08G 77/04* (2013.01); *G03F 7/0002* (2013.01); *B29K 2001/12* (2013.01); *B29K 2001/18* (2013.01); *B29K 2023/06* (2013.01); *B29K 2031/04* (2013.01); *B29K 2033/12* (2013.01); *B29K 2067/04* (2013.01); *B29K 2071/00* (2013.01); *B29K 2083/00* (2013.01); *B29K 2901/10* (2013.01); *B29K 2901/12* (2013.01); *B29K 2907/045* (2013.01); *B29K 2909/00* (2013.01); *B29K 2909/08* (2013.01); *B29K 2909/14* (2013.01); *B29K 2995/0026* (2013.01); *B29K 2995/0094* (2013.01); *B29L 2031/7562* (2013.01); *Y02P 20/582* (2015.11); *Y10T 428/24355* (2015.01); *Y10T 428/24802* (2015.01)

(56) References Cited

U.S. PATENT DOCUMENTS

| | | | |
|---|---|---|---|
| 2009/0047478 A1 | 2/2009 | Zhang | |
| 2011/0195124 A1 | 8/2011 | Jin | |
| 2011/0200795 A1* | 8/2011 | Lammers | G03F 7/0002 264/293 |
| 2011/0270221 A1 | 11/2011 | Ross | |
| 2013/0216779 A1* | 8/2013 | Hofmeister | B29C 41/02 428/141 |
| 2016/0222345 A1* | 8/2016 | Hofmeister | C12N 5/0068 |

OTHER PUBLICATIONS

Youn Sang Kim et al. High density nanostructure transfer in soft molding using polyurethane acrylate molds and polyelectrolyte multilayers. Jul. 17, 2003.

Frederic Madani-Grasset et al. Femtosecond laser micromachining of fused silica molds. Sep. 29, 2010.
C.Padeste, et al,. Replication of high aspect ratio pillar array structures in biocompatible polymers for tissue engineering applications. Nov. 30, 2010.Microelectronic Engineering. 88. 1836-1839.
Gates, Byron D. "Nanofabrication with molds & stamps." Materials today 8.2 (2005): 44-49. (Year: 2005).
Fill. In Lexico.com. Retrieved Sep. 2, 2020, from https://www.lexico.com/en/definiton/fill (Year: 2020).
Extracting. In Cambridge Dictionary. Retreived Sep. 2, 2020, from https://dictionary.cambrdige.org/US/dictionary/english/extracting (Year: 2020).
Duan, X. and C.M. Lieber, General Synthesis of Compound Semiconductor Nanowires. Advanced Materials, 2000. 12(4): p. 298-302.
Li, A.P., et al., Hexagonal pore arrays with a 50-420 nm interpore distance formed by self-organization in anodic alumina. Journal of Applied Physics, 1998. 84(11): p. 6023-6026.
Masuda, H., F. Hasegwa, and S. Ono, Self-ordering of cell arrangement of anodic porous alumina formed in sulfuric acid solution, Journal of The Electrochemical Society, 1997.144(5): p. L127-L130.
Masuda, H., K. Yada, and A. Osaka, Self-ordering of cell configuration of anodic porous alumina with large-size pores in phosphoric acid solution. Japanese Journal of Applied Physics Part 2—Letters, 1998. 37(11A): p. L1340-L1342.
Chao Wei, T., Y. Hong Tsu, and L. Kuan Ming, Innovative through-silicon-via-formation approach for wafer-level packaging applications. Journal of Micromechanics and Microengineering, 2012. 22(4): p. 045018.
Heidari, B., et al., Large scale nanolithography using nanoimprint lithography. Journal of Vacuum Science & Technology B, 1999. 17(6): p. 2961-2964.
Gwyn, C.W., et al., Extreme ultraviolet lithography. Journal of Vacuum Science & Technology B, 1998. 16(6): p. 3142-3149.
Marrian, C.R.K. and E.S. Snow, Proximal probe lithography and surface modification. Microelectronic Engineering, 1996. 32(1-4); p. 173-189.
Ceriotti, L., et al., Rectangular channels for lab-on-a-chip applications. Microelectronic Engineering, 2003. 67-8: p. 865-871.
Stewart, M.D. and C.G. Wilson, Imprint materials for nanoscale devices. Mrs. Bulletin, 2005. 30(12): p. 947-951.
Curtis, A.S.G. and M. Varde, Control of Cell Behavior—Topological Factors. Journal of the National Cancer Institute, 1964. 33(1): p. 15-&.
Dunn, G.A. and J.P. Heath, New Hypothesis of Contact Guidance in Tissue—Cells. Experimental Cell Research, 1976.101(1): p. 1-14.
Ohara, P. T. and R.C. Buck, Contact guidance in vitro: A light, transmission, and scanning electron microscopic study. Experimental Cell Research, 1979. 121(2): p. 235-249.
Hench, L.L., Sol-gel materials for bioceramic applications. Current Opinion in Solid State & Materials Science, 1997. 2(5): p. 604-610.
Knopp, D., D.P. Tang, and R. Niessner, Bioanalytical applications of biomolecule-functionalized nanometer-sized doped silica particles. Analytica Chimica Acta, 2009. 647(1): p. 14-30.
Tan, W.H et al., Bionanotechnology based on silica nanoparticles. Medicinal Research Reviews, 2004. 24(5): p. 621-638.
Schroedter, A., et al., Biofunctionalization of silica-coated CdTe and gold nanocrystals. Nano Letters, 2002. 2(12): p. 1363-1367.
Wang, C.G., et al., Synthesis, assembly, and biofunctionalization of silica-coated gold nanorods for colorimetric biosensing. Advanced Functional Materials, 2006. 16(13): p. 1673-1678.
Yang, Y., et al., Lipid coated mesoporous silica nanoparticles as photosensitive drug carriers. Physical Chemistry Chemical Physics, 2010. 12(17):p. 4418-4422.
Fisher, I., W.D. Kaplan, and M. Eizenberg, Dielectric property-microstructure relationship for nanoporous silica based thin films. Journal of Applied Physics, 2004. 95(10): p. 5762-5767.
Squires and Quake, "Microfluidics: fluid physics at the nanoliter scale," Rev. Mod. Phys., vol. 77, No. 3, pp. 977-1026 (2005).
Feynman, R.P., "There's plenty of room at the bottom," Eng. Sci., vol. 23, No. 5, pp. 22-36 (1960).

(56) References Cited

OTHER PUBLICATIONS https://en.wikipedia.org/wiki/Navier%E2%80%93Stokes_equations, last accessed Nov. 20, 2016.

Ho, C.M. and Y.C. Tai, "Micro electro mechanical systems (MEMS) and fluid flows," Ann. Rev. Fluid Mech., vol. 30, No. 1, pp. 579-612 (1998).

Mohamed, K. and A. Mohamad, "A review of the development of hybrid atomistic-continuum methods for dense fluids," Microfluidics and Nanofluidics, vol. 8, No. 3, pp. 283-302 (2010).

Priezjev, N.V., et al., "Slip behavior in liquid films on surfaces of patterned wettability: Comparison between continuum and molecular dynamics simulations," Phys. Rev. E, vol. 71, No. 4, p. 041608 (2005).

Higgins, J.S., et al., "Studies of cyclic and linear poly (dimethylsiloxanes): 3. Neutron scattering measurements of the dimensions of ring and chain polymers," Polymer, vol. 20, No. 5, pp. 553-558 (1979).

Keller, A. and A. O'Connor, "A study on the relation between chain folding and chain length in polyethylene," Polymer, vol. 1, No. 2, pp. 163-168 (1960).

Flory, "The configuration of real polymer chains," J. Chem. Phys., vol. 17, No. 3, pp. 303-310 (1949).

\* cited by examiner

300

400

800

1000

1500

1600

1900

2000

2100

2200

2300

2400

2500

2600

2700

2800

2900

3000

3100

3200

3300

3400

3500

3600

3700

3800

4500

4600

4700

4800

4900

5000

5300

5400

5500

5600

5700

5800

NANOSTRUCTURES FROM LASER-ABLATED NANOHOLE TEMPLATES

CROSS REFERENCE TO RELATED APPLICATIONS

This application is a continuation application of U.S. application Ser. No. 17/492,862, filed Oct. 4, 2021, which is a continuation application of U.S. application Ser. No. 14/560,833, filed Dec. 4, 2014, which is a continuation application of U.S. application Ser. No. 13/769,575, filed Feb. 18, 2013, which claims the benefit of U.S. Provisional Application No. 61/599,926, filed Feb. 16, 2012, and entitled "Ultra-High Aspect Ratio Nanostructure from Laser Ablated Nanoholes;" the disclosures of all of which are hereby incorporated herein in their entirety

TECHNICAL FIELD

The present disclosure relates generally to nanotechnology. Embodiments of the disclosed technology relate more specifically to nanostructures made using templates created using single pulse femtosecond laser machining.

BACKGROUND

Nanotechnology, in general, encompasses preparation, manipulation, and applications of nanoscale materials and structures. One reason behind going down in length scale is the deviation observed in material properties (physical, chemical, and mechanical) due to the manifestation of the statistical-mechanical and quantum-mechanical effects, which are otherwise not observed in their bulk counterparts. For example, the electronic properties of a material can significantly alter with the reduction in the size scale of the material because of pronounced quantum mechanical effects, which are more dominant when less than 100 nm size scale is achieved. Indeed, the terminology nano, from a materials perspective, is now typically applied to materials with at least one dimension less than 100 nm so that the quantum size effect can be observed and exploited for practical purposes.

Nanostructures are nanoscale materials with at least one dimension less than 100 nm per current scientific definition. Although this definition of nanostructures/nanomaterials is now widely accepted, it is still very common to regard anything on sub-micron (<1 μm) length scale as nano for simplicity on a case-to-case basis. Nanostructures or nanomaterials are considered to be the basis of nanotechnology; other aspects being nanofabrication, nanoscale characterization, and nanodevice systems. Nanofabrication is a collection of fabrication strategies used for the preparation of nanomaterials or nanostructures, and is broadly classified into top-down and bottom-up techniques. Nanoscale characterization is the examination of properties of nanoscale materials with the use of highly sophisticated analytical instruments, whereas nanodevice systems are mission-oriented nanoscale machines or apparatus made from several nanoscale objects or just molecules. Nanoscale-diameter-holes are referred to as nanoholes.

One of the most common bottom-up nanofabrication techniques used for the preparation of nanostructures is template synthesis. It has been used to prepare one-dimensional (1D) nanostructures from a variety of materials. Based on their morphology, nanostructures may be classified as nanowires, nanoribbons, nanopyramids, nanopillars, and nanocones, and may be synthesized either as topographical features on films or substrates via nanofabrication techniques or by solution synthesis.

Template synthesis may be described as a casting process, in which a mold is subjected to a deposition process to create structures within the holes/pores of the mold. The morphology and dimensions of the resulting structures depend on that of the holes in the mold from which they are cast. The four generic casting methods employed in template synthesis are: soft lithography, electrochemical or electroless deposition, vapor deposition, and injection molding.

Although there are several different types of molds used in the template synthesis of nanostructures, the four most commonly used are: anodized aluminum oxide (AAO); nanochannel glass (NCG); ion track-etch templates; and lithographically patterned templates (referred to as master pattern in soft lithography).

A variety of materials, e.g., metal, semiconductor, insulator, superconductor, and polymer, have been imprinted by template synthesis using AAO, NCG, and track-etch substrates. Attention has been paid to both the template preparation and imprinting strategies, so that high quality nano/micro structures can be fabricated and used. Although these templates have been useful for numerous applications, there still are many applications where they cannot fulfill the requirements. One disadvantage of these templates is the inability to control the physical arrangement of the nanoholes. Furthermore, in case of AAO and track-etch based template synthesis, the template is eventually dissolved in a chemical solution to harvest the cast structure. In summary, reusable templates with user-defined arrangement of nanoholes cannot be fabricated by any of these three techniques. By comparison, nanolithography offers ever-improving control on the physical arrangement of the nanoholes that a user can pattern on rigid substrates.

Nanolithography is essentially a patterning technique in which structures (e.g., arrays of nanoholes) of user-defined designs are produced at the surface of substrates such as silicon, fused silica, and acrylic glass. The lateral and vertical dimensions of the nanoholes are usually controlled post-patterning by an etching treatment (to increase the hole size) or a deposition treatment (to decrease the hole size by coating its sidewalls). Nanolithography constitutes a set of lithography techniques of which most routinely used are photolithography, electron beam lithography, and soft lithography.

Photolithography is a multi-step lithography process in which user-defined patterns may be transferred to substrates with the help of ultraviolet light and a pattern-carrying mask. In this process, the substrate first may be cleaned with wet chemical treatments to render the surface free of organic and inorganic impurities. The substrate then may be coated with a layer of photoresist by spin coating after exposing the substrate to a chemical that improves adhesion between the photoresist and the substrate. The photoresist coated substrate then may be heated at 80° C.-100° C. on a hot plate for up to a minute to expel excess photoresist solvent from the photoresist layer in a process called pre-baking, so that the substrate is ready for UV exposure. The photoresist then may be exposed to UV light through a photomask carrying the pattern, and then subjected to another baking process called post-exposure baking. A photomask is essentially a fused silica plate with user-defined patterns made on chromium. The UV light exposed photoresist may be chemically modified, which develops patterns onto the photoresist. Two types of photoresists exist: positive photoresist and negative photoresist. The UV exposed region on a positive photoresist is washed out upon developing, whereas the opposite results in case of a negative photoresist, i.e., the unexposed region is washed out. The penultimate step in photolithography is the pattern transfer process in which the patterned photoresist may be subjected to an etching treatment (dry or wet) for a time period corresponding to the desired feature size, which removes parts of the substrate not covered with the photoresist. Dry etching is an anisotropic etching process, which primarily may be employed when high aspect ratio and deep features are desired. The most common of all the dry etching processes is deep reactive-ion etching (DRIE) based on the Bosch process in which several hundred microns deep features may be produced on the substrate. In comparison, wet chemical etching is an isotropic etching process in which the maximum attainable depth for a feature equals the thickness of the photoresist used. The final step is the removal of the leftover photoresist. The resolution of the feature that may be produced on the substrate depends on the wavelength of the UV light used to expose the photoresist; in principle, the shorter the wavelength, the smaller the feature that may be produced. Thus, high-resolution features can be produced by reducing the wavelength. Over the years, many different types of UV sources have been used starting from gas-discharge lamps with up to 365 nm wavelength (till mid-1980s) to excimer lasers with 193 nm (current technology), which is expected to be superseded by the extreme ultra violet (EUV) source with up to 13.5 nm (also termed as next generation lithography. However, the depth of focus is negatively affected by the wavelength of the UV light, which restricts the thickness of the photoresist and eventually the depth of the final pattern.

EBL is a maskless lithography technique by which complex features may be produced on a substrate with very high resolution. The operational principle of EBL is similar to that of photolithography with the exception that EBL is a direct-write process where patterns may be directly engineered onto the substrate without the need of a mask. The substrate may be coated with a thin layer of resist (e.g., polymethylmethacrylate) by spin coating, pre-baked, subjected to pattern writing in an electron beam lithography system (e-beam system), followed by resist development and pattern transfer. One advantage of EBL over photolithography is that it is not diffraction-limited, and features with resolutions of up to 20 nm may be produced; indeed, sub-10 nm features can also be produced by EBL. However, the resolution of EBL is limited by the scattering of electrons in the resist. Furthermore, the throughput of EBL is very low as the processing time is directly proportional to the pattern area for a certain dose given by the equation $T*I=D*A$, where T is the exposure time, I is the beam current, D is the dose in Coulombs/cm$^2$, and A is the exposed area. In other words, it would take approximately 12 days to pattern a 1 cm$^2$ area with a 1 nA beam current and 1 mC/cm$^2$ dose.

Soft lithography is a form of nanolithography constituting a set of various non-photolithographic techniques centered on the principle of self-assembly and replication (or imprinting). The term "soft" in soft lithography is derived from the physical nature of the mold used (i.e., soft) for fabricating structures, where the soft mold itself is prepared from rigid templates. Rigid templates, also termed as master patterns, are reusable patterned substrates that are usually prepared by photolithography, EBL, or micromachining on materials like silicon and silica. The master pattern is first subjected to cast molding to form its replica on an elastomeric material like polydimethylsiloxane (PDMS) to prepare the soft mold or stamp, which is then used to generate structures or patterns by various techniques that are collectively termed as soft lithography. Over the years, soft lithography has evolved into one of the most economical and most convenient nanolithography techniques where features as small as sub-10 nm size scale have been successfully fabricated. Some commonly used soft lithography techniques are: replica molding (REM), microtransfer molding (µTM), micromolding in capillaries (MIMIC), solvent-assisted micromolding (SAMIM), and microcontact printing (µCP).

REM is a single-step replication technique used to create micro/nanoscale features by curing prepolymers cast into PDMS molds. UV or thermally curable prepolymers without any solvent and low shrinkage (typically less than 3% on curing) are used for REM. Polyurethane (PU) is an example of a UV curable prepolymer used extensively for replica molding. REM has also been employed against rigid molds for mass production of a variety of materials including compact discs (CDs), diffraction gratings, holograms, and micro-tools.

In a µTM process, a liquid prepolymer is first applied to the surface of a PDMS mold and the excess is removed by scraping, or blowing by passing a stream of gas, and then the liquid prepolymer filled mold is placed on the surface of a substrate. The prepolymer is thermally or UV cured to become solid and attached to the substrate after which the PDMS mold is delicately removed to leave behind the patterned structure on the substrate. Thermally curable epoxy resins and UV curable polyurethanes have been used as prepolymers for µTM.

MIMIC is a soft lithography method used to create micro/nanoscale features from a variety of materials, such as UV or thermally curable polymers with no solvents, functional polymer solutions, glassy carbon or ceramic forming precursor polymers, inorganic salts, sol-gel materials, colloidal solutions, polymer beads, and biologically functional macromolecules. In this method, a PDMS mold with channels is first placed on a substrate and then a low-viscosity prepolymer is placed at the open ends of the channels. The prepolymer fills up the channels by capillary action, which is then solidified by curing. The PDMS mold is then slowly removed from the substrate to create patterned features of the polymer.

SAMIM utilizes polymer films to create nanostructures on their surface from PDMS molds. However, only those polymer films can be used whose solvents do not affect the PDMS mold during micromolding. In this method, the surface of the PDMS mold is first wetted with a solvent that can dissolve (or soften) the polymer whose nanostructures are to be created. The PDMS mold with the solvent is then brought in contact with the polymer film held on a substrate. The solvent dissolves (or softens) a thin layer of the polymer and forms a gel that fills the patterns in the mold. When the solvent evaporates the gel inside the patterns freezes into solid polymer and forms polymer nanostructures on the substrate.

µACP is a printing process in which a soft mold like PDMS is covered with a chemical solution called ink and then brought into physical contact with a substrate after the ink has dried. A commonly used ink is a thiol solution, such as hexadecanethiol. Upon physical contact with the substrate, the thiol is transferred to the surface of the substrate resulting in the reproduction of the mold pattern. The three known configurations to transfer the ink, based on the geometry of the mold and the substrate, are: planar mold onto a planar substrate, nonplanar mold onto a planar substrate, and planar mold onto a nonplanar substrate. A derivative of µACP called nanocontact printing (NCP) is reported to pattern sub-50 nm features. µACP (and NCP)

have been investigated for applications in micromachining (where the ink acts as a resist for an etching process) and biological engineering (by patterning cells, DNA, and proteins).

In NIL, an imprint resist is first spin coated on the surface of a substrate and then pressed against a rigid mold whose features are to be reproduced. Once the right pressure is achieved between the imprint resist and the template, the imprint resist is either subjected to a thermal treatment or a UV light treatment for curing depending on the type of resist. If a thermoplastic polymer is chosen as the imprint resist, it is heated above its glass transition temperature to soften and acquire the impression of the template. The template is then slowly separated from the imprint upon cooling. The acquired impression in the imprint is the negative replica of the template, which is further subjected to a pattern transfer process (usually by reactive ion etching just like photolithography) to transmit the imprinted pattern in the resist to the substrate.

Very similar to this technique is the photo nanoimprint lithography (P-NIL), also called cold embossing or UV nanoimprint lithography (UV-NIL), in which a photoresist is used as an imprint material. The photoresist is either spin coated or dispensed with a scanning inkjet head (step and flash imprint lithography) on a transparent substrate, brought in contact with the template to maintain a certain pressure in between, and then cured by exposing to UV light. The photoresist undergoes crosslinking and hardens, and acquires the impression of the template after which they are slowly detached from each other. This step is also followed by a pattern transfer process to transmit the features from the imprint into the substrate.

Developed as a low manufacturing cost and high-throughput method to fabricate nanoscale features, the NIL technique was demonstrated to create features from 25-nm resolution up to sub-10 nm resolution, and was successfully applied to produce magnetic nanostructures, quantized magnetic disks, silicon field effect transistors, semiconductor nanowires, and nano-compact disks. Indeed, it was shown that NIL can be scaled up to fabricate large area patterns as well.

Many more techniques have been investigated and reported for patterning substrates, such as laser based nanolithography techniques including femtosecond laser micromachining, dip pen lithography (DPN), extreme UV lithography (EUV), proximal-probe lithography, x-ray lithography, ion beam lithography including focused ion beam milling, proton beam writing, and more recently neutral particle lithography.

SUMMARY

The present technology includes methods for preparing nanostructures and the products made by those methods. In some embodiments, a template can be prepared by ablating nanoholes in a substrate using single-femtosecond laser machining. The nanoholes can be replicated by applying a solution of a polymer and a solvent into the template. After the solvent has substantially dissipated, the replica can be removed from the substrate. In some embodiments, the polymer solution comprises one of: cellulose acetate in acetone, polycaprolactone (PCL) in chloroform, PCL-polyethylene glycol in chloroform, polydimethylsiloxane in heptane, polymethylmethacrylate in toluene, polyvinyl alcohol in de-ionized water, and collodion in amyl acetate. In some embodiments, the polymer is capable of forming a continuous film. In some such continuous film embodiments, the polymer is capable of forming a continuous film through the application of external energy. In some embodiments, the polymer solution comprises a two percent (2%) solution by weight of one of: cellulose acetate in acetone, polycaprolactone (PCL) in chloroform, PCL-polyethylene glycol in chloroform, and collodion in amyl acetate; while in other embodiments, the polymer solution comprises a solution between two percent (2%) and ten percent (10%) by weight of cellulose acetate in acetone. In yet further embodiments, the polymer solution comprises a twenty five percent (25%) solution by weight of polydimethylsiloxane in heptane; or a solution of between five percent (5%) and ten percent (10%) by weight of polymethylmethacrylate in toluene; or a five percent (5%) solution by weight of polyvinyl alcohol in de-ionized water.

In some embodiments, prior to applying a solution of a polymer and a solvent into the template, a fluorocarbon-based antistick coating can be applied to the template. In some such embodiments, the fluorocarbon-based antistick coating is prepared from perfluorodecyltrichlorosilane.

In some embodiments, a template can be prepared by ablating nanoholes in a substrate using single-femtosecond laser machining. The nanoholes can be replicated by applying a polymer resin into the template. After allowing the resin to set, the replica can be removed from the substrate.

In some embodiments, a template can be prepared by ablating nanoholes in a substrate using single-femtosecond laser machining. The nanoholes can be replicated by casting a solution of a polyethylene and a solvent into the template. After the solvent has been allowed to substantially dissipate, the polyethylene as cast in the template can be melted through application of energy. After allowing the melted polyethylene to cool, the cooled polyethylene replica can be removed from the substrate. In some such embodiments, the polymer solution comprises ten percent (10%) solution by weight of polyethylene in toluene. In some such embodiments, melting comprises heating to about one hundred fifty five (155) degrees Celsius for about two (2) minutes; and cooling comprises cooling at room temperature for at least about two (2) hours.

DETAILED DESCRIPTION

Figure 1:
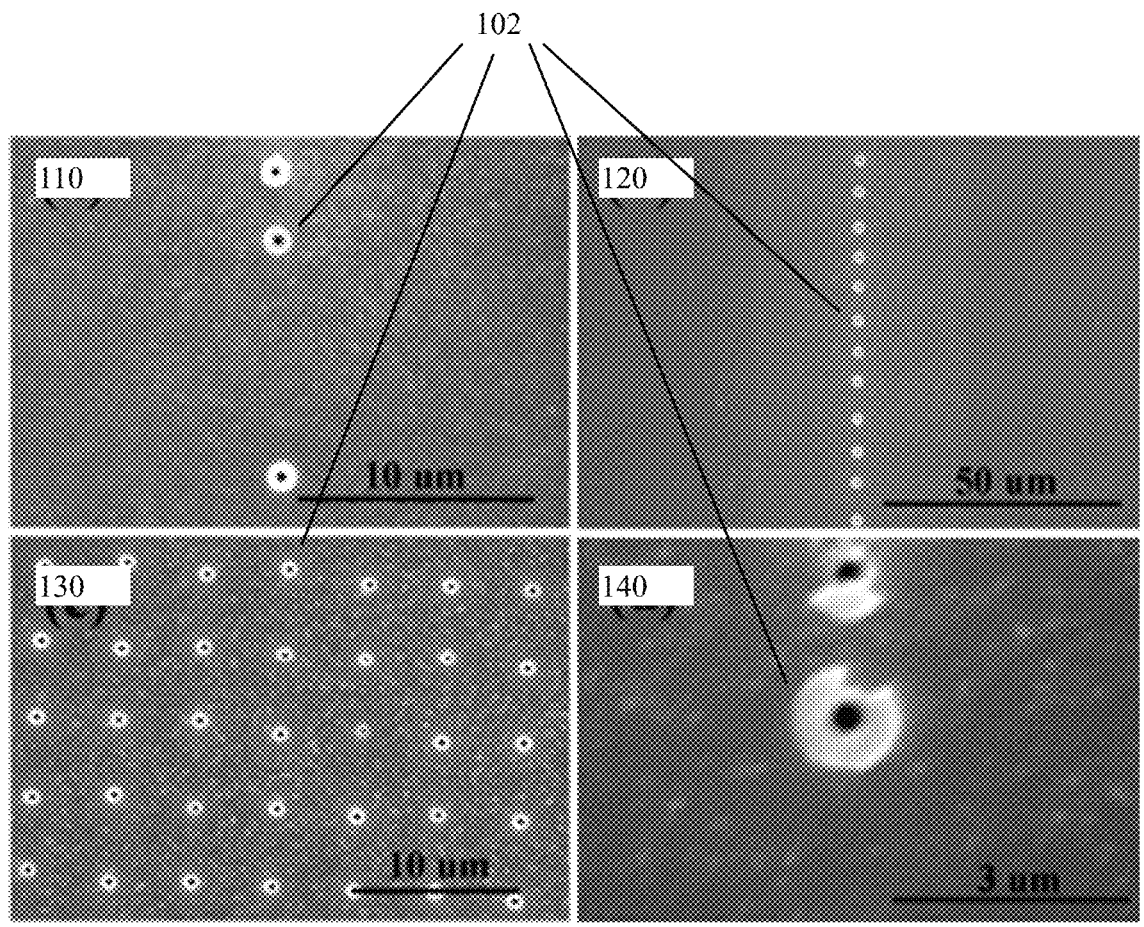
FIG. 1 presents Scanning Electron Microscope (SEM) images of nanoholes produced at the surface of fused silica.

None of the nanofabrication techniques identified herein has so far been reported to produce large area patterns of high aspect ratio (at least 10:1) nanoholes of depths more than at high production rates other than single-pulse amplified femtosecond laser machining Substrates with user-defined patterns of high aspect ratio nanoholes of depths more than 10 µm can be used in template synthesis of micro/nano structures by replication. Single-pulse amplified femtosecond laser machining is a method by which >25:1 aspect ratio and >10 µm deep nanoholes may be produced. Templates produced by this technique can be used to fabricate structures by imprinting methods. Also discussed in brief are some applications where these imprinted structures can be used.

Many different types of materials like metals, alloys, glass, semiconductors, refractories, composites, and polymers have been subjected to laser treatment and explored for myriad applications. Some examples of laser materials modification techniques are laser cutting, drilling, welding and brazing, alloying and cladding, surface coating, surface hardening, surface texturing, milling, machining, semiconductor doping, interference lithography, and solid freeform fabrication. Both continuous and pulsed modes of laser operation are used to accomplish these materials modification processes. In particular, pulsed mode is employed where high peak intensities are required for material modification. Embodiments of the present technology involve ablation of optically transparent materials that require high peak intensities for permanent structural modification.

Femtosecond lasers have been widely used for micromachining of a variety of transparent materials due to their versatility in producing geometrically complex structures in three-dimensions with very high precision. Nonlinear absorption of laser energy by means of multiphoton ionization or tunneling ionization followed by avalanche ionization causes optical breakdown in transparent materials. Micromachining of wide band gap transparent materials with femtosecond laser pulses has been reported for applications like binary storage data, optical waveguides, waveguide splitters, waveguide optical amplifiers, nanogratings, microfluidics, and flexures. Transparent materials like fused silica, borosilicate glass, soda lime glass, BK7 optical glass, plastic, single-crystal quartz, diamond and sapphire have been successfully micromachined with femtosecond laser pulses.

Fused silica is one of the key transparent substrates used extensively for lab-on-a-chip device applications. Fused silica offers a combination of properties like wide range of spectral transparency, low autofluorescence, good biocompatibility, chemical inertness, near zero thermal expansion, excellent thermal shock resistance, and low dielectric constant and losses. Laser induced breakdown in fused silica with femtosecond pulses was first reported in 1994. Micromachining of fused silica for lab-on-a-chip applications has been accomplished by numerous investigators.

Figure 2:
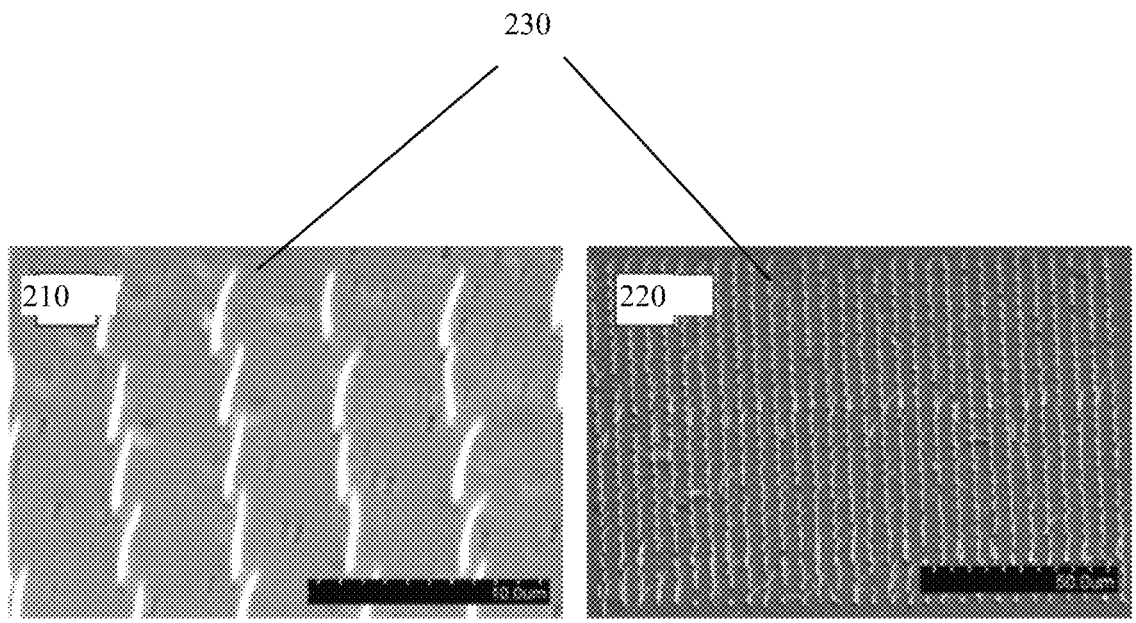
FIG. 2 presents SEM images of the replicas of femtosecond laser machined fused silica shown in FIG. 1.
Figure 3:
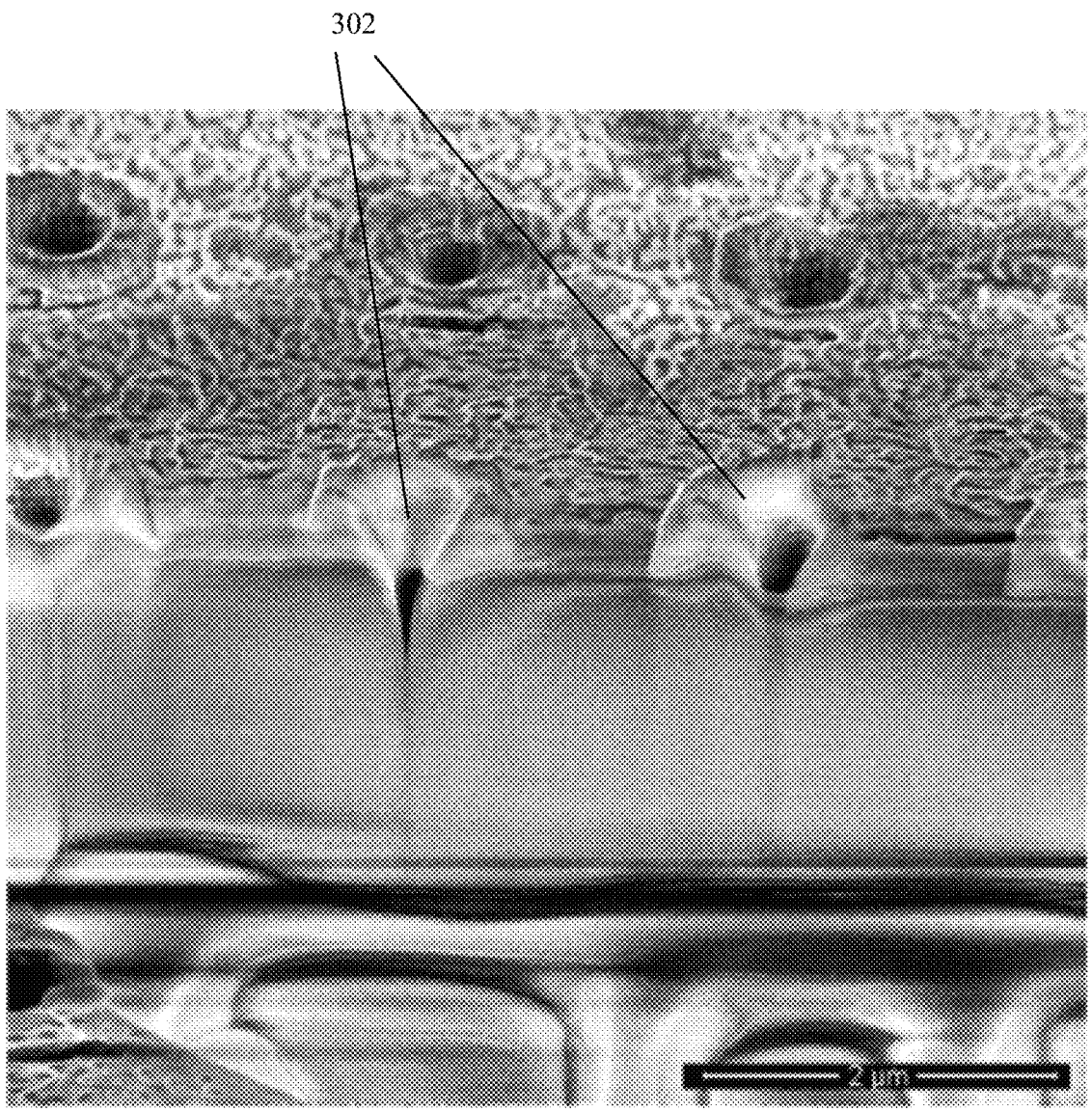
FIG. 3 is an SEM image of nanoholes.

A highly intense and tightly focused laser pulse from an amplified femtosecond (fs) laser system can induce a permanent structural change in the bulk of a transparent material due to nonlinear absorption. Making use of this nonlinear absorption phenomenon, others have demonstrated the formation of high aspect-ratio nanoscale diameter holes, or nanoholes, of depths greater than 10 µm at the front surface of fused silica by focusing single pulses of temporal length 160 fs using a high numerical aperture (NA=0.85) microscope objective lens. Hole depths were determined by measuring the lengths of the nanowires produced by cellulose acetate (CA) polymer replication (also termed as nanoimprinting) of the patterned fused silica templates, and then validated those measurements by focused ion beam (Dual-Beam™ SEM/FIB) sectioning of the nanoholes. It was found that the nanoholes' depth measurement by CA polymer nanoimprinting slightly underestimates their actual depth, which makes cellulose acetate polymer nanoimprinting a valid method for nanohole depth estimation. FIG. 1 shows four (4) SEM images 110, 120, 130, and 140 of nanoholes 102 machined into a fused silica substrate using SP-AFL machining FIG. 2 shows two (2) views 210, 220 of an array of CA nanowires 230 obtained by nanoimprinting. An SEM image 300 of the sectioned nanoholes 302 is shown in FIG. 3.

Several authors have reported the formation of nanoholes in transparent materials by single-pulse femtosecond laser machining One author produced 8 µm deep holes by focusing single shots of temporal length 600 fs at the rear surface of a Corning 0211 glass cover slip using a microscope objective with numerical aperture NA=0.65. Another author reported the formation of 20-30 µm deep nanoholes at the front surface of a Corning 0211 glass cover slip patterned using single-shot femtosecond diffraction-free Bessel beams. The mechanism(s) responsible for the formation of such deep holes by tightly focused single-pulses from an amplified femtosecond laser are still unclear and open to discussion. A third group proposed the longitudinal spherical aberration in the focal region of the laser beam caused by the microscope objective lens combined with self-focusing to be responsible for the formation of nanoholes, whereas others proposed the role of self-focusing. Furthermore, studies have hypothesized that the laser beam undergoes reshaping upon interaction with the glass surface, which leads to the formation of deep nanoholes. As yet, none of the reported mechanisms have fully expounded the formation of nanoholes.

As stated above, there is no nanolithography technique known yet that can produce high aspect ratio (>10:1) and deep (>10 µm) nanoholes economically, conveniently, and at high production rate. Although in its infancy, single-pulse amplified femtosecond laser machining by White et al. appears to have filled this gap by which >25:1 aspect ratio and >10 µm deep nanoholes have been successfully produced at the surface of fused silica. Moreover, cellulose acetate replication of these nanoholes unveils a novel-yet-simple imprinting strategy for creating high aspect ratio and tall polymer structures. In addition, it is possible to modify the physical and chemical properties of these imprinted structures by functionalizing them to create novel structures. For example, silica nanowires can be created by coating a thin layer of silica on top of CA nanowires. Similarly, alumina and titania nanowires can also be created. As these polymer structures have high surface area, are physically arranged in a controlled manner, and can be subsequently functionalized, they are useful for a number of applications, such as photovoltaics, high surface area electrodes, and synthetic cell culture substrates.

Nanostructures are routinely fashioned via replication (also termed imprinting) of patterned substrates. Some of the well-established replication strategies that use nanofabricated templates as molds are discussed earlier herein. Replication strategies used in soft lithography and nanoimprint lithography are of particular interest as they make use of templates with customizable nanoholes, just like SP-AFL machined templates. CA film replication of SP-AFL machined fused silica substrate resembles solvent-assisted micromolding (SAMIM) of soft lithography. The only difference being the type of mold used; SAMIM uses soft templates (PDMS molds), whereas White et al. used rigid templates (fused silica molds). Soft molds like PDMS cannot be used with many solvents because of their affinity towards chemical reactions, such as swelling, which severely limits their application as templates. Nanoimprint lithography uses rigid templates like silicon and fused silica, but the replication material reported so far has always been in liquid phase, such as photoresist and PMMA, which is subjected to either UV curing or thermal treatment to form the replica. Moreover, the ultimate objective of the polymer replica in nanoimprint lithography is to act as a mask to transfer the pattern into the substrate by reactive ion etching. Since nanoimprint lithography is dependent on polymer type, its application as a replication strategy for imprinting polymer structures is also limited.

This disclosure discusses the capabilities of SP-AFL machined fused silica substrates as templates for imprinting polymer structures by film based and, in particular, solution based replication strategies. Indeed, solution based replication offers several advantages over film-based replication (explained later), which makes it more versatile in its applicability. One of the applications of polymer structures imprinted from SP-AFL machined templates is in cell biology, where they can be used as synthetic cell culture substrates with tunable topography.

The regulation of cytoskeletal configuration of a cell in response to variations in extracellular neighborhood is a long established phenomenon, and has remained a key research area in developmental biology, biomedical engineering, and pharmacology. This regulation is governed by sensory mechanisms of the cell that respond to physical and chemical signals arising from the micro/nano environment. The cell can assay these signals and undergo a change in its morphology, conduct, and/or motility; collectively termed morphogenesis. The cellular response to externally applied mechanical forces is currently being explored by many researchers to understand the physical behavior of different cell types. Topography, compliance, texture, and anisotropy of the extracellular matrix (ECM) or the cell culture substratum affect these physical forces and influence cell phenotype and activity responsible for embryogenesis, cell regeneration, and wound healing. Hence, it is essential to understand the characteristics of the physical interaction between the cells and their interaction with substrate features to further advance cell biology and regenerative medicine.

The effect of substratum topography on cell physiology was predicted as early as the 1890's, and experimental observations of these effects coincide with the genesis of cell culture in the 1910's by Harrison. Since then studies on cellular response to solid substrata, also referred to as stereotropism or thigmotaxis, have been actively pursued. Indeed, topographical control of cell behavior has been the subject of numerous review articles over the years, focusing on the physical characteristics of the interaction between different cell types and different topographical features. Early investigations on stereotropism were done on fibrous, mechanically roughened, and mechanically patterned (grooves and ridges) substrata with unrefined definitions. More precisely patterned substrata with good control on topography and geometric profiles were made available with the advent of photolithography and electron beam lithography. Present studies on topographical control of cell physiology are mostly done by culturing cells on flat substrata with 2D topography in which feature size is normally in the range 10 nm to 3 µm. 2D topography is obtained by creating arrays of features like nanogratings, nanopillars, and nanoholes on cell culture substrata via various micro/nanolithography and nanofabrication techniques. The size scale of these topographical features is typically smaller than the cell in both lateral and vertical dimensions, and has been found to affect the morphology, survival, adhesion, proliferation, and locomotion of certain cell types. When features are considerably larger in vertical dimension and are spaced at least one cell dimension apart, they tend to behave as physical barriers and provide 3D environments that specifically influence cell morphology, spreading, and alignment by providing more cell-matrix interaction sites, particularly observed in case of fibroblast attachment and motility.

Cell motility is governed by the polarization of the protrusions (extension and contraction) of its plasma membrane caused by polymerization and depolymerization of actin filaments. Surface receptors like integrins and membrane proteoglycans in the protrusions facilitate physical interaction of the cell with its ECM, and provide adhesion to the neighboring stroma. However, presence of any feature or obstacle near the cell is sensed by these receptors, which influences its protrusions and eventually affects cell attachment, orientation, viability, and motility. The phenomenon of contact guidance is an example of such a cellular response to topographical features. From materials standpoint, a variety of metals, ceramics, and polymers exhibiting suitable biocompatible properties are used to make substrata for in vitro cell culture studies. Currently, polymers are being explored as cell culture substrata as they can be easily and efficiently patterned via soft lithography with nano/microscale features, for example polydimethylsiloxane (PDMS). Micropillar arrays of PDMS and silicon prepared via nanolithography are commonly used to study behavior of different cell types in 3D micro environments.

Polymer structures imprinted from SP-AFL machined fused silica are a great candidate as synthetic cell culture substrates to study cell behavior as they are created by a simple replication technique with very high throughput and reproducibility. In addition, fused silica is chemically inert to organic solvents, so templates made on fused silica last for a very long time. With solution based replication strategy, structures from virtually any polymer or polymer blend (that makes continuous films) can be easily imprinted for cell study e.g., polycaprolactone (PCL). Imprinted polymer structures can be subsequently functionalized to create bioactive structures, such as silica nanocones, and used in biological applications.

Silica and silica-coated materials constitute a special class of materials, which is used in a variety of biological and biomedical applications. Silica is chemically inert to most organic substances, which makes it a suitable host material for many biological environments. Silica is a well-known catalytic support. In addition, silica can be easily functionalized as the hydroxyl groups (—OH) present at its surface can covalently bond with other biochemical molecules, such as amino (—NH$_2$) and carboxyl (—COOH) groups. Functionalized silica allows further conjugation with other functional groups and biological agents, thus making silica a material of choice for many bioapplications. Therefore, materials intended for use in biological applications (e.g., nanoparticles and quantum dots) are often coated with silica to improve their biocompatibility. Biosensing, bioimaging, and drug targeting are some examples where functionalized silica is consistently used.

Nanoscale surface coatings or nanoencapsulation based on silica has also been a subject of great interest. Nanoscale silica has been successfully produced by methods like chemical vapor deposition (CVD), catalyst-controlled room temperature chemical vapor deposition, microemulsion, atomic layer deposition, sol-gel synthesis (Stober's method), and liquid phase deposition. Silica coatings for bioapplications are most commonly produced by solution-based methods of sol-gel and microemulsion. However, these methods require prolonged soaking in chemical solutions, which is unsuitable to imprinted polymer structures (such as the ones replicated from SP-AFL machined templates) as they can swell or disintegrate. Furthermore, imprinted polymer structures cannot be exposed to high temperatures as well because they can oxidize or may even burn. Thus, the only way to coat polymer structures with silica is by low temperature CVD process. Indeed, coating these polymer structures with any material should be done at low temperature to maintain their structural integrity. Besides low temperature CVD, imprinted polymer structures can also be functionalized by sputtering and thermal evaporation methods. Coating processes such as sputtering emit fast-moving ions and thermal evaporation emit radiation that can distort the shape of thin polymer structures, thus cooling the polymer below its glass transition becomes imperative to sustain the impact of ions and heat.

Single-pulse amplified femtosecond laser machining has emerged as a direct-write nanolithography technique for patterning transparent materials with user-defined arrangement of nanoholes. It is based on the principle of nonlinear absorption of photons leading to optical breakdown in the bulk of the transparent material. Nanoholes are produced by tightly focusing amplified femtosecond laser single pulses through a high numerical aperture microscope objective lens at the surface of the transparent substrate such as fused silica. Cellulose acetate replication and DualBeam™ SEM/FIB cross sectioning of the nanoholes made on fused silica reveal that the holes are >10 μm deep with aspect ratio >25:1 (White et al.).

CA film replication of the nanoholes produced by this technique by White et al. illustrates a facile method of creating high aspect ratio polymer structures that are suitable for many applications. Besides polymer films, polymer solutions can also be used for replication, which will offer complete freedom on the final chemistry of the polymer structures and will also allow replication from thermosets. Replicated polymer structures can be subsequently functionalized by coating with various materials such as oxide dielectrics and metals. Silica coated polymer structures can be used in biological applications.

The reason behind the formation of high aspect ratio nanoholes by tightly focused single femtosecond laser pulses is still not clear and open to discussion. A clear understanding of nanohole formation is important to the fabrication of templates as it is to the current debate, as it could lead to improved hole parameters, such as diameter, depth, and conical profile. Of all the proposed mechanisms, the role of spherical aberration on nanohole formation can be investigated by optical modeling and ablation experiments using an aspheric lens. An aspheric lens is an optical element with non-spherical surface geometry designed to eliminate spherical aberration in the focal region of a perfectly collimated laser beam fully filling the entrance pupil of the lens. Herein, an aspheric lens is used for laser ablation experiments in collimated (no spherical aberration) and non-collimated (with spherical aberration) conditions to study the role of spherical aberration on nanohole formation.

Fused silica templates prepared by single-pulse amplified femtosecond laser machining can be used as molds to create polymer structures by replication. A new replication procedure based on polymer solutions, termed solution casting, is investigated alongside the already known film based replication. Different types of polymer structures are imprinted from these templates to demonstrate the versatility of the replication procedures.

Modifying the properties of these polymer structures by functionalizing or coating with other materials will further advance their practical applications. A low-temperature chemical vapor deposition process is developed to coat the polymer structures with silica to create silica structures. As silica is used extensively in bioapplications, silica structures produced by this technique are investigated for applications in tissue engineering as cell culture substrates to study cell behavior.

Investigation of the current technology was conducted in part using a femtosecond laser machining system at controlled ambient temperature (21° C.) and atmospheric pressure in a class 1000 cleanroom facility. Mounted on a vibration isolated optical table, the amplified femtosecond laser machining system includes an amplified femtosecond laser set-up; and a machining workstation, details of which are described in the following paragraphs.

Figure 4:
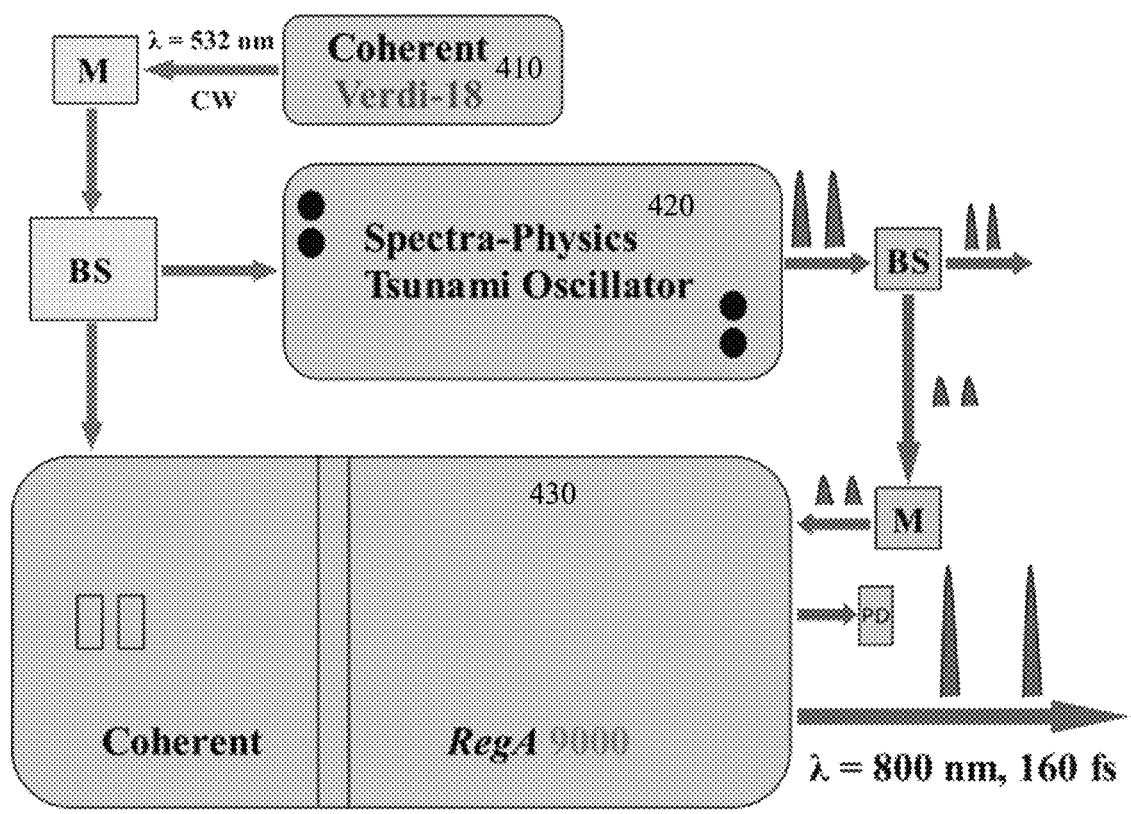
FIG. 4 is a schematic of an amplified femtosecond laser pulses generation in an amplified femtosecond system.

FIG. 4 shows a schematic of the femtosecond laser set-up 400. The amplified femtosecond laser set-up includes a diode pumped frequency doubled neodymium-doped yttrium orthovandate (Nd: YVO$_4$) laser operating at 532 nm (Coherent, Inc., Verdi V18) 410, a titanium-sapphire laser oscillator (Spectra Physics Inc., Tsunami Model-3941) operating at 76 MHz 420, and a 250 kHz titanium-sapphire regenerative amplifier (Coherent, Inc., RegA 9000) 430. The titanium-sapphire laser oscillator 420 seeds the titanium-sapphire regenerative amplifier to generate amplified femtosecond laser pulses at the rate of 250 kHz, while both the oscillator 420 and the regenerative amplifier 430 are pumped by the 532 nm green diode laser 410.

Figure 5:
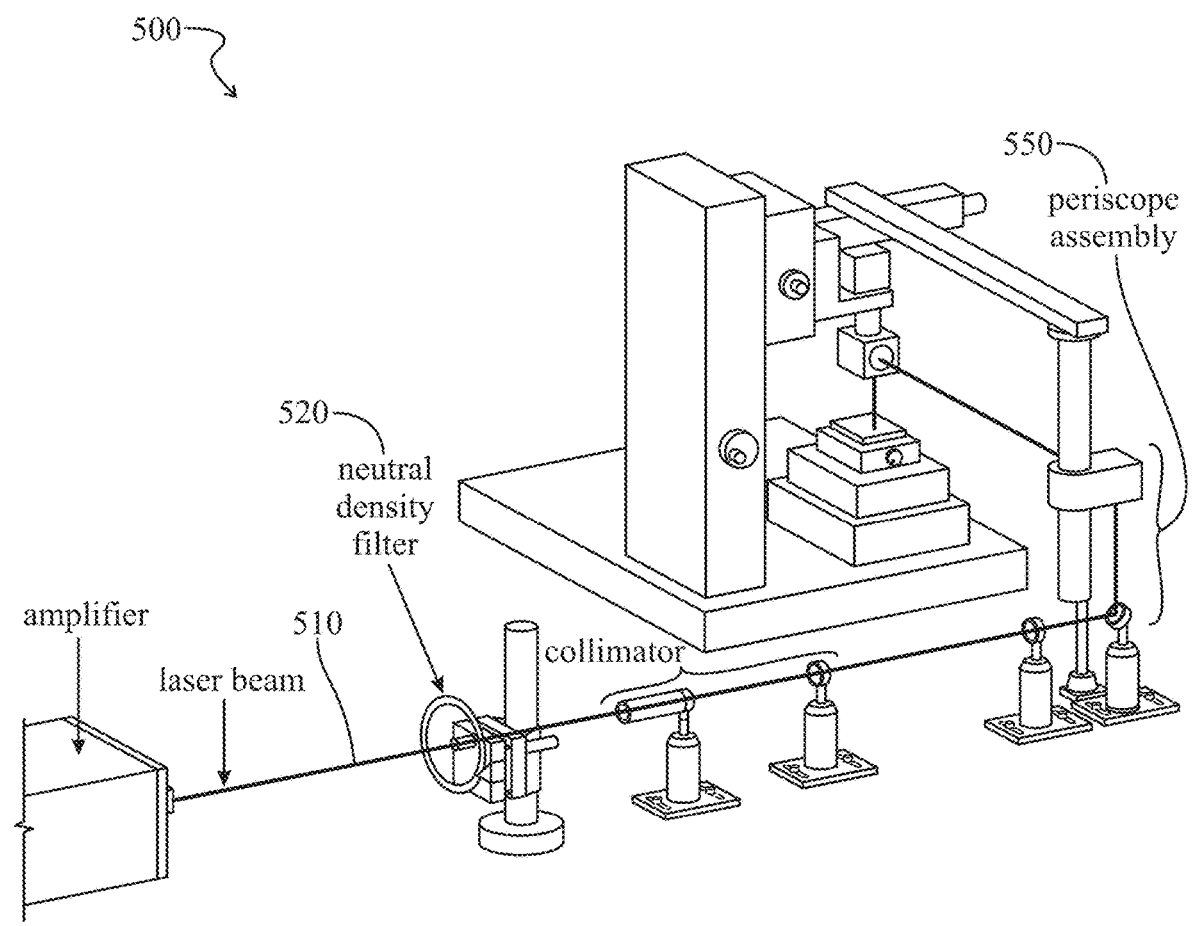
FIG. 5 illustrates a femtosecond laser beam propagation path.
Figure 6:
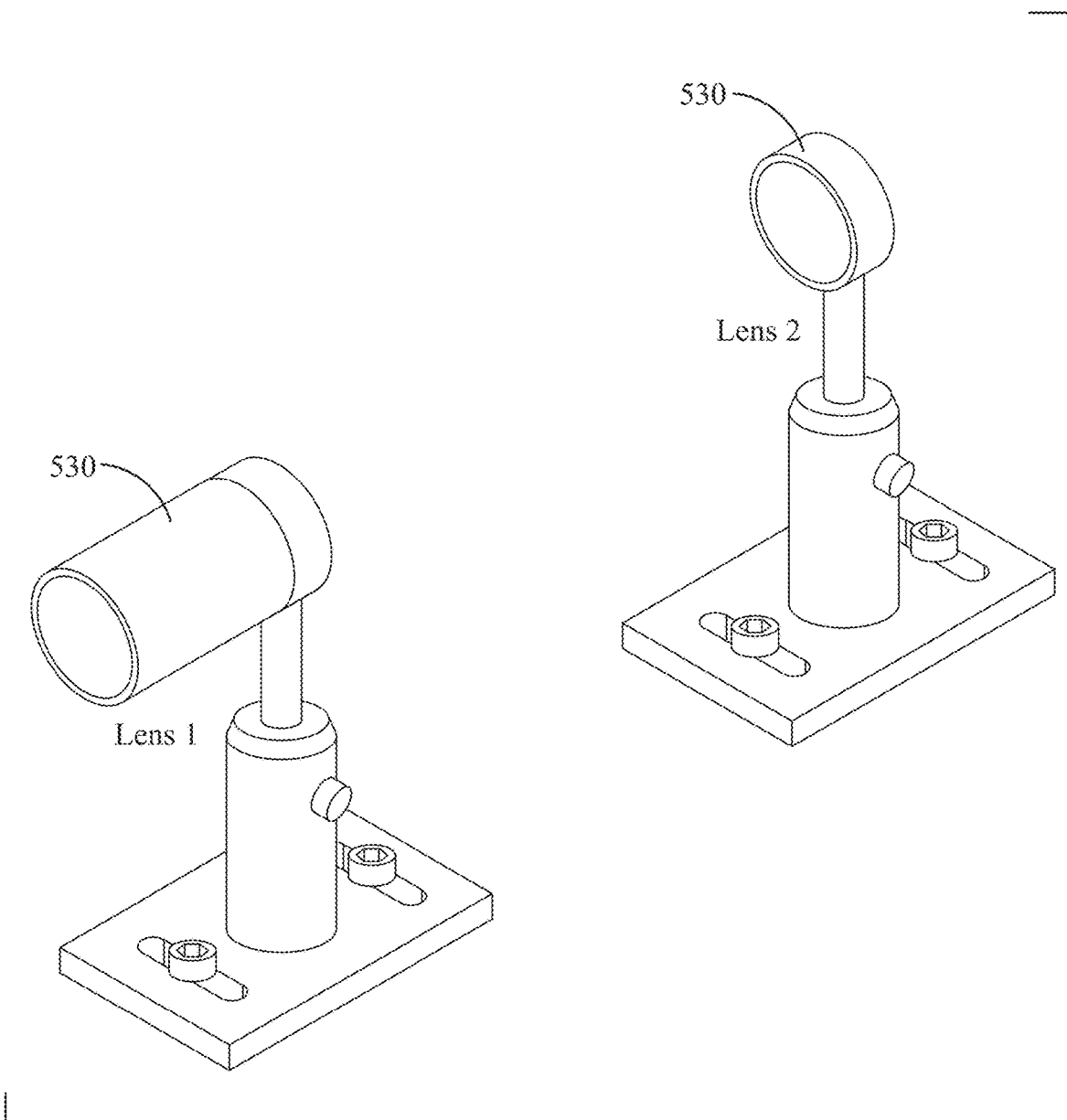
FIG. 6 illustrates two lenses of a beam expander.

The technical specifications of the 532 nm diode-pumped solid state laser, the titanium-sapphire laser oscillator, and the titanium-sapphire regenerative amplifier are shown in Table 1, Table 2, and Table 3, respectively. The central wavelength of the amplified laser pulse is ~780 nm with a temporal length of 160 femtoseconds. The average power ($P_{avg}$) of the amplified laser pulses at 250 KHz was measured to be ~1.3 W, which gives the maximum pulse energy ($E_p$) to be ~5.2 μJ ($E_p = P_{avg}/250 \times 10^3$). FIG. 5 and FIG. 6 illustrate the path 510 of femtosecond laser pulses generated by the amplified femtosecond laser set-up 400 travelling through a neutral density filter 520 and a beam expander consisting of two lenses 530 and 540, and delivered to the machining workstation via a periscope assembly for the machining. The periscope assembly 550 consists of two mirrors at 45°, which elevate and guide the laser beam to enter the machining workstation at the right orientation. The laser pulse energy required for machining is regulated by adjusting the neutral density filter 520, whereas the distance between the two lenses 530 and 540 in the beam expander is adjusted to collimate the beam. The electro-optic switch within the Titanium-Sapphire regenerative amplifier 430, also called Pockels cell, is externally triggered during machining to enable the emission of single laser pulses for the experiments.

TABLE 1

Technical specifications of the continuous wave pump laser (Verdi-V18, Coherent, Inc.).

| | |
|---|---|
| Output Power | >18 W |
| Wavelength | 532 nm |
| Line width | <5 MHz |
| Beam Diameter | 2.25 mm + 10% |
| Beam Divergence | <0.5 mrad |
| $M^2$ | <1.1 |
| Pointing Stability | <2 µrad/° C. |
| Power Stability | ±1% |
| Noise | <0.03% rms |
| Polarization | vertical, >100:1 |

TABLE 2

General specifications of the laser oscillator (Tsunami Model 3941, Spectra Physics).

| | |
|---|---|
| Repetition Rate (nominal) | 80 MHz |
| Noise | <0.2 |
| Stability | <5% |
| Spatial Mode | TEM00 |
| Beam Diameter ($1/e^2$) | <2 mm |
| Beam Divergence, full angle | <1 mrad |
| Polarization | >500:1 vertical |

TABLE 3

System specifications of the regenerative amplifier (RegA 9000, Coherent, Inc.).

| | |
|---|---|
| Repetition Rate (nominal) | 250 kHz |
| Pulse Width (FWHM) | 160 fs |
| Polarization | linear, horizontal, 500:1 |
| Energy Stability (% rms) | <1 |
| Average Power Drift (% rms) | <1 |

Figure 7:
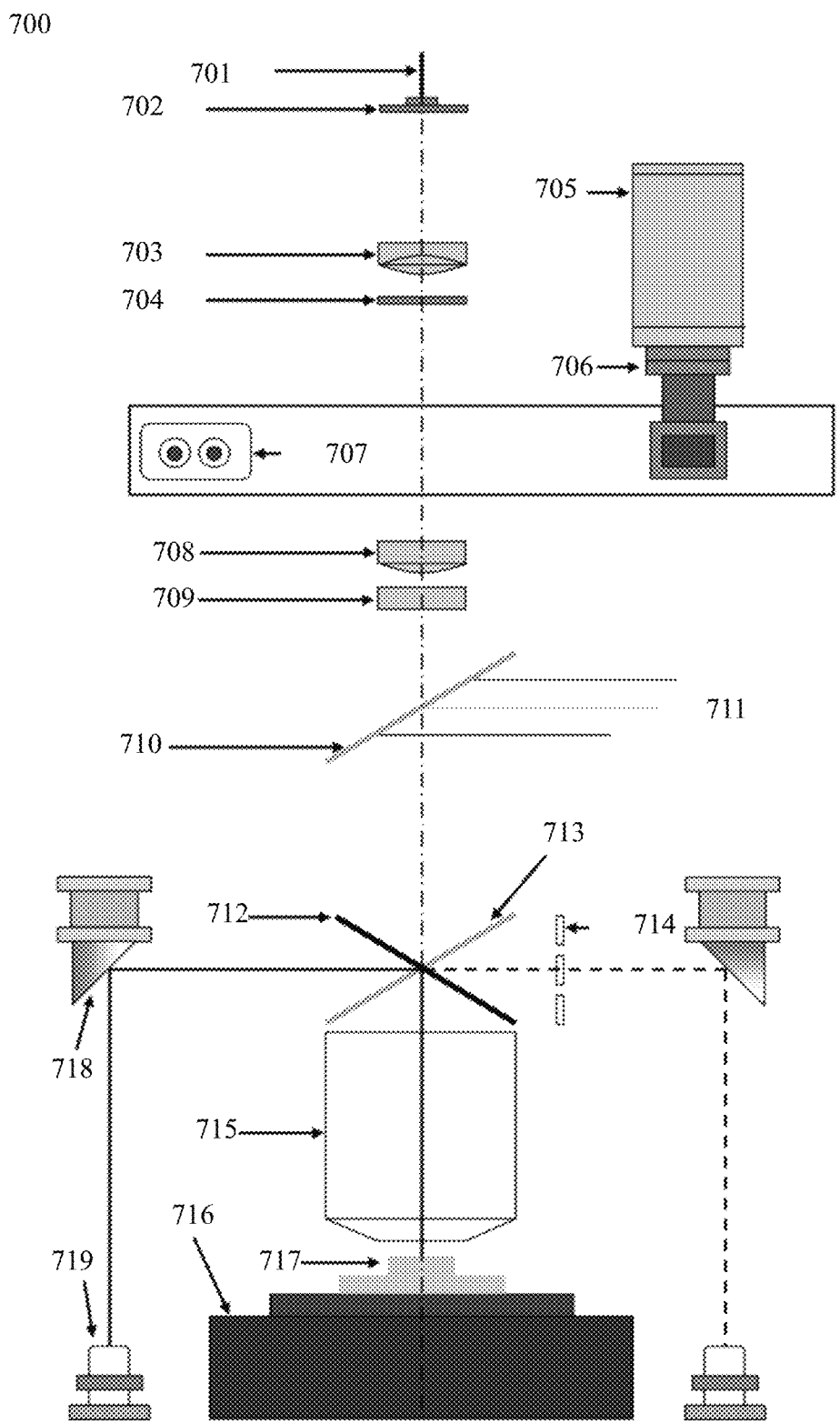
FIG. 7 illustrates the optical assembly of a workstation used for laser machining of fused silica.

The laser pulses delivered by the amplified femtosecond laser to the machining workstation via the periscope assembly are reflected by an 800 nm dichroic filter mirror into the microscope objective lens. The microscope objective lens focuses the laser pulses onto the surface of a fused silica substrate mounted on a stage assembly for machining. The stage assembly consists of two independent stages capable of moving the substrate in XYZ directions with nanoscale precision controlled with a LabVIEW™ program and Aerotech basic software. The stage assembly consists of two stages mounted on top of each other: 1) ANT95-3-V for vertical translation (z-stage), and 2) ANT95-50-XY nMT for lateral translation (xy-stage). Both the stages are by Aerotech, Inc. and have a resolution of 1 nm. A schematic of the machining workstation is shown in FIG. 7. Large vertical motions (Z direction) are controlled manually and by an additional stepper motor. multimode fiber 701, fiber optic endplate 702, focusing lens 703, long wave pass Raman edge filter 704, 12 bit digital camera 705, 9 mm computer TV lens 706, eye piece 707, tube lens 708 and 709, half-mirror 710, white light illumination produced from a reflected light vertical illuminator 711, 800 nm dichroic filter mirror 712, 532 nm dichroic filter mirror 713, 532 nm narrow bandpass filter 714, infinity corrected microscope objective 715, xy-stage 716, z-stage 717, periscope assembly for redirecting and elevating the laser beam 718 and 719.

500 µm thick, double side polished, UV grade fused silica wafers (Mark Optics, Inc.) were used to prepare templates by femtosecond laser machining Technical specifications of the fused silica wafers used are shown in Table 4. Unless otherwise specified, fused silica substrates of size 1 cm×1 cm were diced from large wafers (100 mm diameter) to be used for machining. All substrates were cleaned in acetone and isopropyl alcohol in order to remove any organic matter and dust from the surface prior to machining

TABLE 4

Technical specifications of the UV grade fused silica used for experiments.

| | |
|---|---|
| Outside Diameter (O.D.) | 100.00 mm ± 0.20 mm |
| Thickness | 500 µm ± 25 µm |
| Polished Surface | Both sides polished |
| Surface Quality (S.Q.) | 60/40 |
| Surface Roughness | 20 Å |
| Total Thickness Variation (T.T.V.) | <25 µm |

Prior to laser machining, a stylus-based profilometer scans the surface of the substrate to obtain a level surface and to map its topography. It is done in two steps in series. The first step involves the leveling of the substrate so that it is nearly normal to the laser beam during laser machining Leveling is a process of reducing the substrate inclination as a function of stylus extension and compression. It is done by manually adjusting the tilt of the substrate in x and y directions while the stylus scans the substrate surface. The tilt adjustment is continued until a reasonable leveling or flatness is obtained.

Figure 8:
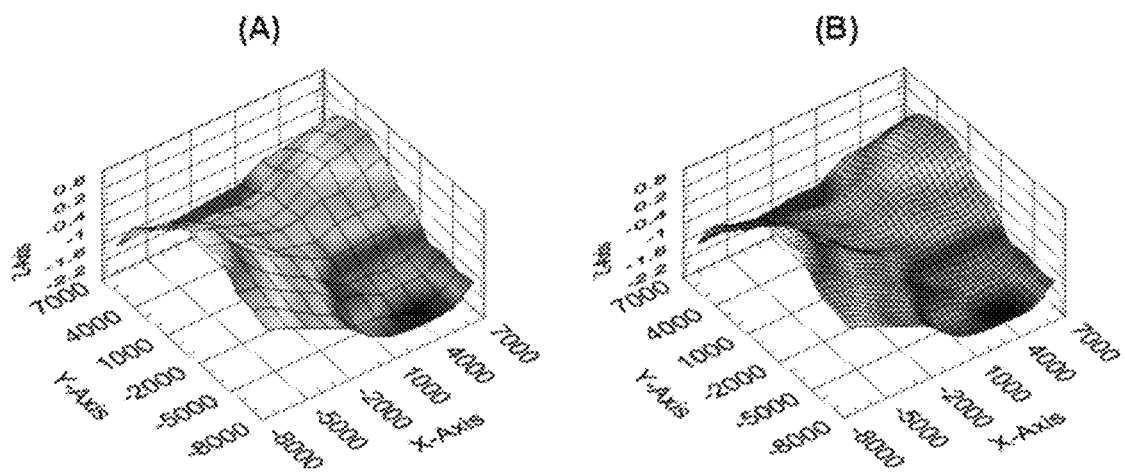
FIG. 8 illustrates surface topography of a substrate: fine scan (A) and interpolation of the fine scan (B).

The second step involves fine scanning of the substrate surface to obtain detailed topographical information. The topography arises due to the presence of hills and valleys (waviness of ~2 µm) native to the substrate surface, which alters its relative position with respect to the optical focal point, and eventually affects the machined nanohole size. Thus, it is important that all the points in the patterning area of interest maintain the same relative position in order to produce identical nanoholes. The topography data obtained by fine scanning are then fed to the nanostage during laser machining, which helps maintain the desired relative position for the entire processing area by adjusting the stage movement. A fine scan of the surface topography is shown in FIG. 8.

Early work in femtosecond laser machining was done with a 60× microscope objective lens with a numerical aperture of NA=0.85 and an adjustable correction collar. The collar was set to compensate for focusing through a 0.17 mm glass coverslip, but the laser was actually focused on the top side of the substrate, so that the focus exhibited a significant amount of spherical aberration. In the present technology, three different microscope objective lenses were used for machining in air: (1) 60× (NA=0.85; Nikon CF Plan Achromat 79173), (2) 160× (NA=1.25 in water; Leitz Wetzlar Model: ∞/0 PL APO), and (3) aspheric singlet lens (NA=0.68; Thorlabs C330TME-B). Note that the 60× objective lens was used to focus and machine at the top surface, but the laser beam entering the objective was collimated, whereas the 160× objective lens was used dry with an input laser beam that was collimated. The 60× and 160× microscope objective lenses were used to make fused silica templates for polymer imprinting purposes, whereas the aspheric lens was used to study the role of spherical aberration on nanohole formation.

Patterns are made on the substrate by moving the xy-stage pre-programmed in a LabVIEW™ program. Machining was done by varying two parameters: a) the relative position of the optical focal point with respect to the substrate surface (Z); and, b) the pulse energy ($E_p$) of the laser beam. Optical (visible eye) focus is defined as the focus through the eyepiece on the surface of the fused silica substrate in air with visible light, and it is different from the focus of the 780 nm wavelength laser. The distance Z is adjusted by moving the z-stage up or down. The pulse energy ($E_p$) is determined by the formula $E_p = P/250 \times 10^3$, where P is the laser power at 250 kHz measured using a power meter, and is varied by adjusting the variable neutral density filter placed in the path of the laser beam, see FIG. 5 and FIG. 6.

Various different types of polymers are used to imprint polymer structures from single-pulse femtosecond laser machined fused silica templates by solution-based replication of the present technology called solution casting. The only exception is cellulose acetate (CA) structures, which are usually made by CA films.

Figure 9:
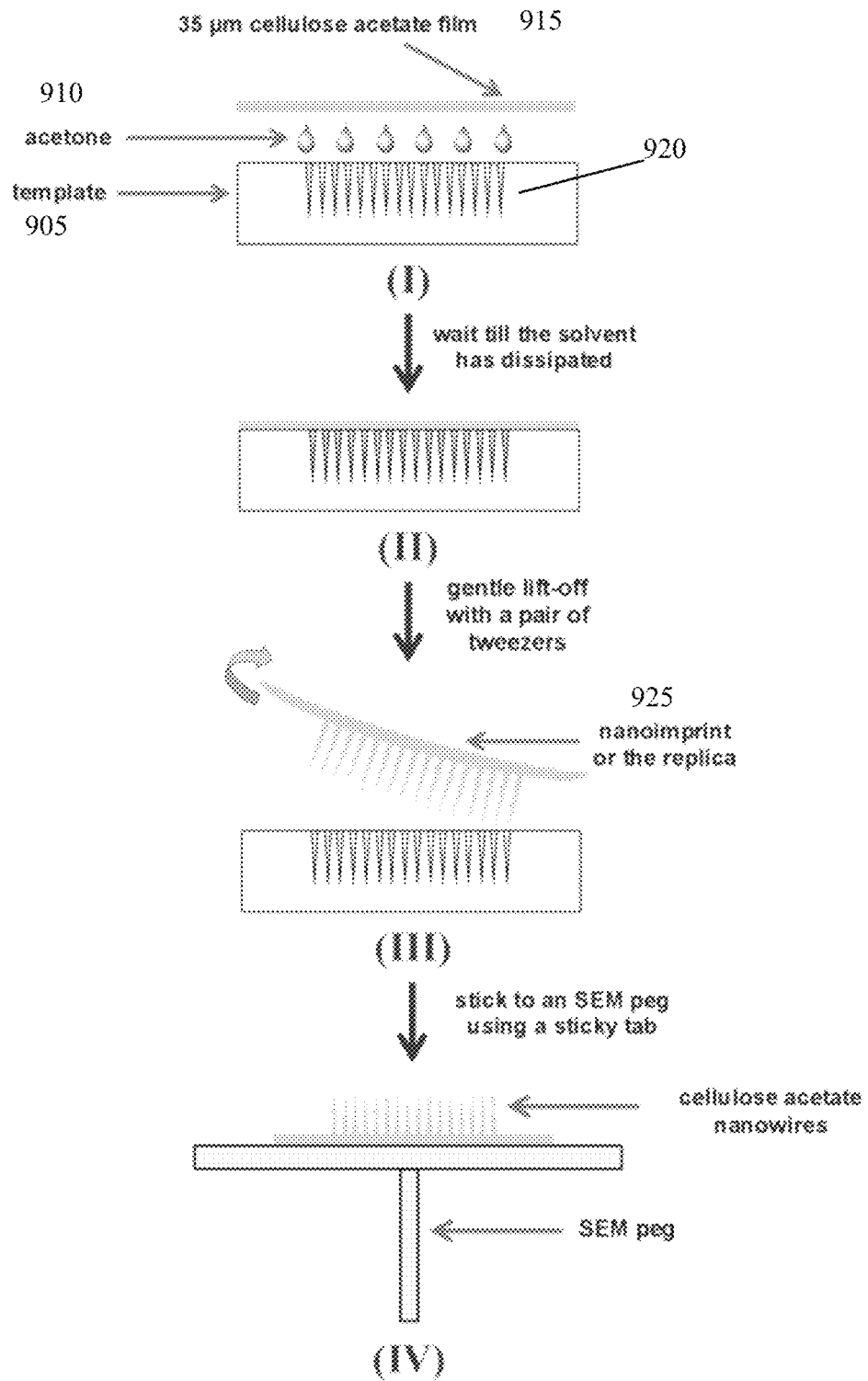
FIG. 9 illustrates preparation of cellulose acetate nanowires by nanoimprinting from a single-pulse femtosecond laser nanomachined fused silica template using a 35 μm cellulose acetate film.

A schematic 900 of the CA film imprinting is shown in FIG. 9. CA film replication involves wetting the surface of the template 905 with solvent (acetone 910) followed by placing a piece of 35 μm thick CA film 915 on the pattern 920. The solvent softens (or may even dissolve) the CA film 915, and fills the nanoholes of the pattern 920 by the action of capillary force. The softened polymer within the nanoholes of the pattern 920 molds against the sidewall of the nanoholes resulting in the formation of a replica 925 of the pattern. Once the solvent dissipates, the imprinted polymer film is gently peeled off from the template 905 surface to get the replica, which consists of polymer structures.

Figure 10:
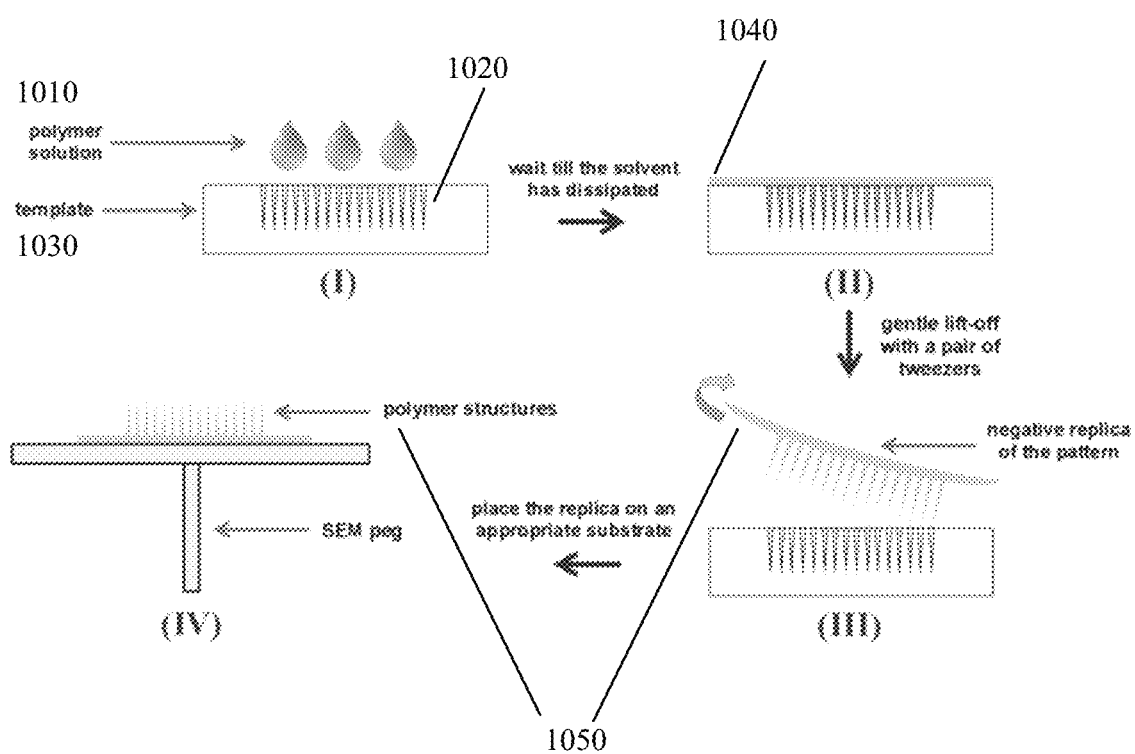
FIG. 10 illustrates preparation of polymer solution nanowires by nanoimprinting from a single-pulse femtosecond laser nanomachined fused silica template by solution casting.

FIG. 10 shows a schematic of the solution casting process 1000. For solution casting, a polymer solution 1010 prepared by mixing the polymer in a suitable solvent (e.g. polycaprolactone in chloroform) is used. The pattern 1020 on the template 1030 is covered with a few drops of the polymer solution and then allowed to dry in normal atmospheric conditions or placed in a vacuum desiccator until the solvent has dissipated and a film 1040 has formed on the surface. The resulting film 1040 is the imprint or the replica 1050 of the pattern 1020, which is carefully peeled off from the template 1030 similar to CA film imprinting. Sometimes, surface treatment of the templates 1030 becomes necessary for the removal (also called lift off) of the polymer imprint 1050. Some of the polymer solutions used to make polymer structures by imprinting are shown in Table 5.

TABLE 5

Polymers used to make polymer structures by solution casting, their respective solvents, concentrations, and sources.

| Polymer | Solvent | Wt. % | Origin |
| --- | --- | --- | --- |
| Cellulose acetate (CA) | Acetone | 2-10 | Sigma Aldrich |
| Polycaprolactone (PCL) | Chloroform | 2 | Sigma Aldrich |
| PCL-Polyethylene Glycol (PEG) | Chloroform | 2 | BME, Vanderbilt |
| Polyethylene (PE) | Toluene | 10 | SPI Supplies |
| Polydimethylsiloxane (PDMS) | Heptane | 25 | Dow Corning |
| Polymethylmethacrylate (PMMA) | Toluene | 5-10 | Sigma Aldrich |
| Polyvinyl alcohol (PVA) | De-ionized water | 5 | Alfa Aesar |
| Collodion | Amyl acetate | 2 | EMS, PA |

Polymer structures from the polymers mentioned in Table 5 except polyethylene (PE) can be made by the solution casting process shown in FIG. 10. Polyethylene solution after solvent evaporation does not form a film, but a loosely connected network of polyethylene powder, which is white in color. The template with the white powder network is then heated to about 155° C. and thermally soaked at this temperature for 2 minutes to melt and coalesce to form a transparent and continuous polyethylene film. The white powder network starts melting around 110° C. and becomes almost clear at a slightly higher temperature. The template is then cooled slowly after 2 minutes of thermal soaking at 155° C. by turning the hot plate off, which takes around 2 hours cooling time to room temperature before the film is peeled off from the template.

A monolayer of antistick coating based on fluorocarbons is prepared on the surface of the template prior to imprinting for those polymers that have a tendency to adhere to the template and affect lift-off of the imprint e.g., PMMA, PDMS, and PVA. In the present technology, antistick coatings are prepared from 1H, 1H, 2H, 2H-perfluorodecyltrichlorosilane. The template with the hole-side facing upwards is placed in a desiccator right next to a coverslip glass, and then a drop of fluorosilane is placed on top of the coverslip glass. As the vacuum is pulled in the desiccator, the fluorosilane starts to evaporate and coats the template with a layer of fluorosilane. A coating similar to Teflon in chemical structure, $(-CF_2-CF_2-)_n$, is formed.

The dimensions of the imprinted structures depend on the dimensions of the nanoholes (lateral and vertical) whereas the dimensions of the nanoholes depend on the machining parameters used during template fabrication. The depth and the cross-section of the nanohole can be reasonably decreased by reducing the pulse energy. However, in order to increase the dimensions of the nanoholes, the glass template needs to be chemically etched. Hydrofluoric acid (HF) is known to etch fused silica isotropically and concentrated aqueous solution of potassium hydroxide (KOH) is known to preferentially attack femtosecond laser affected region in fused silica. A combination of isotropic etching in HF and anisotropic etching in KOH can thus be used to enlarge the nanoholes. In the present case, the nanoholes were enlarged by sequential etching, first in HF (Lodyne™, BOE, 6:1) and then in 10M KOH at 80° C. The etching duration depends on the desired dimensions of the etched holes. Etched holes with up to 2.5 μm diameter can be easily produced. Both as-machined and chemically etched templates are used to imprint polymer structures in the present study. To distinguish between the two, polymer structures imprinted from as-machined templates are termed nanostructures (e.g., nanowires and nanocones), whereas those imprinted from etched templates are termed microstructures (e.g., micropillars). The term nanoimprinting used frequently in this disclosure refers to imprinting of nanostructures.

Imprinted polymer structures such as nanowires can be functionalized by coating with different materials, mainly noble metals like gold, palladium, and platinum, and dielectric materials like silica, titania, and alumina.

Gold, platinum, and palladium can be deposited by sputtering at cryogenic temperatures (normally when the probe temperature near the sample reaches <−165° C.) in a conventional sputtering machine modified with a cryo-stage connected to a liquid nitrogen container. The thickness of the metal coating is a function of sputtering time and current applied for the given metal. Usually, 15-20 mA current is applied for these metals.

Figure 11:
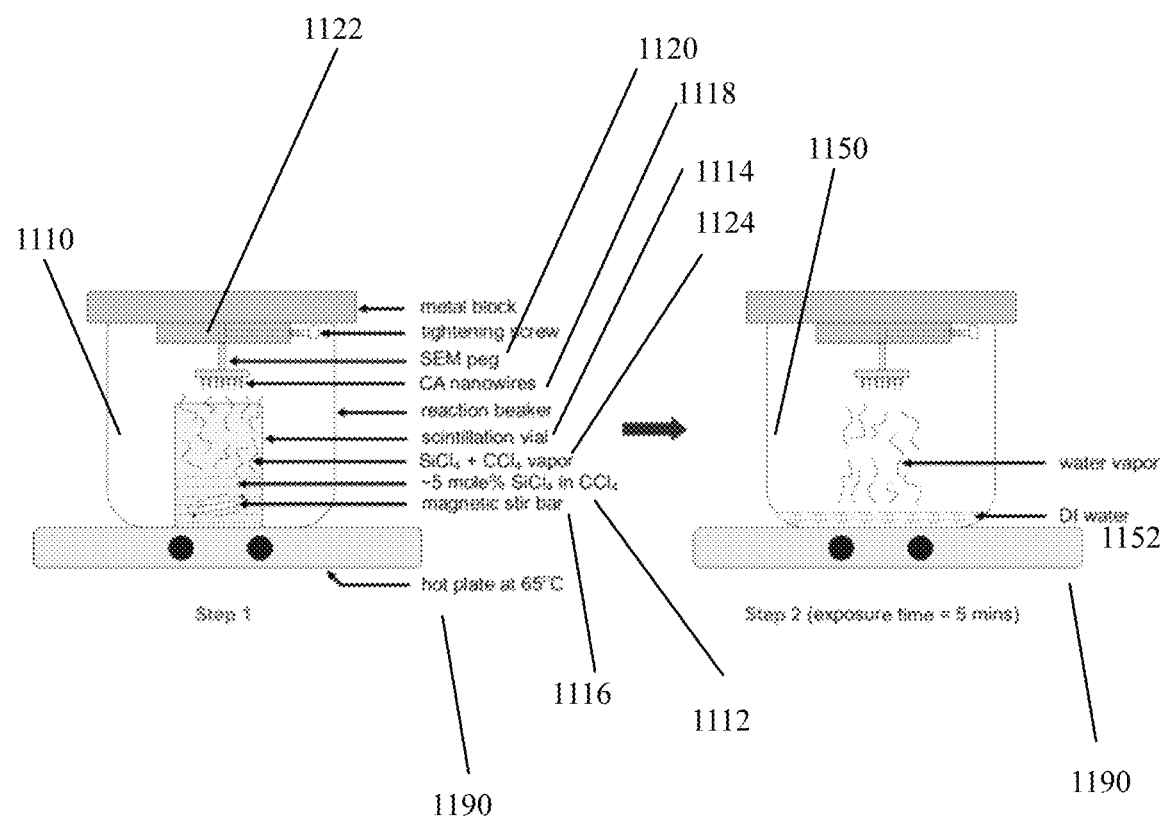
FIG. 11 illustrates a silica deposition process for functionalization of nanowires.

Silica can be deposited on CA nanowires in a low temperature chemical vapor deposition process at 65° C. FIG. 11 shows a pictorial description of the silica deposition process 1100 that takes place in two separate glass beakers 1110 and 1150. First, a silicon tetrachloride solution (~5 mole %) 1112 is prepared by mixing 0.6 ml $SiCl_4$ and 9.4 ml $CCl_4$ in a 25 ml scintillation vial 1114 with a magnetic stir bar 1116. The scintillation vial is immediately capped after putting $SiCl_4$, $CCl_4$, and the magnetic stir bar 1116 to avoid any escape of $SiCl_4$ by vaporization. Two glass beakers, one 1100 with the scintillation vial (1114) and the other vial 1150 with a small quantity of de-ionized water (1152), are then placed on a digital stirring hot plate 1190 (VWR International, LLC) maintained at 65° C. The beakers 1110 and 1150 are maintained at that temperature for a minimum of 30 minutes before the start of the experiments, which ensures the formation of water vapor in beaker 1150. A fresh silicon tetrachloride solution is prepared for each deposition experiment.

A CA nanoimprint 1118 with erect nanowires prepared from CA film, as described elsewhere herein, is first affixed to an SEM peg 1120 using a Lift-n-Press™ sticky tab with the nanowires facing upwards, and then the SEM peg is mounted on a brass holder 1122. The cap of the scintillation vial in beaker 1110 is opened and immediately the brass holder is placed on the neck of the beaker. The beaker is positioned such that the CA nanowires 1118 on the SEM peg 1120 face downward just above the scintillation vial 1114 and are exposed to silicon tetrachloride vapor 1124 for adsorption. The exposure time in beaker 1110 ($t_i$) is recorded right after the brass holder is placed on the beaker. It is varied from 1 minute to 6 minutes to study the effect of $SiCl_4$ exposure time on silica coating thickness, whereas the exposure time in beaker 1150 with deionized water 1152 is kept constant at 5 minutes for all the experiments. It was found that 5 minutes exposure to water vapor in beaker 1150 is sufficient to hydrolyze all the silicon tetrachloride molecules adsorbed on the surface of cellulose acetate in beaker 1110; hence, longer exposure times are not required. Silica coated cellulose acetate nanowires are termed silica nanowires or silica nanoneedles herein.

Nanoholes, etched holes, imprinted polymer structures (nano and micro), and functionalized polymer structures are individually characterized.

Holes produced at the surface of fused silica (as-machined nanoholes and chemically etched microholes), imprinted polymer structures (from as-machined and chemically etched fused silica templates), and functionalized polymer structures were imaged with various field emission scanning electron microscopes, most commonly FE-SEM (JSM 6320, JEOL) and FIB-SEM (Lyra 3, TESCAN). As the length of the imprinted polymer structure corresponds to the depth of the hole, the length of the polymer structure is measured in the SEM image to determine the hole-depth. Unless otherwise stated, all imprints are imaged at 45° stage tilt of the SEM. The length of the polymer structure measured in the SEM image is that of its projection at 45°, so the true length is determined by multiplying the projected length by $\sqrt{2}$. However, it is true only for those structures that are standing without bending or falling over, and only those structures that were standing were used for calculations.

Silica coating deposited on cellulose acetate nanowires was characterized to understand the physical behavior of the deposition process and the chemical composition of the coating. SEM images of silica nanoneedles produced at different values of exposure time ($t_i$) to silicon tetrachloride (beaker 1110) were taken to determine the deposition rate of silica. The deposition rate was determined by measuring the width of the silica nanowires at a projected length of 6 µm. Thirty (30) measurements on separate nanowires were made to obtain sufficient data for statistical analysis. The coating thickness ($d_{t_i}$) was determined using the following formula where, $D_{SiO_2}^{t_i}$ is the width of the silica nanowire for the corresponding soaking time $t_i$ and $D_{CA}$ is the mean width of the uncoated cellulose acetate nanowires measured in the same manner on the control sample.

$$d_{t_i} = \frac{D_{SiO_2}^{t_i} - D_{CA}}{2}$$

The standard deviation in the coating thickness ($\sigma_d^{t_i}$) for each $t_i$ was expressed in terms of the standard deviation in the width of the silica-coated nanowire ($\sigma_{SiO_2}^{t_i}$) and the standard error in the mean width of the uncoated cellulose acetate nanowire ($\sigma_{CA}^m$) using the equation:

$$\sigma_d^{t_i} = \frac{\sqrt{(\sigma_{SiO_2}^{t_i})^2 + (\sigma_{CA}^m)^2}}{2}$$

An energy dispersive spectrometer (EDS) spectrum of the tip of a silica nanowire was taken with a Thermo EDS System 7 on a JSM-7600F thermal FE-SEM. Although EDS information is not quantitative, it does reveal the elemental composition of the coating.

An absorption spectrum of the silica coating was recorded on an attenuated total reflectance-Fourier transform infrared spectrometer (ATR-FTIR model ALPHA-P by Bruker Optics) in the frequency range 4000-375 $cm^{-1}$. The FTIR discerns the presence of different chemical bonds present in the coating. A small piece of silica coating deposited on gold-coated glass coverslip (5 minutes in beaker 1110) was scratched to obtain a sample for recording the absorption spectrum. Several samples were tested from different silica coating samples (all made at 5 minutes) to ensure reproducibility of the results.

A silica nanowire (made at $t_i$=5 minutes) was subjected to focused ion beam sectioning to see the coating cross-section using a Hitachi NB5000 NanoDUE'T FIB-SEM with a gallium current of 20 µA. The cuts were made at different positions of the nanowire starting near the tip of the nanowire to up to 9 µm projected length from the substrate base. SEM images were continually captured while the cuts were made.

Silica coated cellulose acetate nanowires, or silica nanoneedles, can be used as cell culture substrates to study cell behavior in 3D microenvironment created by silica nanoneedles. Cell culture experiments were performed using NIH 3T3 mouse embryo fibroblasts. Fibroblasts from 3T3 cell lines can be cultured on silica nanoneedles and silica flat substrate (as control for comparison), both of can be prepared by depositing silica on cellulose acetate under similar conditions.

Figure 12:
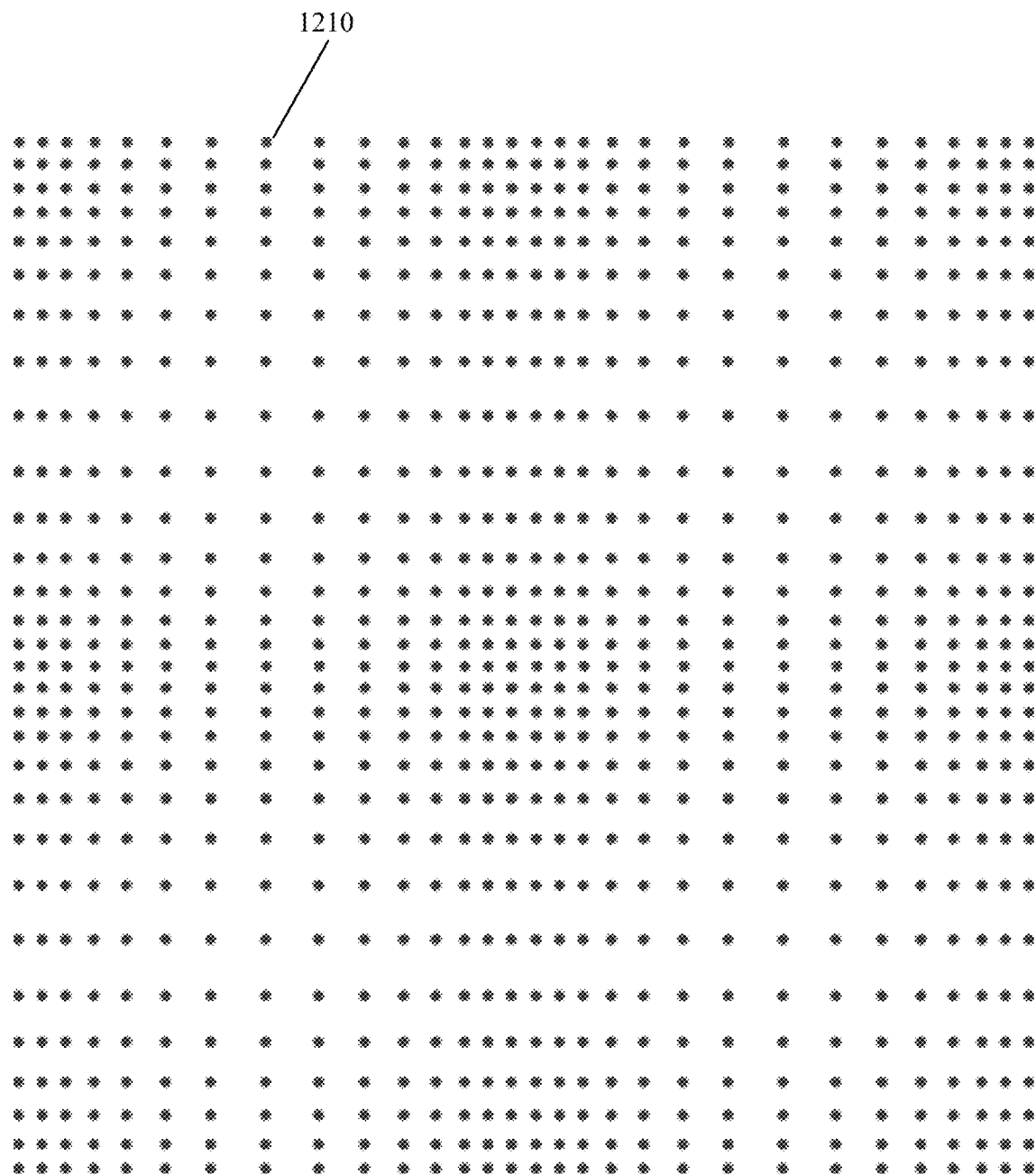
FIG. 12 illustrates a 2D gradient pattern (reduced density for visual clarity and not to scale) fabricated on a 500 µm thick fused silica substrate by single-pulse femtosecond laser machining.

For cell culture experiments, the pattern made on the template can be a 2D gradient in nanohole spacing consisting of four identical quadrants, where each quadrant is made up of one gradient pattern of nanoholes. The pattern can be made by focusing single laser pulses ($E_p$=~5.2 µJ) through a 160× (NA=1.25 in water) microscope objective lens in air. In each gradient pattern, the spacing between the successive nanoholes can be increased by 1 µm in both x and y directions starting from 10 µm at the densest location (edge) up to 50 µm at the sparsest location. The spacing can be reduced by 1 µm per hole from 50 µm to 10 µm to complete the 2D gradient quadrant. FIG. 12 shows a demonstrative picture (not to scale) of the gradient pattern 1200 made on the template. Here, each black dot, e.g., 1210, represents a nanohole made by focusing a single laser pulse through a 160× microscope objective lens. The pattern 1200 is a 2×2 matrix of four quadrants. Each quadrant is formed by increasing the spacing between successive nanoholes by 1 µm starting from 10 µm in the densest location to 50 µm in the sparsest location and then decreasing from 50 µm to 10 µm at 1 µm decrements. A quadrant is a matrix of 84×84 nanoholes, and a 2×2 matrix of these quadrants forms the 2D gradient pattern with 168×168 nanoholes i.e., a total of 28,224 nanoholes in the pattern The template thus prepared can be subjected to chemical etching in buffered oxide etch (Lodyne™, BOE, 6:1) for 30 seconds followed by rinsing in DI water, and then neutralized in 10M KOH for 3 minutes followed by rinsing in DI water (all at room temperature) prior to further use. In a sample prepared in this fashion, the depth of the nanoholes was determined to be at least 14 µm by cellulose acetate replication. The average entrance diameter was 750 nm post-etching. This template with 2D gradient nanoholes is termed wide gradient template herein. Other gradient patterns are contemplated to facilitate direction growth of the cell culture.

Figure 13:
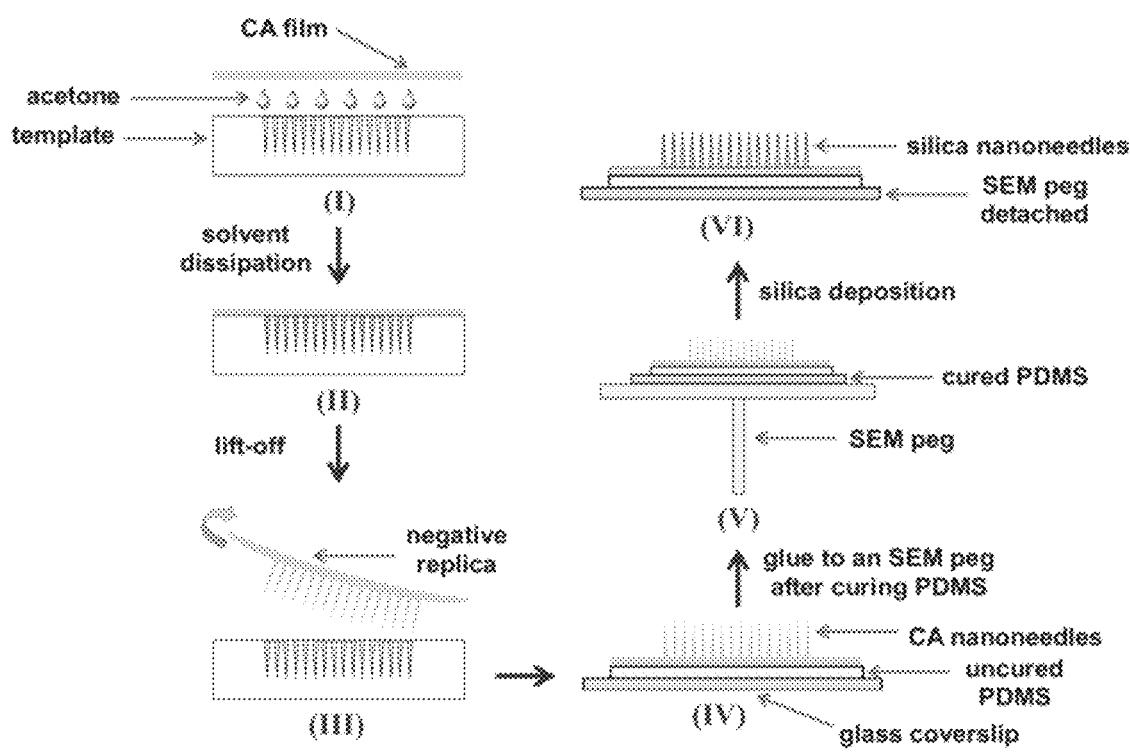
FIG. 13 is a schematic of silica nanoneedle preparation for cell studies using National Institutes of Health (NIH) 3T3 mouse embryo fibroblasts.

A CA replica imprinted from the wide gradient template and a flat CA film (both 35 µm thick) can be glued to two separate 170 µm glass coverslips using a thin layer of uncured PDMS (10:1 mass ratio, Sylgard® 184, Dow Corning Corporation) as an adhesive. Flat-CA-on-uncured-PDMS-on-glass-coverslip and CA-replica-on-uncured-PDMS-on-glass-coverslip can be left at room temperature for 24 hours for the uncured PDMS to crosslink, which makes their further handling easier during silica deposition. After PDMS curing, both the glass coverslips can be placed on aluminum SEM pegs using sticky tabs (Lift-N-Press™, Structure Probe Inc., West Chester, PA) and subjected to silica deposition as described herein and shown schematically in FIG. 13. In both the cases, the exposure time in beaker 1110 (i.e., to silicon tetrachloride solution) can be kept 5 minutes followed by 5 minutes in beaker 1150 for hydrolysis to form silica. It results in the formation of 240±40 nm thick layer of silica. Both silica nanoneedles and flat silica substrates can be used as cell culture substrates to study NIH 3T3 fibroblasts.

Cell culture experiments were performed using the structure described above. NIH 3T3 mouse embryo fibroblasts were maintained in Dulbecco's Modified Eagle's Medium (DMEM, Gibco Cell Culture, Invitrogen, Carlsbad, CA, USA) supplemented with 10% heat-inactivated fetal bovine serum (FBS, Gibco) with 1% penicillin-streptomycin (P/S, Gibco) on tissue culture polystyrene in a water jacketed incubator at 37° C. and 5% $CO_2$. For experiments, cells were seeded at a density of 80,000 cells/$cm^2$ and cultured either overnight or for three days for attachment/viability or immunocytochemistry experiments, respectively, on both silica nanoneedles and flat silica control substrate. For attachment and viability experiments, cells were treated with 4 µM Calcein AM (Molecular Probes, Invitrogen) in phosphate buffered saline (PBS, Gibco) for 15 minutes at 37° C. For immunocytochemistry, cells were fixed with 4% paraformaldehyde for 15 minutes, permeabilized with 0.25% Triton X in PBS for 10 minutes, and blocked with 10% goat serum in PBS. Unless otherwise stated, all steps were performed at room temperature. Cells were then incubated with phalloidin (Molecular Probes) for 20 minutes or 1:100 rabbit anti-mouse a smooth muscle actin primary antibody (αSMA, Abcam, Cambridge, MA) overnight at 4° C., followed by treatment of 1:50 FITC-conjugated goat anti-rabbit secondary antibody (Abcam) for 2 hours. Cells were imaged using a Nikon Eclipse Ti inverted fluorescence microscope (Nikon Instruments, Inc., Melville, NY). Images were analyzed with Image J (National Institutes of Health, Bethesda, MD) and n≥50 cells from n≥5 images were used for quantification. Individual cells, not those in aggregates, were quantified for shape descriptors (i.e., average cell area and average cell perimeter).

Cell morphology was further investigated by SEM analysis after cell fixation. For SEM analysis, cells were fixed on silica nanoneedles and flat silica control with 2.5% glutaraldehyde in PBS for 2 hours at room temperature followed by rinsing in PBS (×2) and then ultrapure water (×3). Fixed cells were treated with 1% osmium tetroxide in PBS for 1 hour at room temperature followed by rinsing in ultrapure water (×3). Fixed cells were then subjected to dehydration, first in graded ethanol in water (30%, 50%, 70%, 95%, and 3×100%) and then in graded ethanol in HMDS (30%, 50%, 70%, 95%, and 3×100%) followed by supercritical drying (Polaron E3000) before SEM analysis. In the present work, unless otherwise specified, all fused silica templates were patterned at the maximum pulse energy of 5.2 µJ using the laser system explained earlier herein.

The size of the nanoholes patterned by femtosecond laser machining is affected by the position of the focal spot within the substrate as it alters the location of the optical breakdown. In developing the present technology, the effect of the relative position of the optical focus with respect to the surface of fused silica substrate on the nanohole size was investigated.

Figure 14:
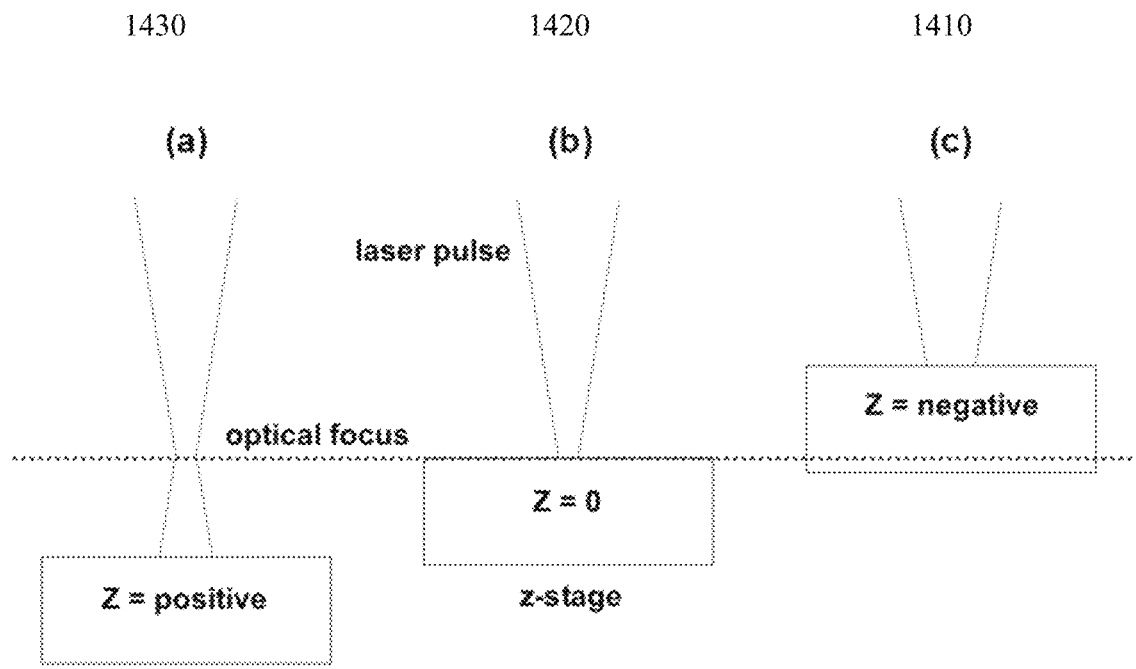
FIG. 14 is a schematic of the z-stage movement during femtosecond laser machining of fused silica.

The patterning experiment was performed in air using a 160× microscope objective lens (NA=1.25) at the maximum pulse energy of 5.2 µJ after leveling the substrate as described elsewhere herein. The sharpest image of the substrate seen through the microscope objective lens with the visible light was marked as the optical focus, and its position was recorded as Z=0, where Z is the position of the vertical axis. It must be noticed that the focus of the 780 nm wavelength is different from the visible light focus, and is comparatively more difficult to determine. In addition, the position of the optical focus recorded as Z=0 may vary from user to user as it is determined with the naked eye. The relative position of the optical focus was varied by adjusting the vertical movement of the substrate mounted on a nanostage (z-stage) with respect to the optical focus at Z=0. Nanoholes were patterned on a 500 µm thick fused silica substrate covering a range of vertical motions above and below the optical focus. Referring to FIG. 14, the z-stage was moved at an increment of 1 µm from Z=−6 µm 1410, to Z=+2 µm 1430, passing through the optical focus at Z=0

1420. Here, positive values of Z mean the optical focus is above the substrate surface by that amount and is obtained by moving the z-stage down.

Figure 15:
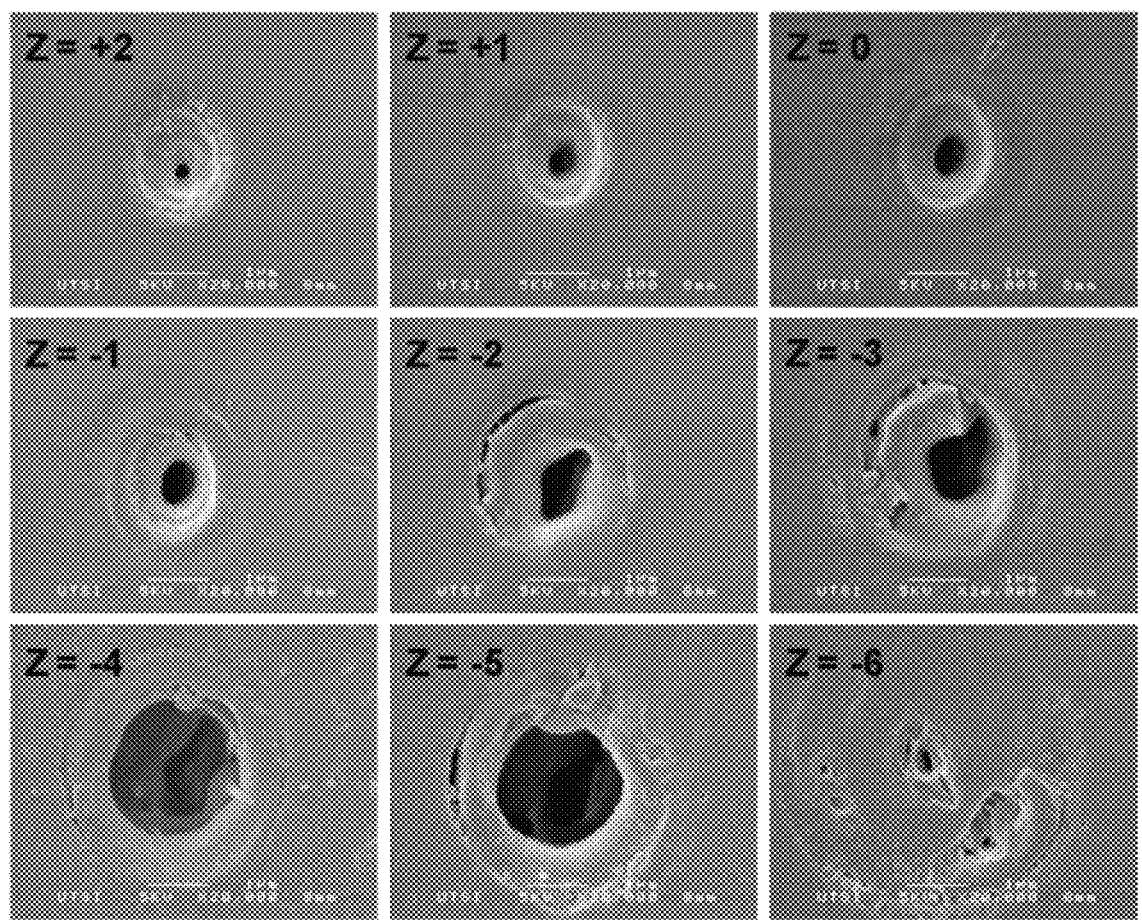
FIG. 15 is a SEM image of nanoholes made at the surface of fused silica.
Figure 16:
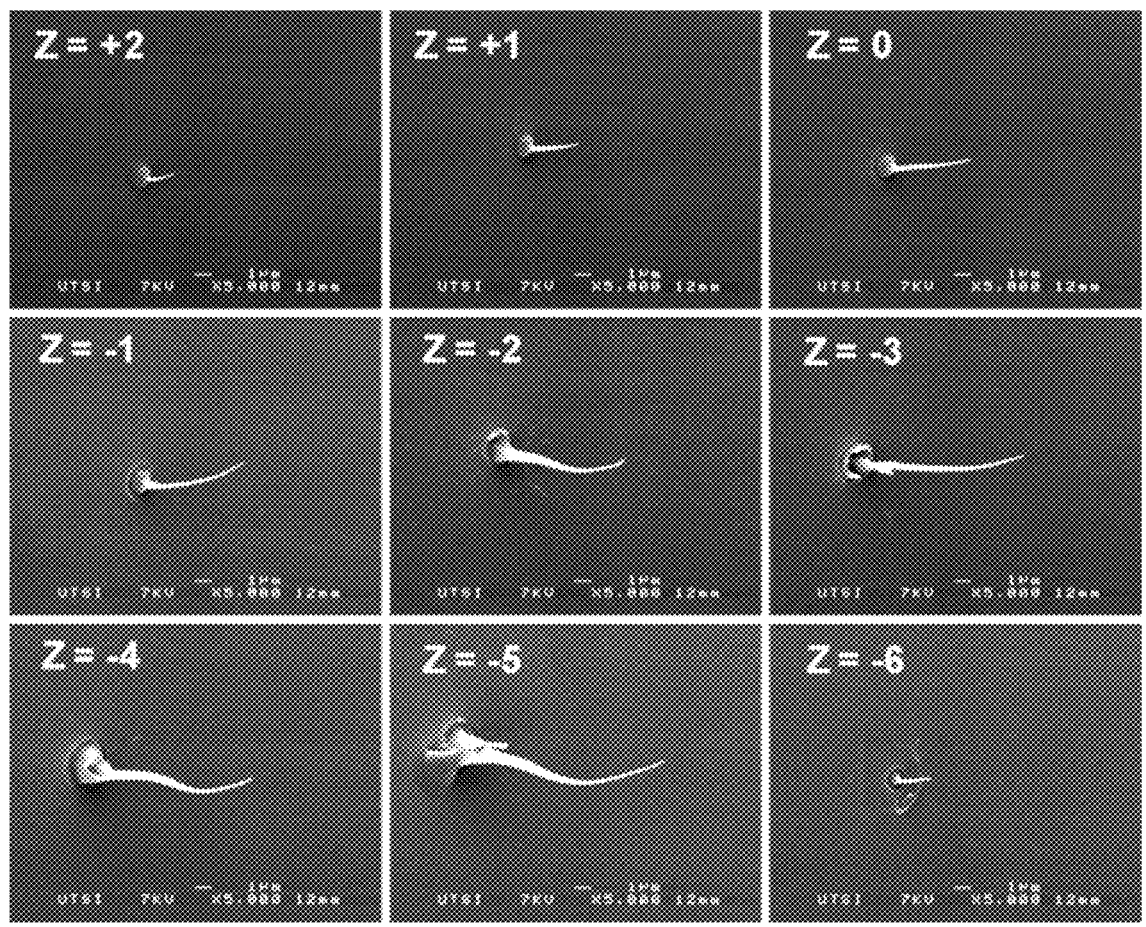
FIG. 16 is a SEM image of the cellulose acetate replica imprinted from nanoholes (taken at 45° tilt) shown in FIG. 15.

SEM images of nanoholes 1500 thus produced and their corresponding cellulose acetate replicas 1600 are shown in FIG. 15 and FIG. 16, respectively. The laser pulse (red) is focused through a microscope objective lens onto the substrate (rectangular box) mounted on the z-stage. The stage is moved up and down to change the position of the optical focus with respect to the substrate surface. Z=0 corresponds to optical focus on the substrate surface (b); Z=positive corresponds to optical focus above the substrate obtained by moving the stage down (a), and Z=negative corresponds to optical focus within the bulk of fused silica obtained by moving the stage up (c). The blue dotted line corresponds to the optical focus Z=0.

It can be seen from the SEM images that the relative position of the optical focus affects the size of the nanohole. In addition, it can be seen that the entrance of some nanoholes is not fully circular, which can be attributed to the spatial profile of the laser pulse used for machining. The spatial profile of the laser beam in the present case was elliptical with near-Gaussian intensity distribution. At Z=−6 μm, the position of the optical focus is so deep into the substrate that the nanoholes do not fully open and remain embedded in the substrate. This is possibly due to the inability of the plasma to escape from such a depth.

Figure 17:
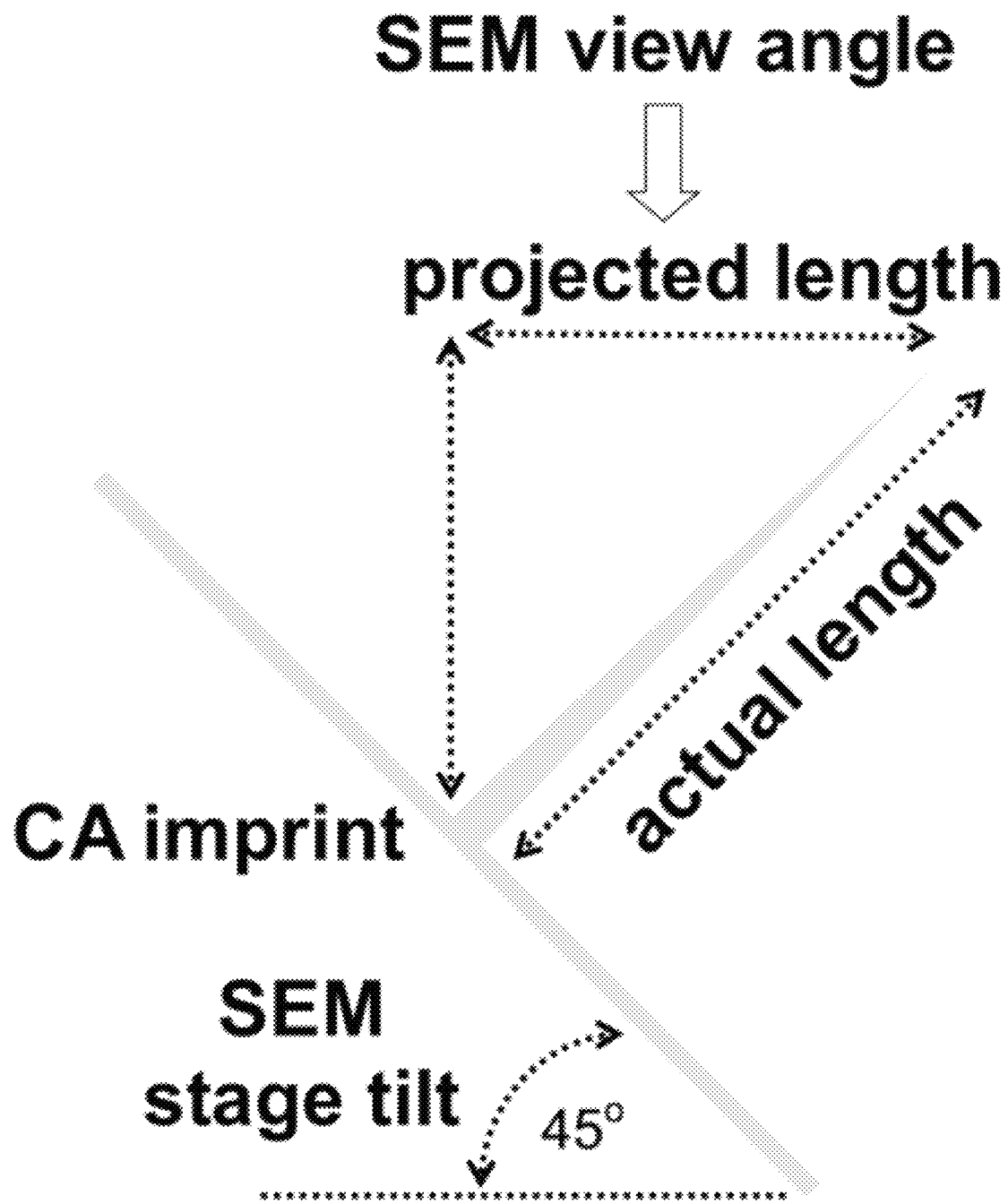
FIG. 17 is a schematic of SEM imaging of a cellulose acetate imprint of a nanohole showing its projected length and the actual length.
Figure 18:
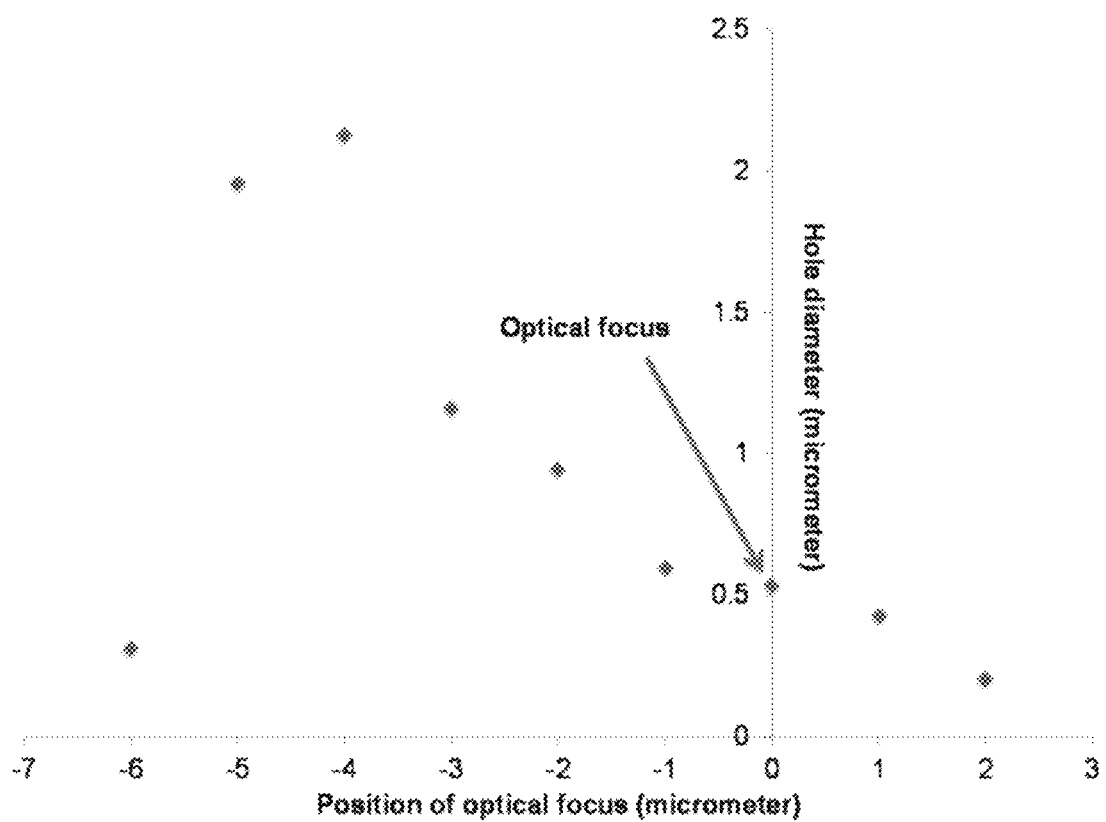
FIG. 18 illustrates the dependence of hole diameter on the position of optical focus with respect to a substrate surface.
Figure 19:
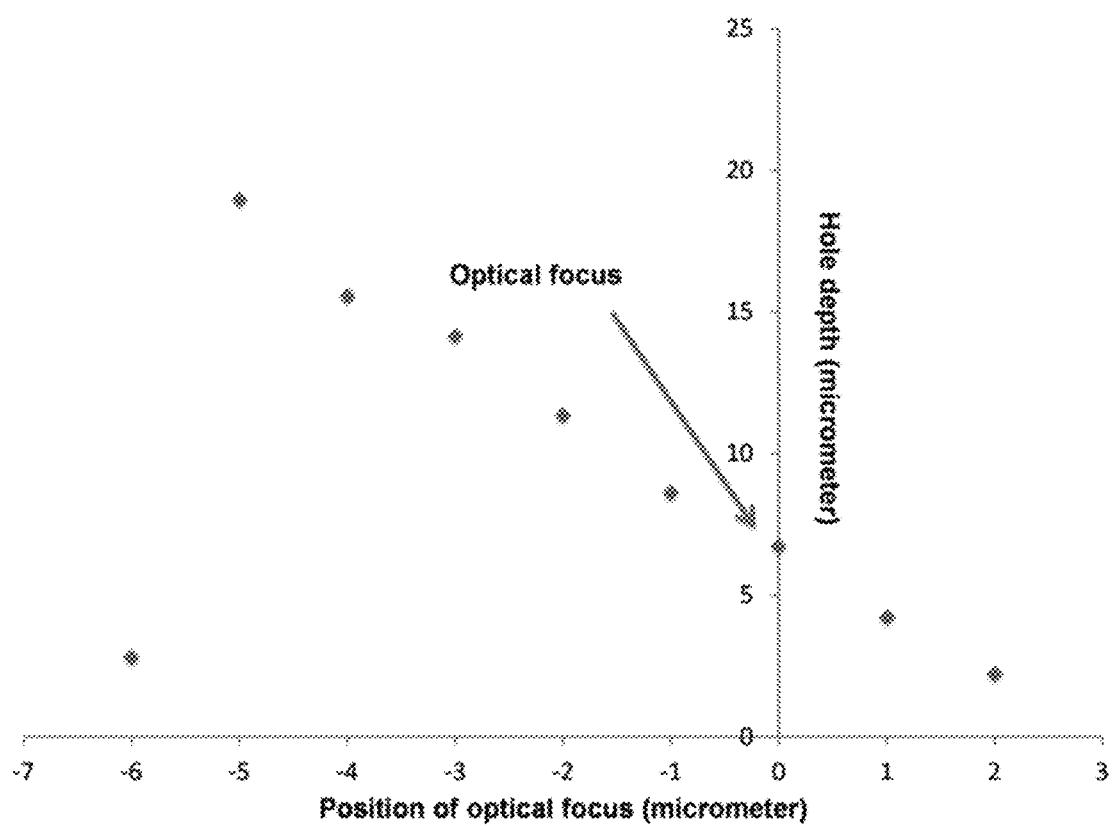
FIG. 19 illustrates the dependence of hole depth on the position of optical focus with respect to the substrate surface.

The nanohole depth was determined by measuring the length of the corresponding cellulose acetate imprint in the SEM image. Since the length of the imprint in the SEM image is that of its projection at 45°, the actual length was determined by multiplying it with $\sqrt{2}$ as shown in FIG. 17. The dependence of nanohole size (diameter and depth) on the relative position of optical focus with respect to the substrate surface is shown as graphs in FIG. 18 and FIG. 19.

Both as-machined and chemically etched fused silica templates, described elsewhere herein, can be used for solution casting to create polymer structures. Polymer structures imprinted from as-machined templates are termed nano, whereas those from etched templates are termed micro to differentiate between the two. In addition, depending on the morphology, polymer structures imprinted from as-machined templates are referred to as nanowires or nanocones, whereas those from etched templates are referred to as micropillars herein. The process of solution casting is so versatile that any polymer that forms continuous film, with or without the assistance of external energy like heat or UV light, can be used to imprint structures from these templates. Polymer solutions not only refer to polymers dissolved in solvent, but also polymers that can be obtained in liquid form e.g., resins. In the present technology, select polymers with different physicochemical properties, but of current research interest, can be subjected to solution casting to create nano- and micro-structures. The following polymers can be used, a commonly used synthetic fiber—cellulose acetate (CA); a ubiquitously used linear chain hydrophobic polymer—polyethylene (PE); two biosorbable polymers—polycaprolactone (PCL) and PCL-polyethylene glycol (PEG); a water soluble polymer—polyvinyl alcohol (PVA); a widely used multi-purpose hard plastic—polymethylmethacrylate (PMMA); a 3D cross-linking polymer—polydimethylsiloxane (PDMS); a commercially available nitrocellulose—Collodion; a commonly used structural plastic—polyvinyl chloride (PVC); and a proton conducting ionomer used in fuel cells—Nafion 117®. All these polymers structures were imprinted from the same as-machined and etched templates.

Figure 20:
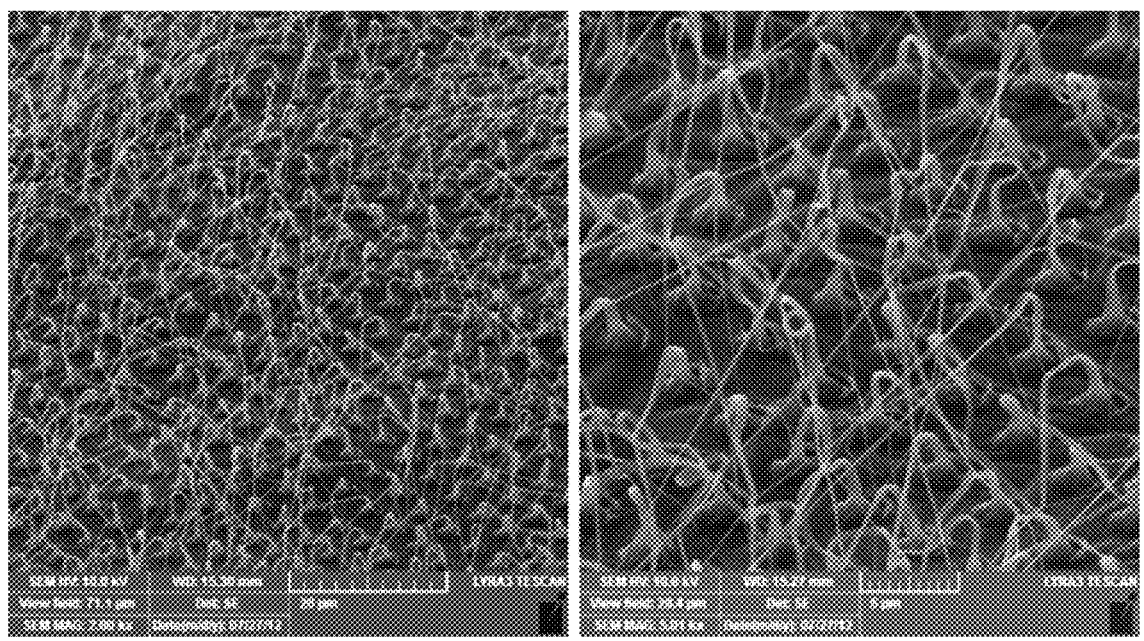
FIG. 20 is a SEM image of PCL nanowires imprinted from an as-machined fused silica template using 2 wt % PCL solution in chloroform.
Figure 21:
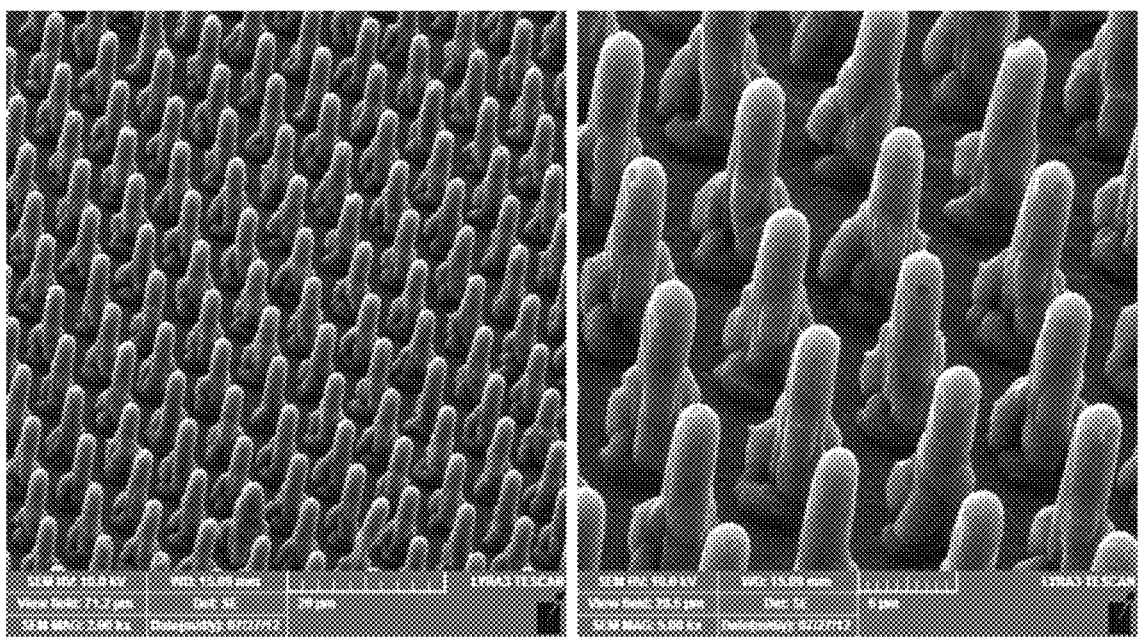
FIG. 21 is a SEM image of polycaprolactone micropillars imprinted from an etched fused silica template using 2 wt % polycaprolactone solution in chloroform.
Figure 22:
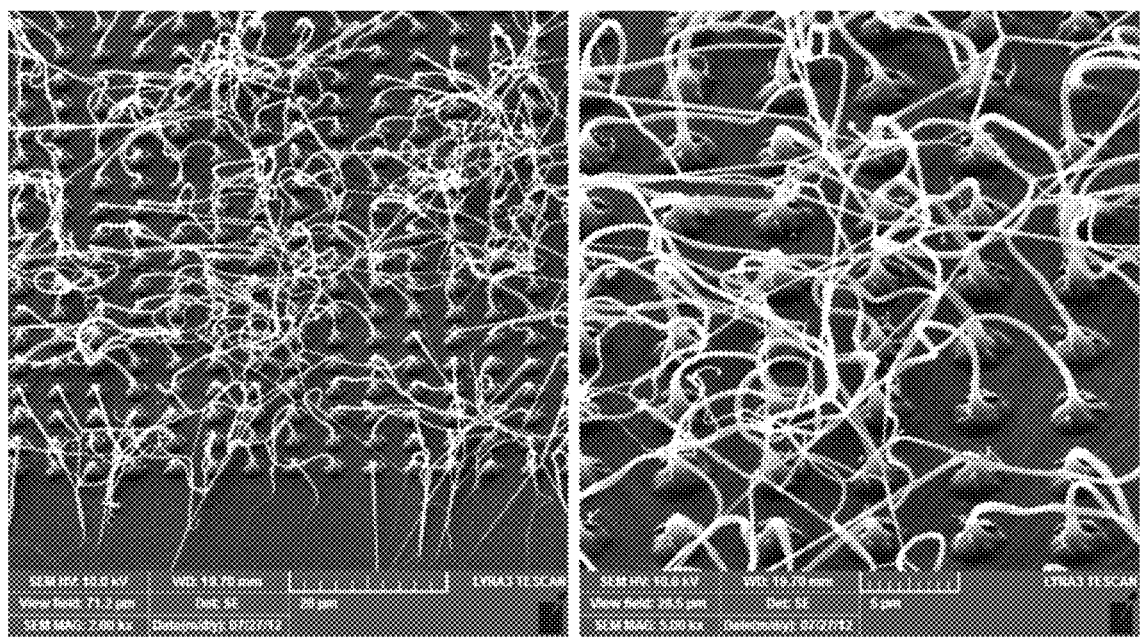
FIG. 22 is a SEM image of PCL-PEG nanowires imprinted from an as-machined fused silica template using 2 wt % polycaprolactone solution in chloroform.
Figure 23:
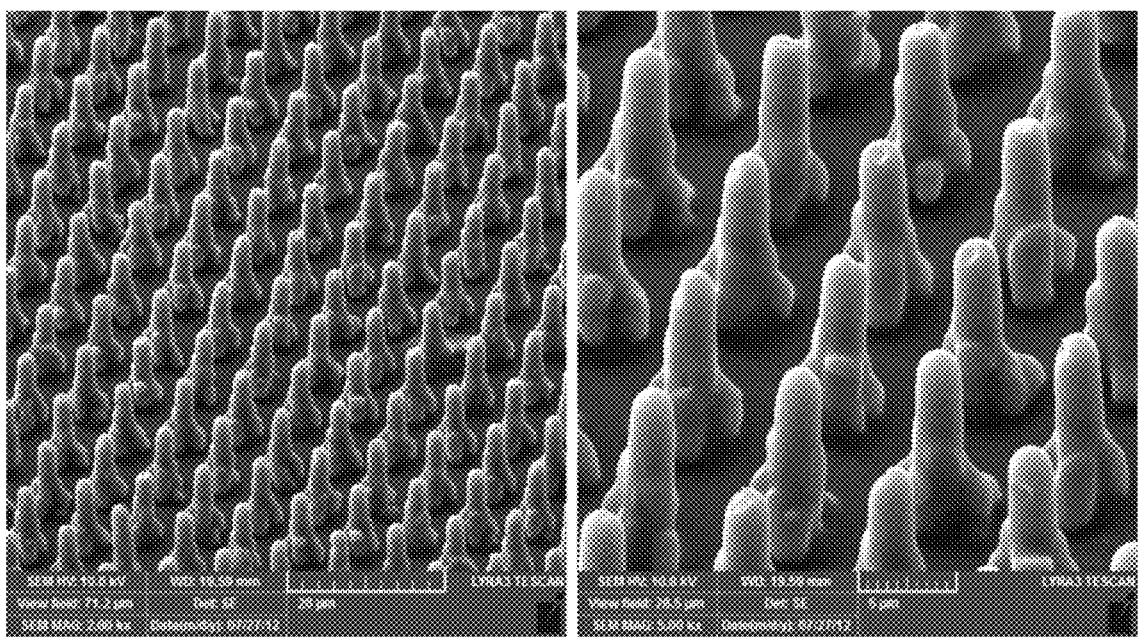
FIG. 23 is a SEM image of PCL-PEG micropillars imprinted from an etched fused silica template using 2 wt % PCL-PEG solution in chloroform.

Polycaprolactone (PCL) is a low melting point biodegradable polymer. Chemically, it is a polyester of molecular formula $(C_6H_{10}O_2)_n$ and is synthesized by ring opening polymerization of ε-caprolactone in the presence of stannous octoate. PCL finds applications in biomedical engineering such as long term implants and (targeted) drug delivery vehicles because of its slow degradation in physiological conditions by the hydrolysis of its ester linkages. PCL is hydrophobic in nature and is often copolymerized with hydrophilic polymers (e.g., polyethylene glycol and hyperbranched polyglycidol) to synthesize amphiphilic block copolymers. In the present technology, nanowires and micropillars of PCL and PCL-8 wt % PEG can be made by solution casting of their respective solutions made in chloroform. FIG. 20 and FIG. 21 show SEM images of PCL nanowires and micropillars, respectively, as prepared by the methods described herein. PCL-PEG nanowires and micropillars are shown in FIG. 22 and FIG. 23, respectively.

Figure 24:
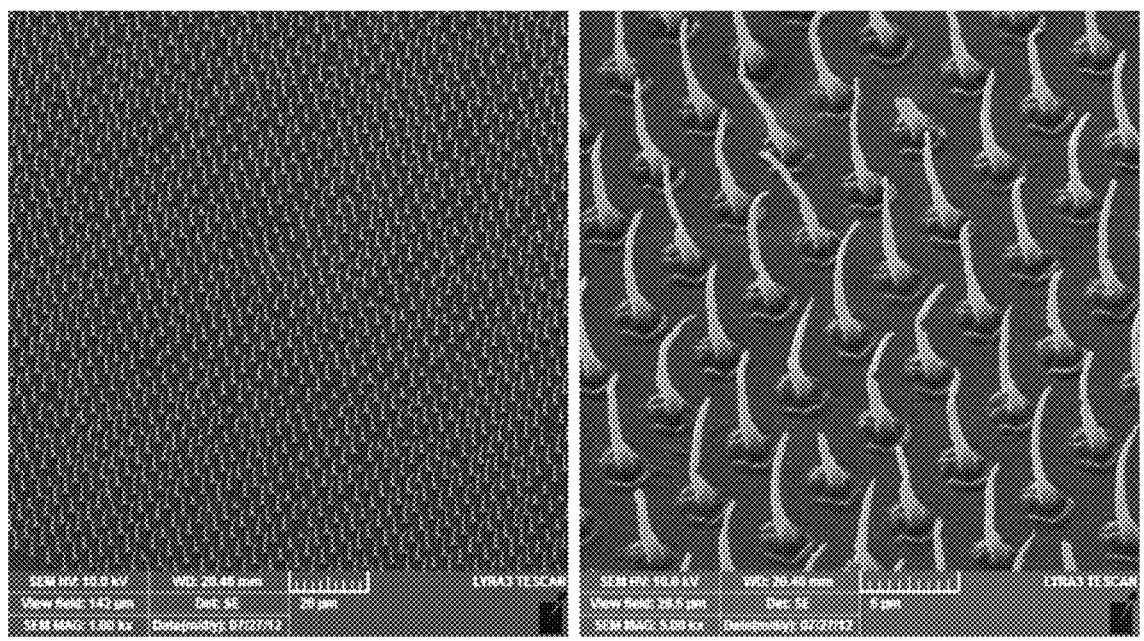
FIG. 24 is a SEM image of cellulose acetate nanowires (nanocones) imprinted from an as-machined fused silica template using 5 wt % cellulose acetate solution in acetone.
Figure 25:
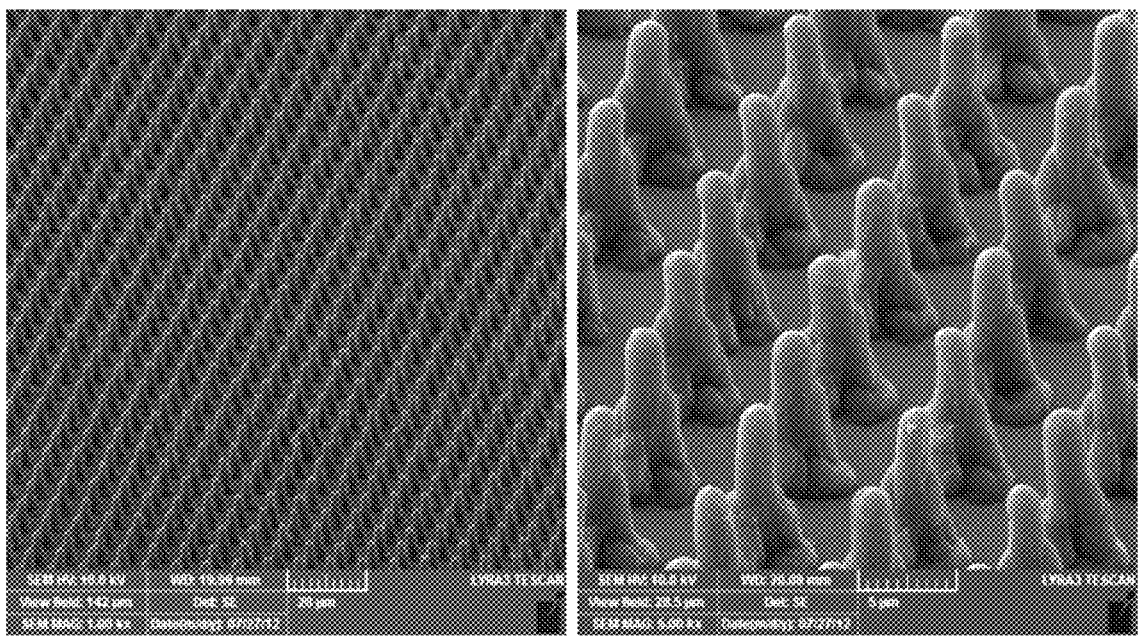
FIG. 25 is a SEM image of cellulose acetate micropillars imprinted from an etched fused silica template using 5 wt % cellulose acetate solution in acetone.

Chemically, cellulose acetate is the acetate ester of cellulose, a naturally occurring polymer. It is mostly used in the form of films and fibers. Cellulose acetate films were first introduced in photography as a replacement for the highly flammable nitrocellulose films as base materials for photographic emulsions. Later, cellulose acetate films were shown to be very useful as a replication material in microscopy for metallographic studies of metallic and biological samples. Indeed, it is known to use microscopy grade cellulose acetate films to determine the depth of femtosecond laser machined high aspect ratio nanoholes by replication. Cellulose acetate films can replicate these deep features without any observable stretching. Cellulose acetate is also used as a semi-permeable membrane in separation processes and films/filters in biomedical applications. One of the most common methods for the preparation of cellulose acetate fibers is electrospinning, and the cellulose acetate fibers thus produced in the form of mats have been examined as antimicrobial surfaces and drug delivery agents. The size of electrospun cellulose acetate fiber is usually controlled by adjusting the solvent system, and fibers with diameters in the range 100 nm to 5 μm have been successfully fabricated. In the present technology, ACS grade acetone can be used as the solvent to prepare cellulose acetate solution for solution casting. It was found that a 5 wt % cellulose acetate (average molecular weight 30,000) solution can form films that can be peeled off from the template. Dilute solutions of cellulose acetate (e.g., 2 wt %) can also be used to form peelable films by casting multiple layers. FIG. 24 and FIG. 25 show cellulose acetate structures imprinted from as-machined templates (CA nanowires) and etched templates (CA micropillars), respectively.

Figure 26:
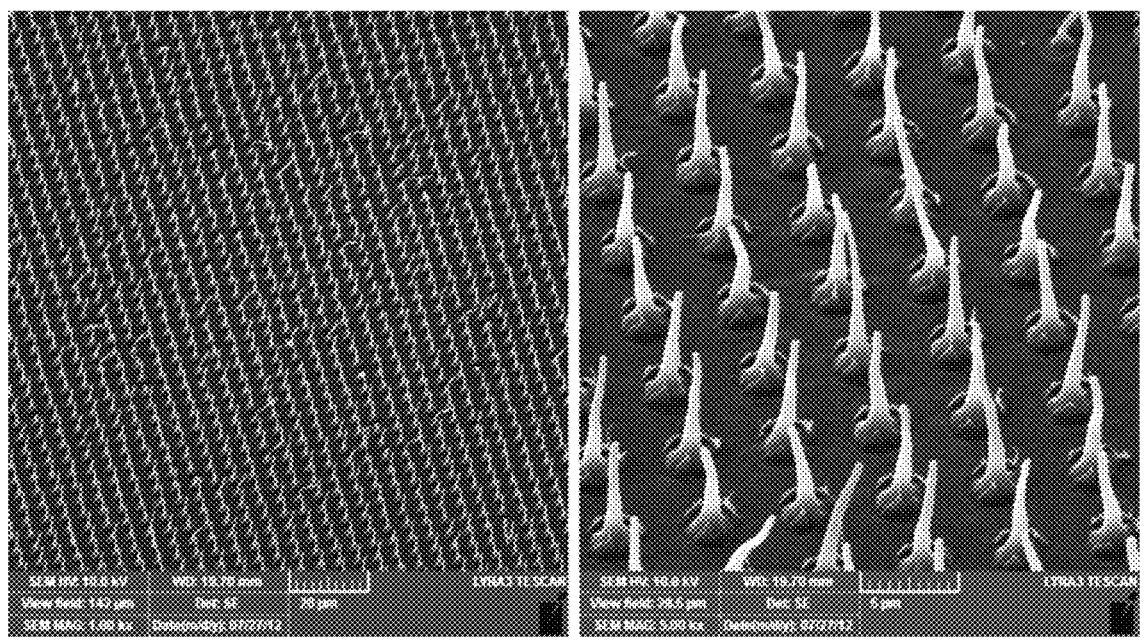
FIG. 26 is a SEM image of polyethylene nanowires (nanocones) imprinted from an as-machined fused silica template using 10 wt % polyethylene solution in toluene.
Figure 27:
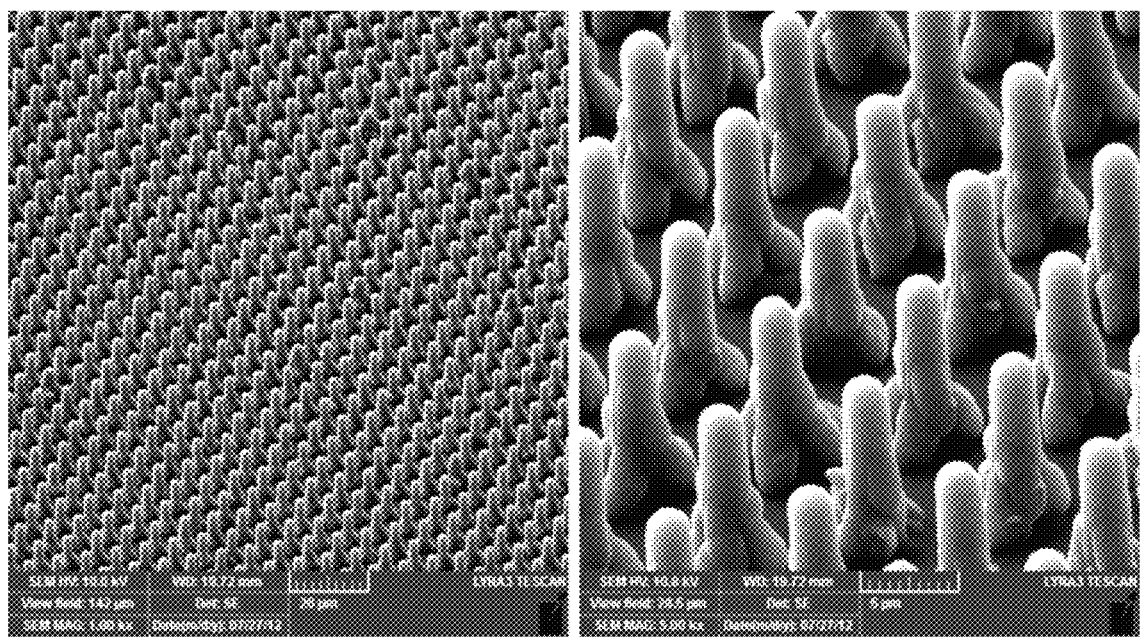
FIG. 27 is a SEM image of polyethylene micropillars imprinted from an etched fused silica template using 10 wt % polyethylene solution in toluene.

Polyethylene is one of the most widely used plastic materials in the world with majority of its applications in packaging industry. It is produced by polymerization of ethylene and its chemical formula is usually $(C_2H_4)_n$. It is further classified into several categories depending on the density and degree of branching. The two classes of polyethylene used predominantly are high-density polyethylene (HDPE) and low-density polyethylene (LDPE). HDPE ($\rho \geq 0.941$ g/cm$^3$) has strong intermolecular forces and high tensile strength due to a low degree of branching, whereas LDPE ($\rho = 0.91$-$0.94$ g/cm$^3$) has weak intermolecular forces and low tensile strength due to a high degree of short and long chain branching. HDPE is generally used to make structures and components for storage applications, whereas LDPE is commonly used to make films and rigid containers. Besides HDPE and LDPE, ultra high molecular weight polyethylene (UHMWPE) is also used in a variety of applications because of its high toughness in addition to excellent chemical resistance and low wear rate. UHMWPE also finds applications in biomedical engineering to make parts for hip and knee implants. Although it is always coated with hydroxyapatite or calcium phosphate to improve its cytocompatibility, it was recently shown that nanostructured polyethylene shows increased osteoblast and endothelial cell adhesion and can be explored for its applications in orthopedic and vascular applications. In embodiments of the present technology, nanowires and micropillars of polyethylene can be imprinted from the templates by solution casting in which an additional heating step can be used. The process is described elsewhere herein. SEM images of polyethylene nanowires and micropillars are shown in FIG. 26 and FIG. 27, respectively.

Figure 28:
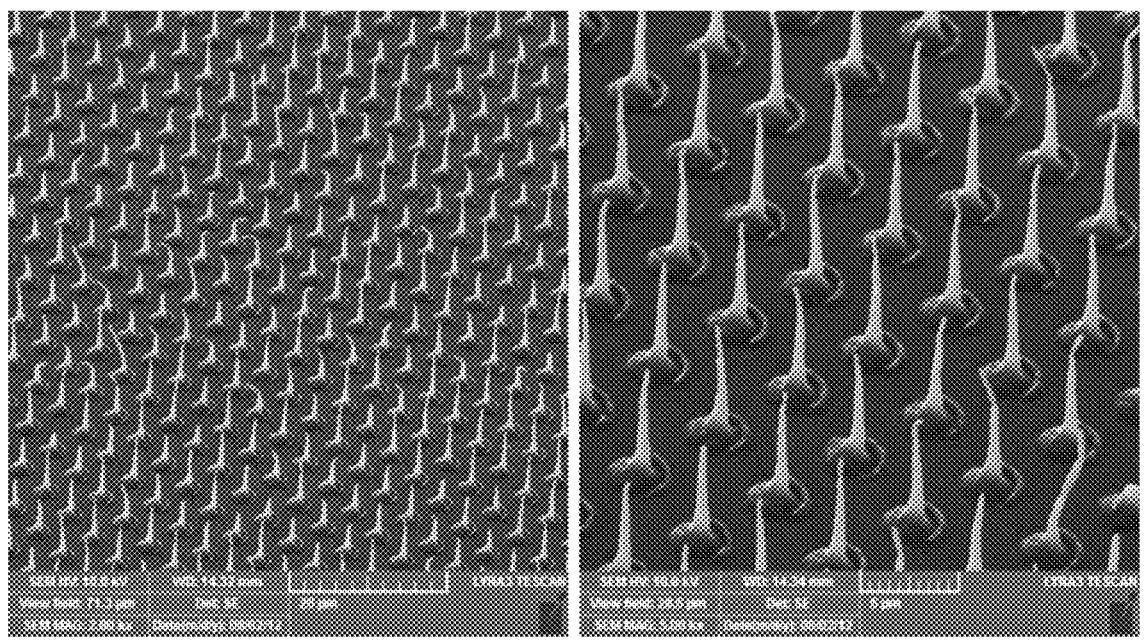
FIG. 28 is a SEM image of PVA nanowires imprinted from an as-machined fused silica template using 5 wt % PVA solution in DI water.
Figure 29:
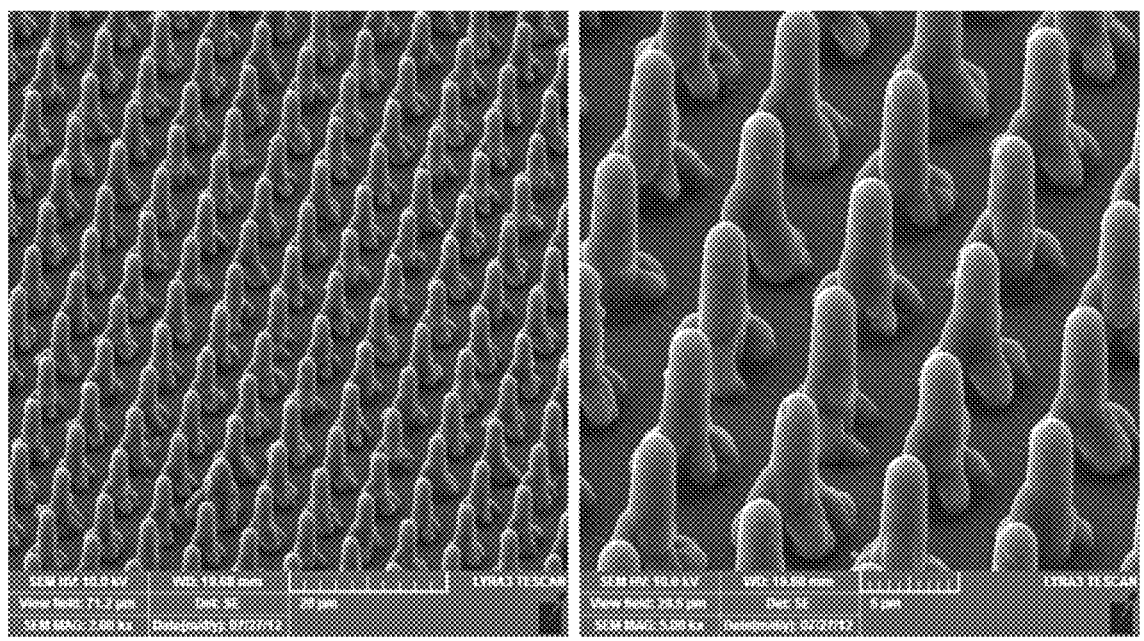
FIG. 29 is a SEM image of PVA micropillars imprinted from an etched fused silica template using 5 wt % PVA solution in DI water.

PVA is a non-toxic and water-soluble synthetic polymer with molecular formula $(C_2H_4O)_n$. The structural monomer of PVA is vinyl alcohol, which is unstable. It only exists in its tautomer form acetaldehyde, which is a more stable compound. Thus, PVA is not prepared by polymerization of its monomer like other polymers. Instead, it is prepared from polyvinyl acetate (PVAc) by hydrolysis where the ester linkages in PVAc are substituted with hydroxyl groups. Some common uses of PVA are: preparation of contact lens and polarizer, water transfer printing, and as a packaging material in food industry. PVA is also a potential biomaterial. In embodiments of the present technology, PVA (mol. wt. 30,000) structures can be made from its solution prepared in DI water, and are shown in FIG. 28 and FIG. 29.

Figure 30:
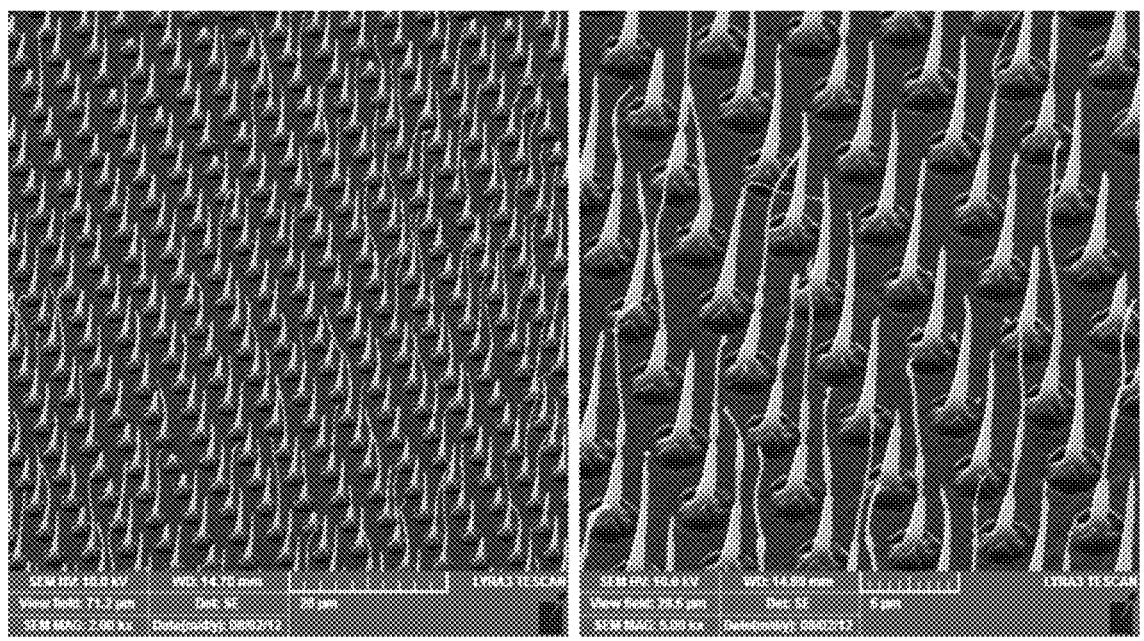
FIG. 30 is a SEM image of PMMA nanowires imprinted from an as-machined fused silica template using 10 wt % PMMA solution in toluene.
Figure 31:
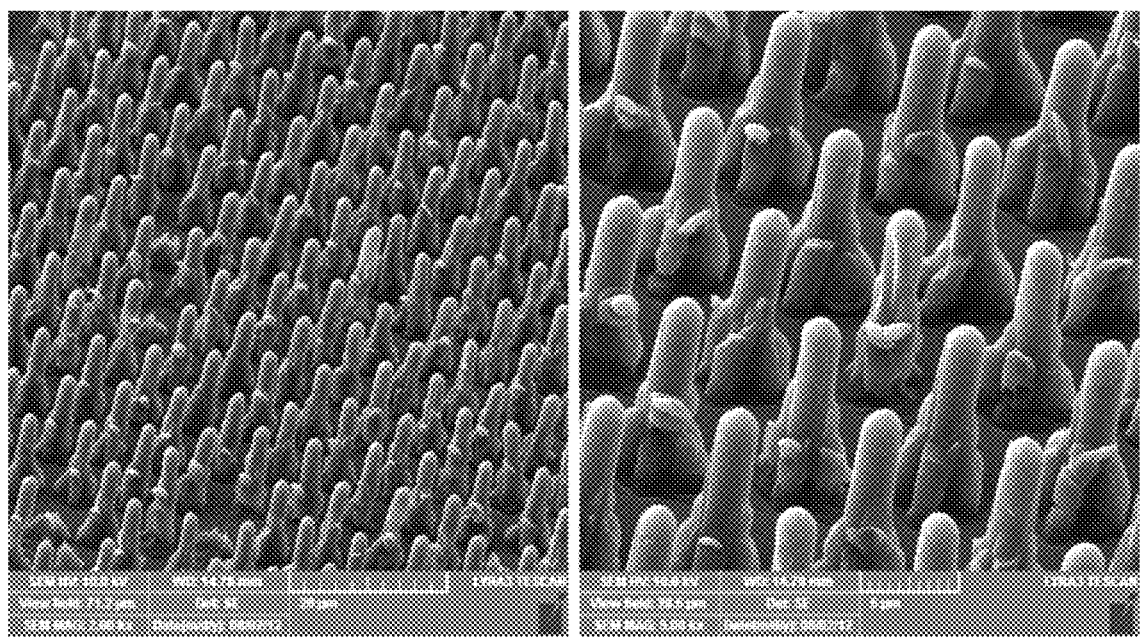
FIG. 31 is a SEM image of PMMA micropillars imprinted from an etched fused silica template using 10 wt % PMMA solution in toluene.

PMMA is a transparent polymer with molecular formula $(C_5O_2H_8)n$. It is a lightweight thermoplastic with good resistance to shattering, and is often used as an alternative to inorganic glass and polycarbonate. It is thus also called acrylic glass. PMMA is usually chemically modified for practical purposes. Due to its low cost and transparent nature, PMMA is used in a variety of applications, such as lenses and windows for automobiles and aircrafts, viewing ports in underwater vehicles, aquariums, daylight redirection systems, and aesthetic structures. Because of its good compatibility human tissue, PMMA is also used in medical technologies and preparation of biological implants e.g., cosmetic and orthopedic surgery. PMMA is also found to be an attractive material for microfluidic lab-on-a-chip devices. In embodiments of the present technology, PMMA structures can be imprinted using its solution in toluene. SEM images of PMMA nanowires and micropillars are shown in FIG. 30 and FIG. 31, respectively.

Figure 32:
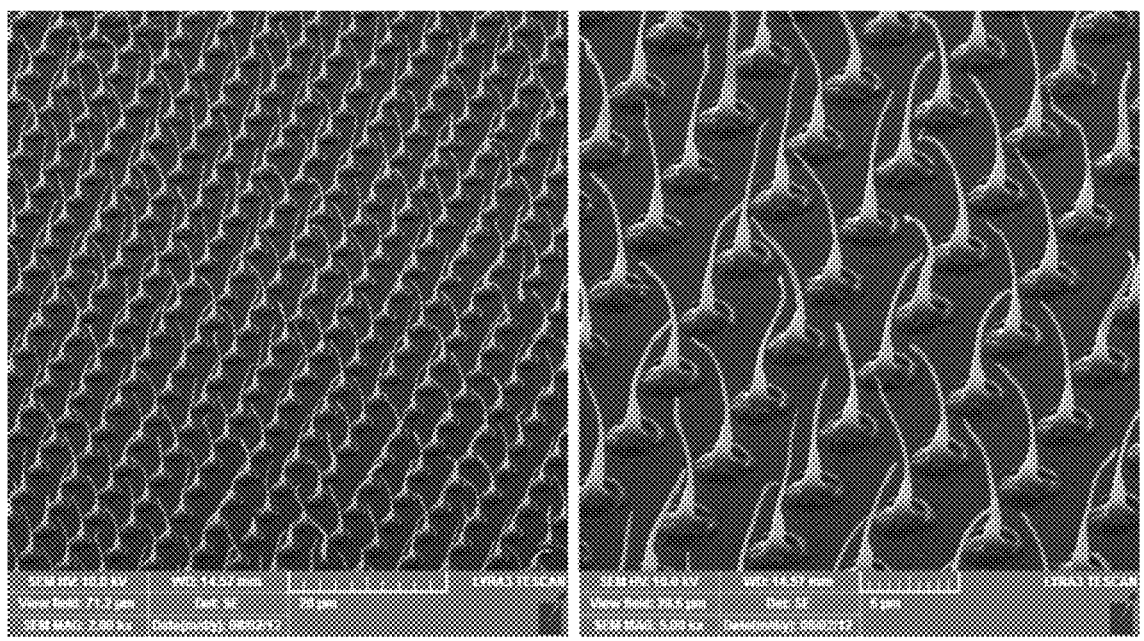
FIG. 32 is a SEM image of Collodion nanowires imprinted from an as-machined fused silica template using a 2% Collodion solution in amyl acetate.
Figure 33:
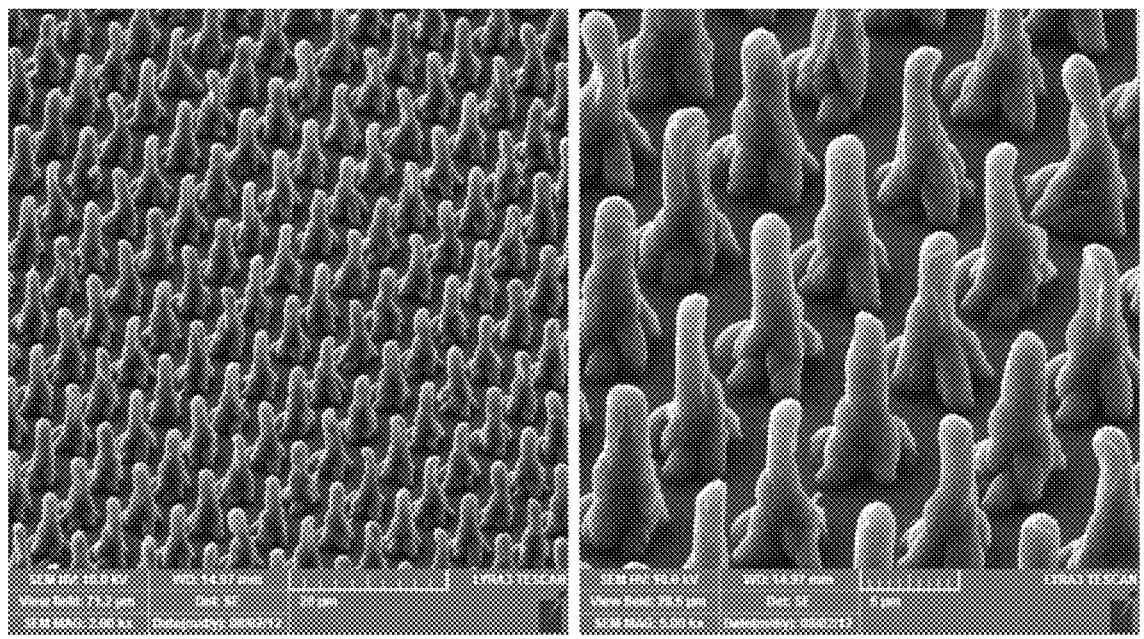
FIG. 33 is a SEM image of Collodion micropillars imprinted from an etched fused silica template using 2% Collodion solution in amyl acetate.

Collodion is essentially a solution of nitrocellulose. It finds applications as a glue to attach electrodes to the head for electroencephalography, cleaning agent for telescope optics, and as a replication material in microscopy. In embodiments of the present technology, Collodion structures can be imprinted using its commercially available 2% solution in amyl acetate (Parlodion). FIG. 32 and FIG. 33 show the SEM images of Collodion nanowires and micropillars, respectively.

Figure 34:
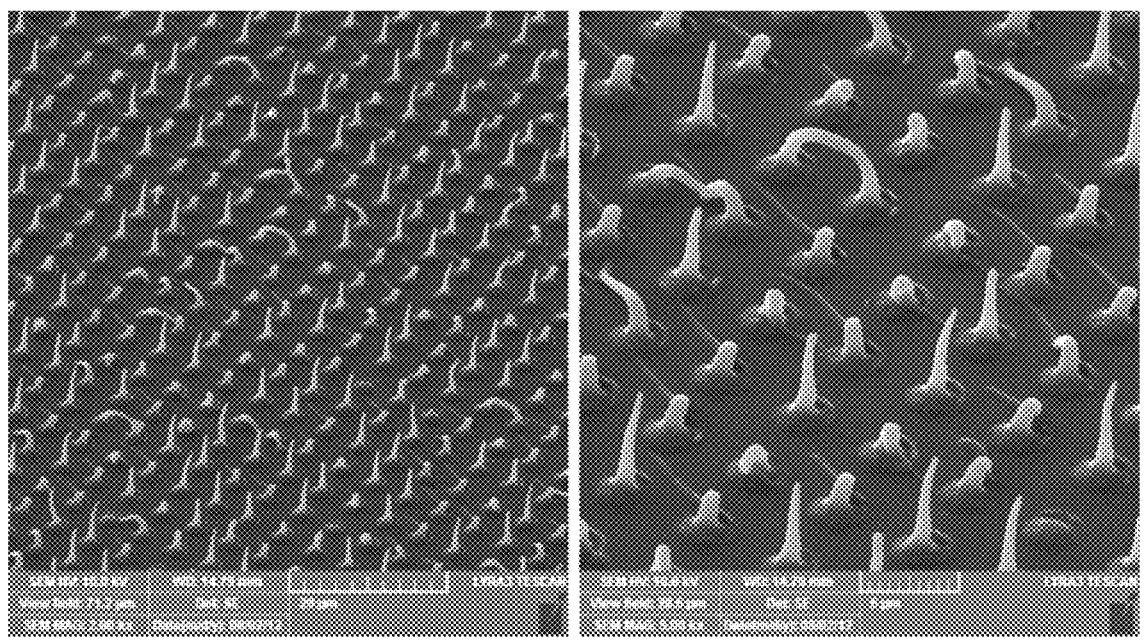
FIG. 34 is a SEM image of PDMS nanocones imprinted from an as-machined fused silica template using 33 wt % PDMS solution in n-heptane.
Figure 35:
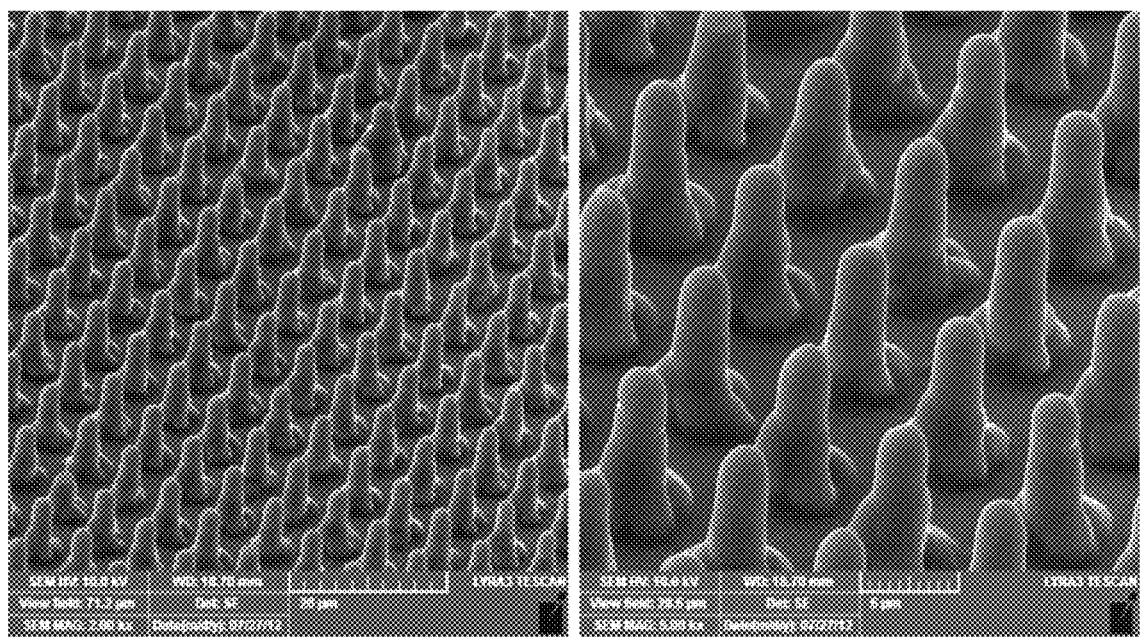
FIG. 35 is a SEM image of PDMS micropillars imprinted from an etched fused silica template using 33 wt % PDMS solution in n-heptane.

PDMS is also a transparent polymer and it belongs to the family of organosilicon compounds called silicones. Its molecular formula is $(C_2H_6OSi)n$. It is hydrophobic, non-toxic, not flammable, heat resistant, and inert to most chemical substances. It finds applications as contact lenses and medical devices. PDMS is currently a material of choice for microfluidic lab-on-a-chip devices and elastomer stamps for soft lithography. Commercially available two-part silicone elastomer kit Sylgard 184 is the most common material used to prepare PDMS. The two parts, base and curer, are usually mixed in 10:1 mass ratio and cured either in room temperature or at elevated temperature (usually 80° C. for 2 hours) for cross-linking. The mechanical properties of PDMS can be altered by varying the base to curer ratio. Uncured PDMS mixture is too viscous to fill the nanoholes of the templates, so its viscosity can be reduced by mixing in n-heptane. In embodiments of the present technology, PDMS structures can be imprinted using a 33 wt % PDMS (10:1 base to curer ratio) solution in n-heptane. SEM images of PDMS nanowires (nanocones) and micropillars are shown in FIG. 34 and FIG. 35, respectively.

PCL and PCL-PEG structures imprinted from as-machined fused silica templates are shown in FIG. 20 and FIG. 22, respectively. The imprinted structures appear to be 30-40 μm long nanowires compared to ~15 μm deep nanoholes they are imprinted from. Apparently, these nanowires undergo a lot of stretching during the imprint lift-off process. It can be reasonably explained with the help of various forces acting on the polymer within the nanoholes during their lift-off. The adhesive strength between the glass nanohole and the polymer exceeds the tensile strength of the respective polymers (PCL and PCL-PEG). Consequently, the polymers yield during their lift-off, which results in their stretching. PCL and PCL-PEG nanowires stretch even when the templates are coated with antistick to help release the imprint. Furthermore, freezing the PCL and PCL-PEG imprints below their glass transition temperature (<−60° C.) before lift-off also does not avoid their stretching. These nanowires were measured to be around 100 nm wide near their tip. Since the wires come out very long (>30 μm) due to stretching and are not stiff enough to carry their weight, they fall over acquiring the appearance of nanocarpets or nanomats. The stretched and fallen PCL and PCL-PEG nanowires have very high surface area and aspect ratios greater than 200:1.

SEM images of CA, PE, PVA, PMMA, and Collodion structures imprinted from as-machined templates are shown in FIG. 23, FIG. 26, FIG. 28, FIG. 30, and FIG. 32, respectively. The dimensions of these structures are fairly close to that of the nanoholes and morphologically they appear as nanowires or nanocones with their base diameter around 750 nm and tip diameter around 150 nm. It can also be seen that most of the polymer nanocones/nanowires slightly bend in one common direction whereas some tend to bend in random orientations. The yield of the imprinted structures (i.e., the total number of imprinted structures with respect to the total number of nanoholes in the pattern) can be very high as most of the nanoholes are successfully replicated. However, some polymer nanocones tend to break (CA and PE) or stretch (PMMA) during lift-off. The yield, to a certain degree, can improve if adequate time is given for the solvent to dissipate before the imprint lift-off. Most PDMS nanocones tend to fall over unlike any other polymer nanocones, but without breaking. It can be attributed to the low Young's modulus of PDMS, which is <1 MPa for any given base to curer ratio. Moreover, the chemical structure and mechanical properties of PDMS are very different from other polymers discussed herein. Its 3D cross-linked structure together with a combination of very long Si—O skeletal bond, unobstructed skeletal oxygen atoms, and large Si—O—Si bond angle of 143° provide it with extraordinary dynamic flexibility and deformability. The polymer structures imprinted from the etched template adopt the shape and dimensions very close to that of the cylindrical holes they are cast from. Morphologically, they appear as micropillars though their textures vary because of their physicochemical properties. The yield can approach 100% in all the polymers.

Thin film imprinting is suitable for those polymers that can be obtained or prepared in the form of thin films (e.g., cellulose acetate and polyvinyl chloride) and at the same can be softened by a readily available solvent, thus making it a highly selective process. Thus, polymers that do not soften or dissolve in any solvent cannot be used to make polymer structures by thin film imprinting e.g., thermosets like polydimethylsiloxane (PDMS). In comparison, solution casting can be used to imprint polymer structures from virtually any polymer that forms continuous films. Blending different polymers or reinforcing polymers with other polymers or non-polymeric materials leads to the formation of multifunctional polymers with novel properties for a variety of applications in particular biomedical engineering. Such multifunctional polymer structures with varying chemical composition and tunable physical properties can be more efficiently prepared by solution casting than thin film imprinting. Furthermore, heterogeneous structures composed of multiple layers of different polymers can be prepared by solution casting, which are otherwise not possible with thin film imprinting. Thus, solution casting offers several advantages over thin film imprinting, and can be employed for fabrication of novel polymer structures for advanced technologies.

Polymer structures imprinted from templates can be functionalized by coating with different materials in order to modify their physical, chemical, and biological properties. Functionalized polymer structures are useful for a number of applications e.g., photovoltaics, high surface area electrodes, and synthetic cell culture substrates. In embodiments of the present technology, polymer structures can be coated with noble metals (gold, platinum, and palladium) by sputtering, and with silica by chemical vapor deposition.

Noble metals can be coated at cryogenic temperatures in a sputtering machine as described elsewhere herein. The thickness of the metal coating can be varied by changing the sputtering time and applied current/voltage. However, sputtering is a line-of-sight deposition process, which affects the metal coating coverage on the surface of the imprinted polymer structures. The sidewalls of the polymer structure receive considerably less amount of metal coverage when compared to the tips of the polymer structures. Nevertheless, the coating coverage can be improved by tilting and spinning the polymer imprints for which the sputtering instrument will need a stage for sample manipulation. All the SEM images of the polymer structures shown herein are taken after coating with noble metals, mostly platinum, below −165° C. Besides noble metals, the imprinted polymer structures can be coated with other materials as well, such as insulators and metals, provided the deposition temperature is low enough to avoid polymer softening or disintegrating.

In embodiments of the present technology, a low temperature chemical vapor deposition process can coat cellulose acetate nanowires with silica to prepare silica nanowires (or nanoneedles). It is a two-step chemical vapor deposition, which deposits a thin layer of silica atop thin film imprinted CA nanowires at 65° C. by hydrolysis of silicon tetrachloride ($SiCl_4$). Two separate beakers can be used for silica deposition: one with silicon tetrachloride solution and the other with water. The surface of CA nanowires can be covered with $SiCl_4$ in the first beaker, which can be hydrolyzed to form $SiO_2$ in the second beaker. The silica coating thickness can be studied as a function of exposure time in beaker 1110. The exposure time in beaker 1150 can be kept constant at 5 minutes, which is sufficient for the complete hydrolysis of $SiCl_4$ molecules adsorbed at the surface of CA nanowires in beaker 1110. The coating thickness can be determined for the first 6 minutes with the help of SEM images of the corresponding silica nanowires.

Figure 36:
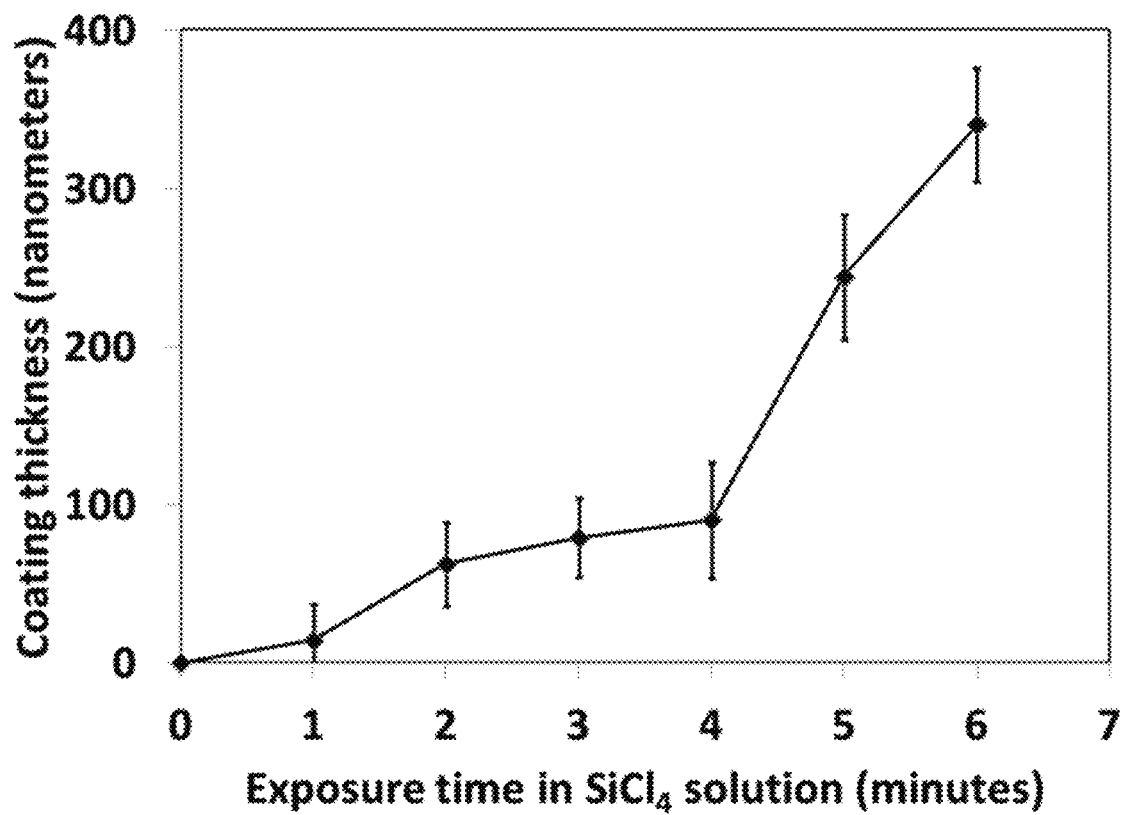
FIG. 36 illustrates the rate of deposition of silica as a function of exposure time in a first beaker in accordance with functionalization of nanostructures of the current technology.
Figure 37:
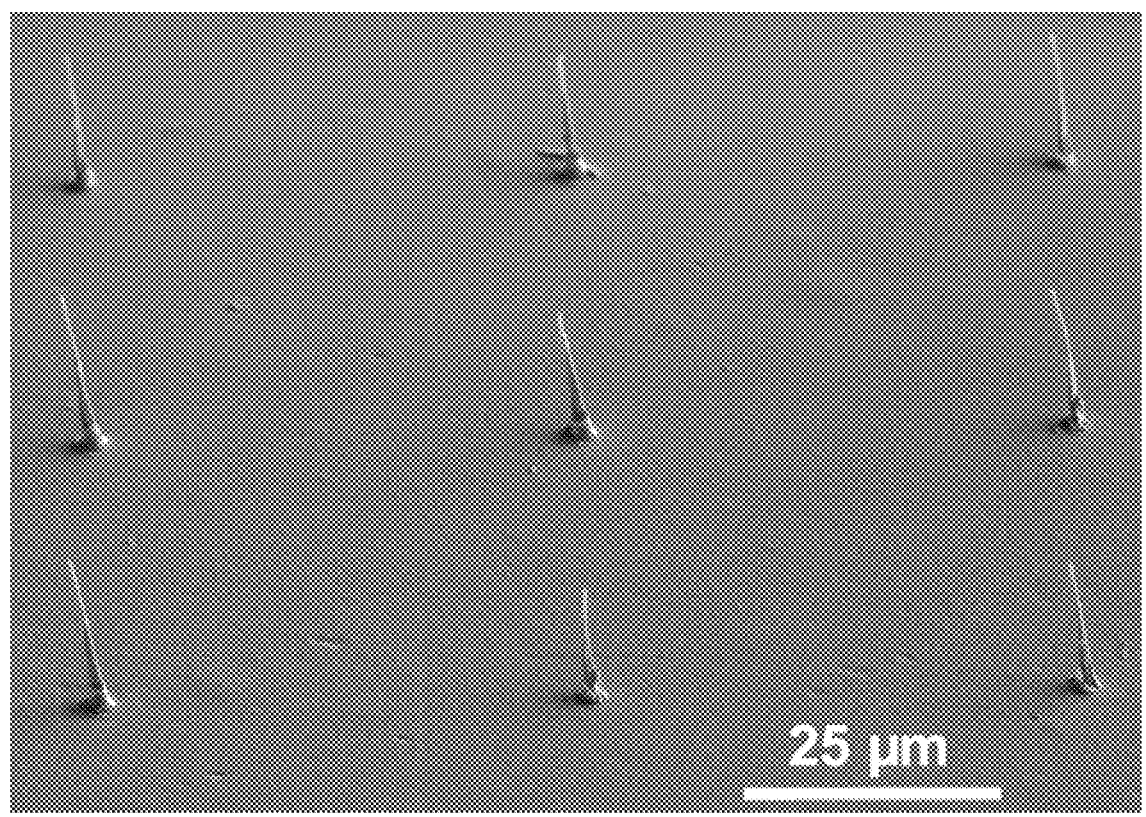
FIG. 37 is an SEM image of an array of silica nanowires obtained by coating cellulose acetate nanowires with silica for 5 minutes in the first beaker in accordance with functionalization of nanostructures of the current technology.
Figure 38:
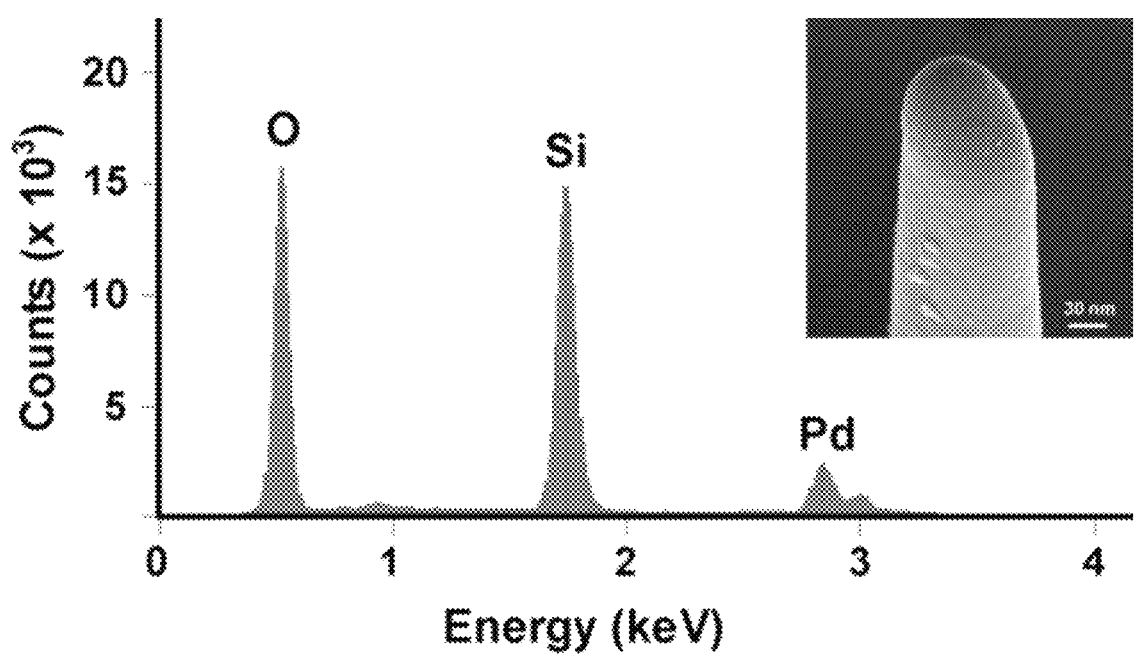
FIG. 38 is an EDS spectrum of the tip of a silica nanowire shown on top right.

The rate of silica deposition as a function of exposure time in beaker 1110 ($SiCl_4$ solution) is shown in FIG. 36. FIG. 37 shows an SEM image of an array 3700 of silica nanowires obtained after 5 minutes exposure in beaker 1110. In order to confirm the formation of silica, a silica nanowire can be subjected to elemental analysis using EDS. The EDS analysis, spectrum 3800 shown in FIG. 38, confirms the presence of silicon and oxygen. It reveals the presence of silicon and oxygen in the coating. The sample was coated with palladium prior to SEM/EDS analysis, thus shows up in the EDS spectrum. Although it is a qualitative measurement, the EDS spectrum does reveal the presence of silicon and oxygen in the coating, thus confirming the formation of silica. To further characterize the silica coating, an absorption spectrum can be recorded on an ATR-FTIR and is shown in FIG. 39.

Figure 39:
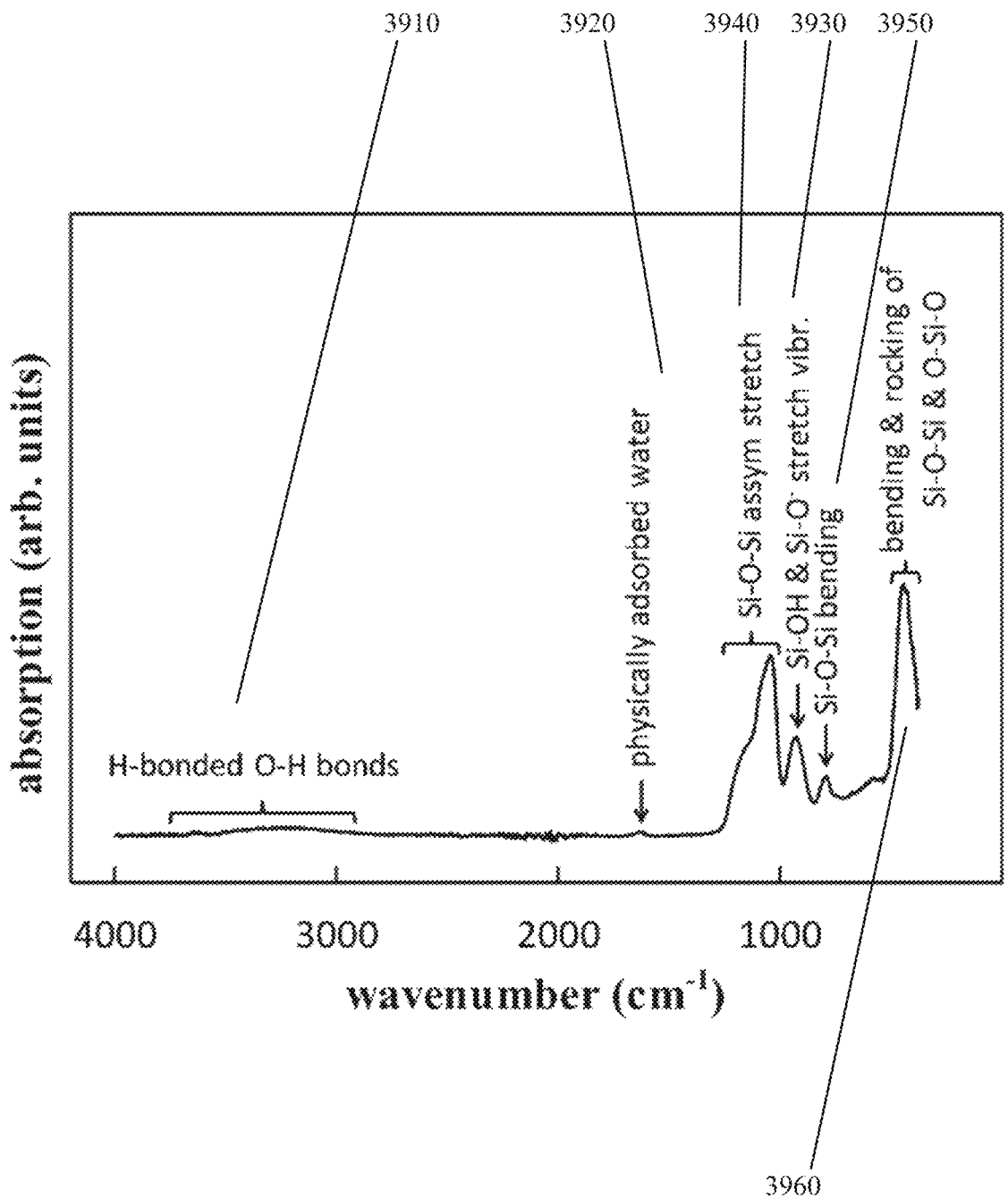
FIG. 39 illustrates the absorption spectrum of a silica coating recorded on an ATR-FTIR.

The mid-infrared absorption spectrum of the coating shown in FIG. 39 reveals the presence of various vibrational modes in silica, and gives more information about its chemical structure. It shows the presence of various Si—O—Si and O—H vibration modes. The broad band in the interval 3700-3000 $cm^{-1}$ 3910 corresponds to the intensive overlapping of the stretching modes in hydrogen-bonded hydroxyl bands produced by O—H bonds in water and Si—OH. A small peak at 1635 $cm^{-1}$ 3920 is usually attributed to the deformation vibrations of the O—H groups in physically adsorbed molecular water at the surface of silica coating and its weak intensity confirms the presence of very low amount of molecular water in the coating. A sharp peak at ~927 $cm^{-1}$ 3930 appears due to the stretching vibrations of Si—OH or Si—O⁻ groups in silica, which indicates the presence of a large number of silanol groups on the coating surface. The band at 1000-1300 $cm^{-1}$ 3940 appears due to the anti-symmetric stretching of Si—O—Si bonds in silica. This band can be resolved into a peak at 1041 $cm^{-1}$ ($TO_1$) and a shoulder around 1156 $cm^{-1}$ ($TO_2$). The $TO_1$ peak in silica is usually found at 1082 $cm^{-1}$ and its shifting towards lower frequencies, 1041 $cm^{-1}$ in the present case, has been reported to be associated with oxygen deficiency and lower three-dimensionality in the structure of silicon oxide. It indicates that the stoichiometry of the silica coating in the present case is $SiO_x$ with x<2. Furthermore, the peak appearing at 799 $cm^{-1}$ is due to the bending vibration of Si—O—Si bonds. A peak due to the bending modes in Si—OH bonds also appeared around ~790 $cm^{-1}$ 3950; however, it is very close to the Si—O—Si bending mode and cannot be seen clearly in the spectrum. A series of peaks appears in the lower frequency region from 448 to 424 $cm^{-1}$ 3960, which could have arisen due to the combination of bending and rocking modes of Si—O—Si or O—Si—O bonds in the coating. However, it is very difficult to resolve and identify all these peaks in detail.

Figure 40:
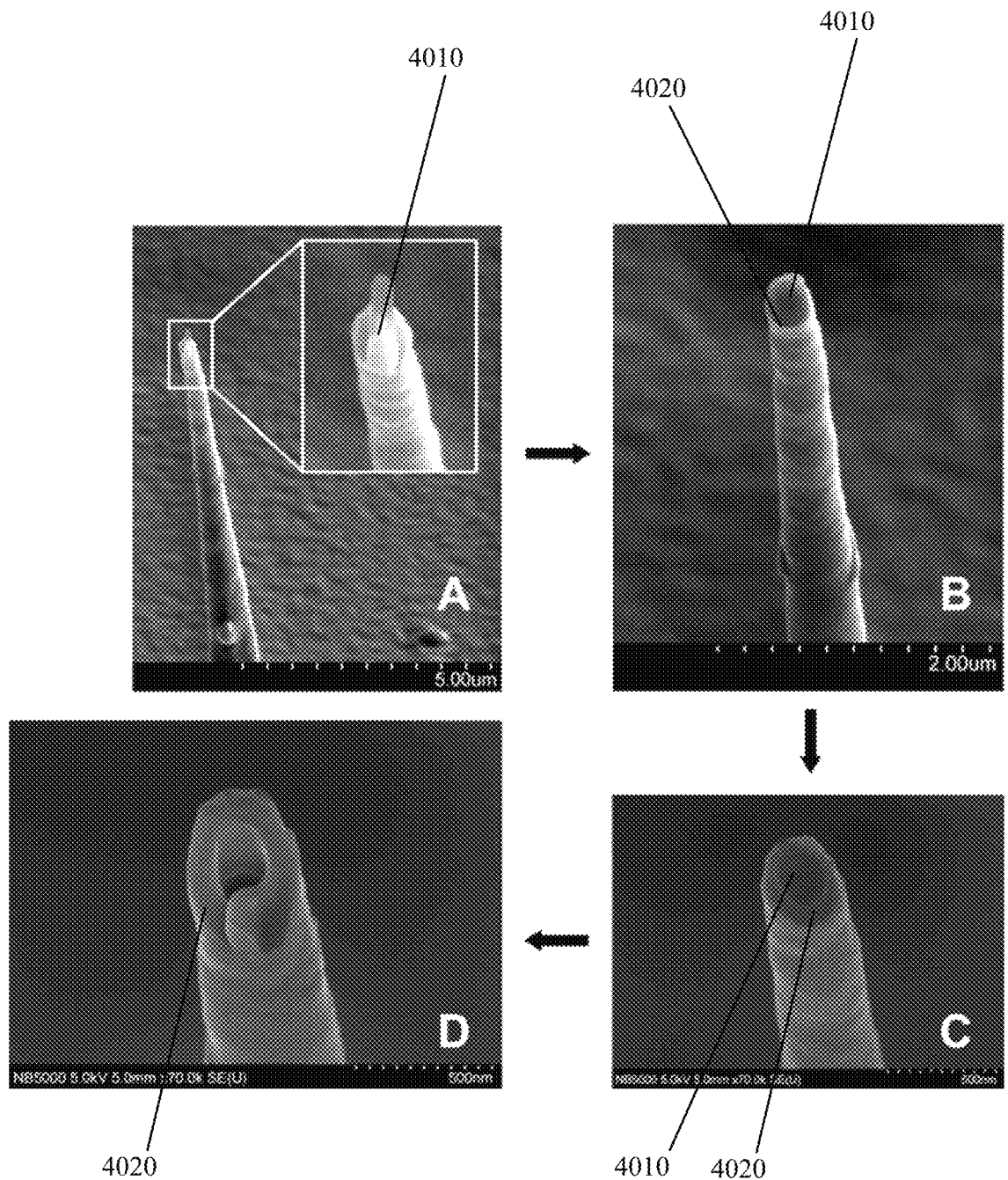
FIG. 40 present SEM images of a silica nanowire subjected to gallium ion sectioning in an SEM/FIB. Each image represents a different section further down the silica nanocone from (A) to (D). The final image (D) shows an open-tip silica nanoneedle.

A silica nanowire produced by coating for 5 minutes was sectioned using a focused ion beam instrument to view its cross-section. A series of SEM images were captured while sectioning the silica nanowire, and are shown as a composite picture in FIG. 40. The tip of the silica nanowire was cut with a gallium current of 20 µA at the projected length of ~9 µm from the base (i.e., ~13 µm actual length). The inset (A) shows the CA nanowire 4010 at the center of the structure. A sequence of cuts was made further down the silica nanowire; two of them are shown in (B) and (C), where the silica coating 4020 and CA 4010 can be easily distinguished by contrast. In addition, the silica coating thickness and CA nanowire diameter can also be clearly seen as well. The FIB milling angle was slightly changed to drill into the CA nanowire and reveal the interior of the silica nanoneedle 4020 (D). It indicates that the silica coating is around 125 nm thick and the CA nanowire is 175 nm in diameter at that particular location on the silica nanowire. It must be noticed that the FIB-sectioned hole appears elliptical because it was imaged at 58° from the horizon in the FIB/SEM.

Figure 41:
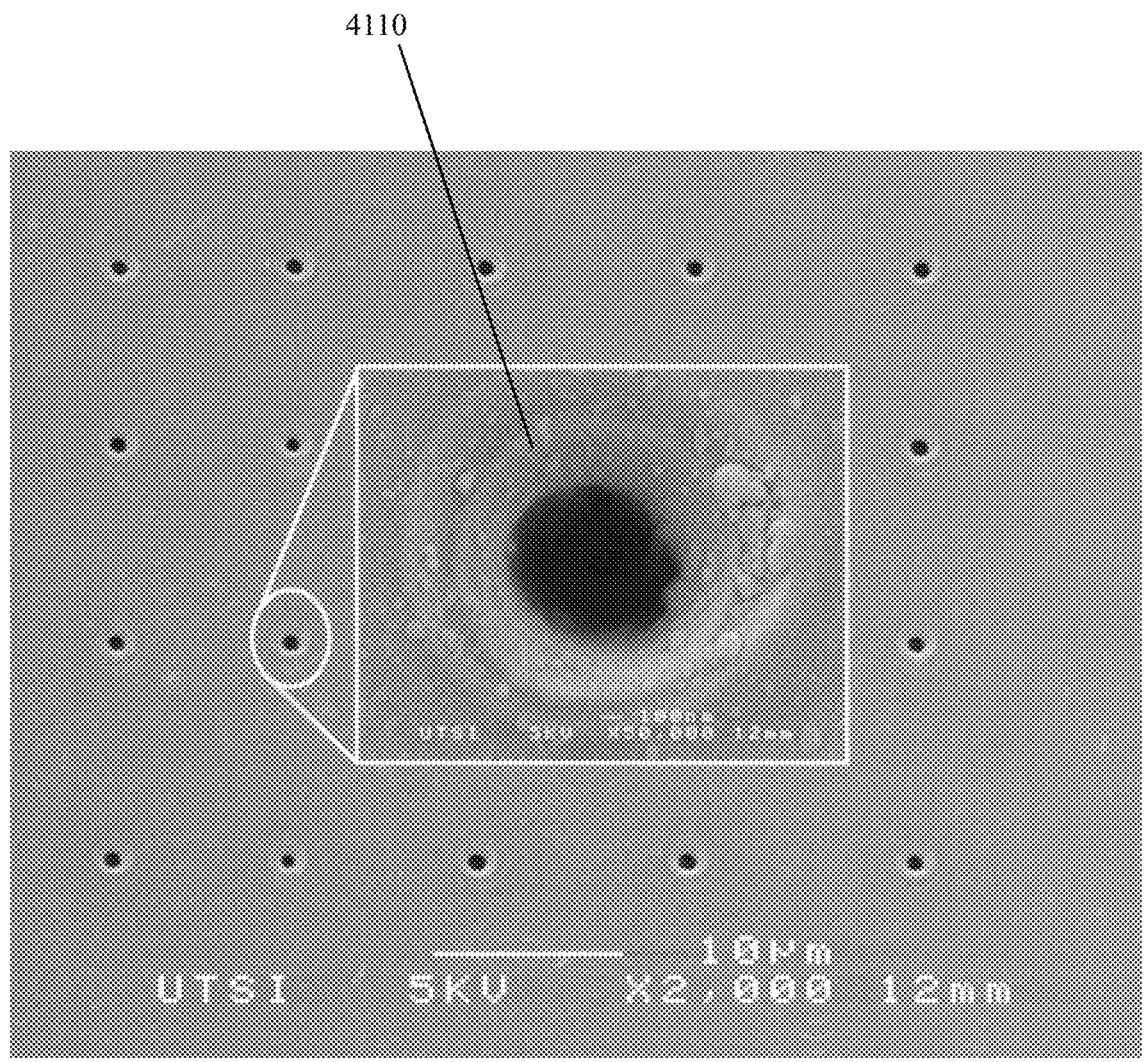
FIG. 41 is an SEM image of nanoholes from an edge of the 2D gradient pattern.
Figure 42:
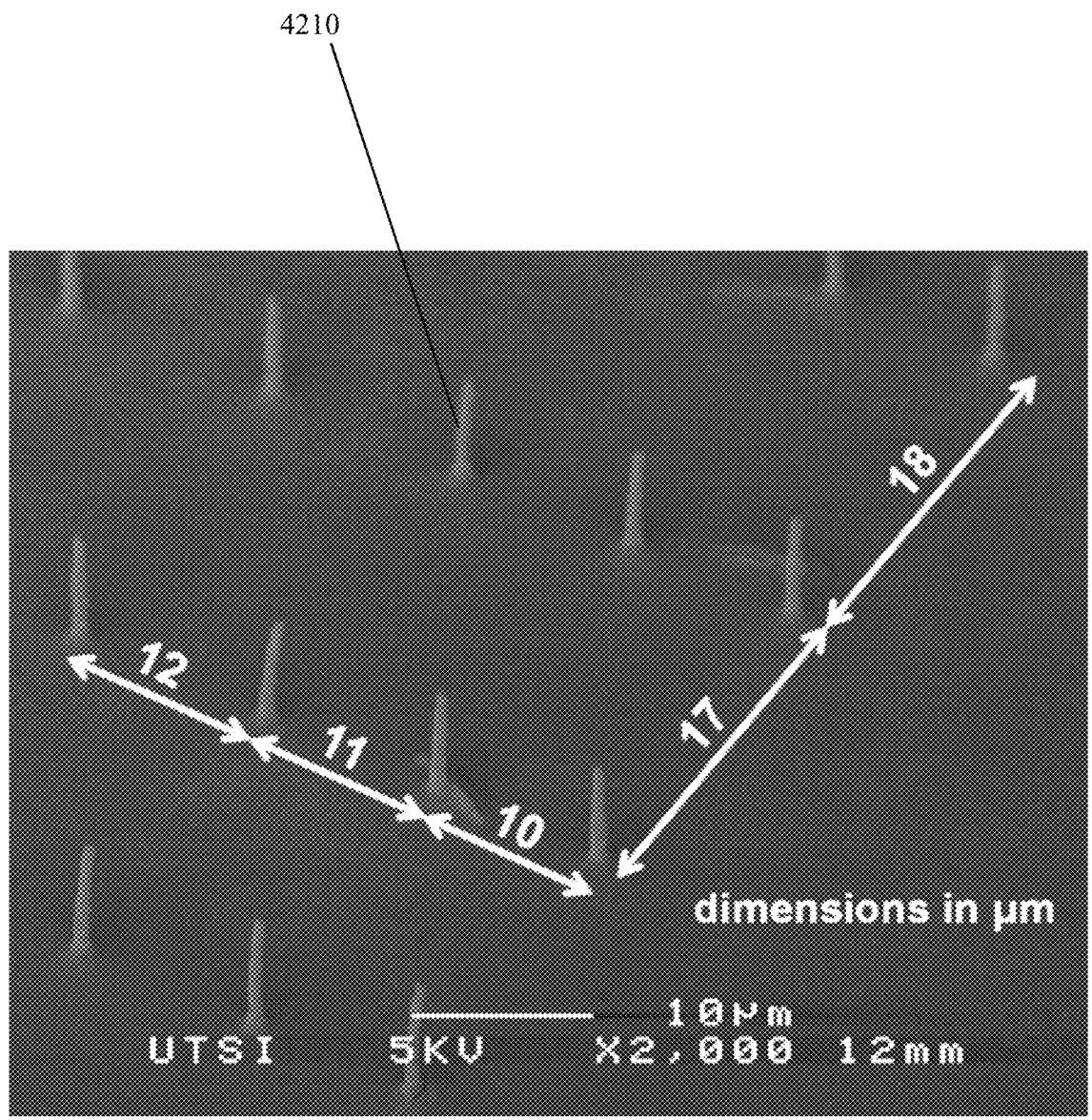
FIG. 42 is an SEM image of silica nanoneedles made by coating cellulose acetate nanowires with silica.

FIG. 41 and FIG. 42 show the SEM images of the nanoholes, e.g., 4110 from an edge of the 2D gradient pattern and silica nanoneedles 4210, respectively. The average diameter of the nanoholes is 750 nm and the depth ~14 μm. Flat silica coated cellulose acetate and silica nanoneedles can be used as cell culture substrates to cultivate NIH 3T3 fibroblasts.

Figure 43:
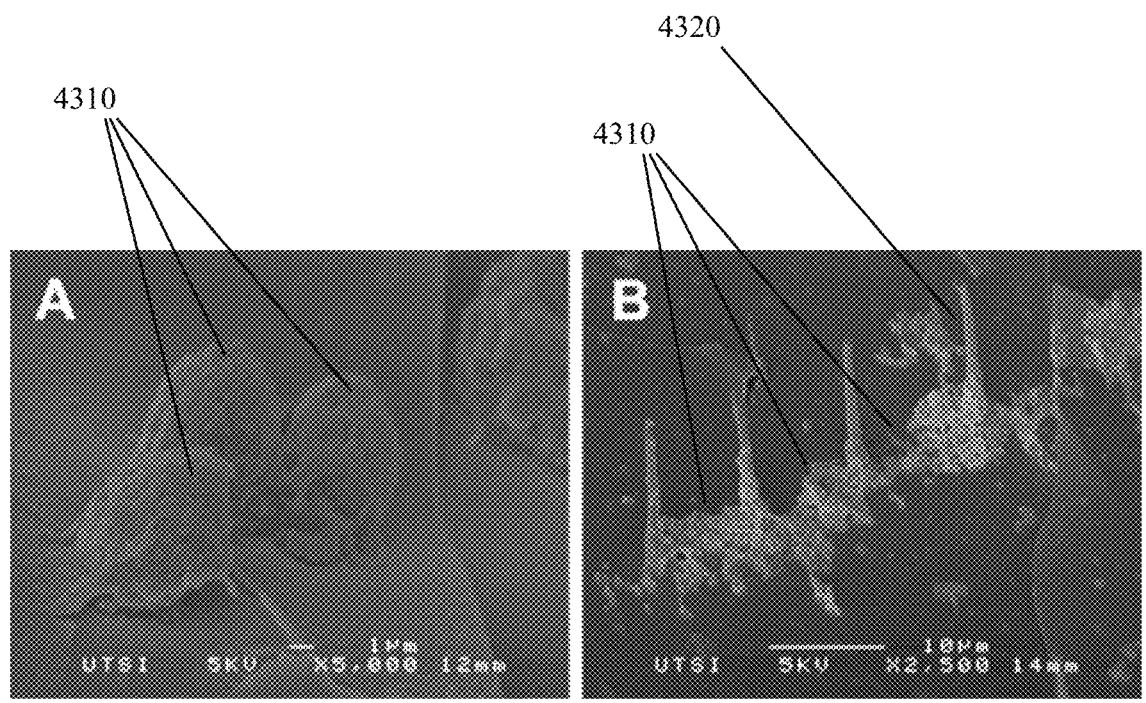
FIG. 43 presents SEM images of cells fixed on flat silica (A) and silica nanoneedles (B).

The cellular response can be altered in the presence of silica nanoneedles as compared to flat silica surfaces. It can be seen in FIG. 43 that the fibroblasts 4310 "ball up" or agglomerate on flat surfaces (A), whereas they extend their foci to adhere to the nanoneedles (B), e.g., 4320. The figure shows how the morphology of NIH 3T3 fibroblasts is affected by the surface topography of the substrate. Cell agglomeration on flat silica is an indication of poor adhesion, whereas cell spreading on silica nanoneedles is an indication of good adhesion. Silica coating cracks during cell fixation and can be seen in these SEM images. As shown, cell adhesion to surfaces with silica nanoneedles can be an order of magnitude higher than that on to flat surfaces ($p=0.005$, FIG. 44, while viability can be maintained for cells adhered to either surface (FIG. 44(B)). Fibroblast spreading also can be influenced in the presence of silica nanoneedles. Fibroblasts can exhibit a larger area and perimeter on silica nanoneedles than those cultured on flat surfaces ($p<0.005$ and $p=0.007$, FIG. 44(C) and FIG. 44(D), respectively).

Figure 45:
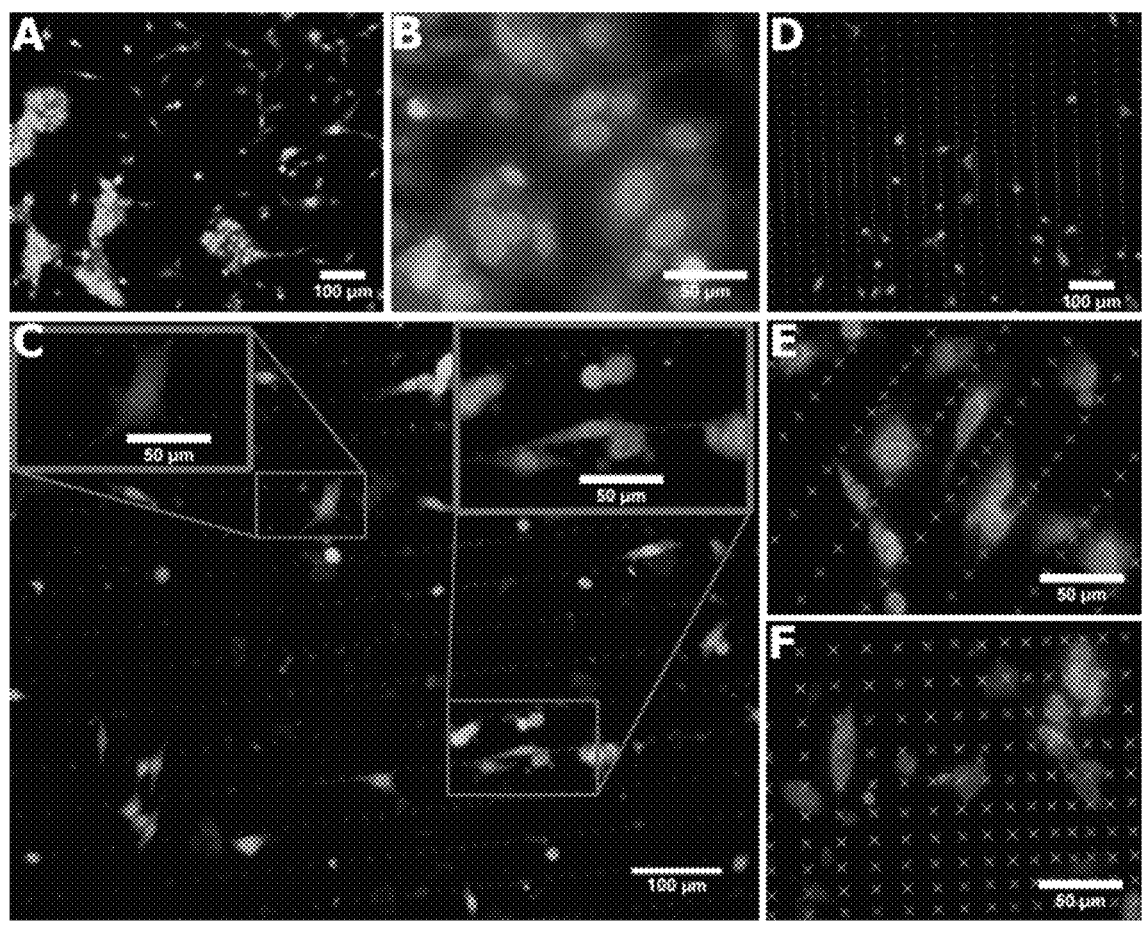
FIG. 45 illustrates how cell behavior can be influenced by the presence and spacing of silica nanoneedles.

The presence and spacing of silica nanoneedles can influence competitive cell-cell versus cell-matrix interactions and can be seen in FIG. 45. Flat surfaces allow for the formation of large, unorganized cell aggregates and independent, single-cell growth (A-B). Cells interact directly with the needles and only small cell aggregates, if any, are able to form (C-D). Parallel rows of tightly spaced needles sequester cells between them (E). Few, if any, cells are able to attach in areas of densely packed needles, but attachment improves as spacing becomes sparser (F). Cells either spread out individually or formed large, multicellular aggregates (A) on flat silica substrates that do not display noticeable organization or regularity (B). In comparison, the presence of silica nanoneedles can prevent cell aggregation, interrupt cell-cell contacts, and promote interactions with the matrix (C-F).

Note that the fibroblasts can preferentially align themselves along tightly spaced nanoneedles in gradient regions with sparse spacing in the orthogonal direction. In regions with sparse distributions in both directions, cells can interact both with adjacent needles as well as those located in the parallel rows (C-D). In general, parallel rows of silica nanoneedles with substantial spacing between them (i.e. >30 μm) can sequester cells and bias them towards cell-matrix interactions. This spacing also can control the size and geometry of small cell clusters present (E). Threshold spacing between silica nanoneedles appears to exist that can regulate the ability of cells to adhere and spread in two dimensions (F).

Relative spacing ratios for local regions of needles can regulate cell spreading. Sparse spacing in two dimensions can allow single cells to spread in two dimensions, whereas tight spacing in one dimension but wide spacing in the orthogonal direction can influence cells to spread only in one direction. Cells tend to spread in one dimension when the ratio between nanoneedles spacing in orthogonal directions is less than 0.5 (given that the nanoneedle spacing can allow for cells to attach between parallel rows). In contrast, the cells tend to spread in two dimensions when the nanoneedles spacing ratio is greater than 0.5. No significant difference in αSMA expression between flat silica and silica nanoneedles substrates has been observed. Furthermore, αSMA stress fibers are not observed on either substrate.

In embodiments of the present technology, silica nanoneedles can act as a means to modulate cell-cell versus cell-matrix interactions. Competitive cell-cell and cell-matrix interaction is a fundamental regulator of embryogenesis and has been manipulated for complex tissue engineering strategies. Cells of different lineages exhibit biased interactions depending upon their physiological location and function. For example, sheet-like epithelial and endothelial cells are dominated by cell-cell contacts through which various signals can be propagated; yet, cells of a mesenchymal lineage are primarily cell-matrix interactive. Intricate lineage transition events, such as mesenchymal-to-epithelial transition (MET) and its reverse (EMT), can be influenced by shifting the balance between these competitive events. In certain cancers, malignant cells in a primary tumor can undergo such a transition, allowing them to escape from their current location and metastasize. By probing and modulating cell adhesion events, fundamental processes involved in embryogenesis, tissue engineering, and cancerous transformation can be intimately studied, controlled, and exploited for therapeutic benefits.

Figure 44:
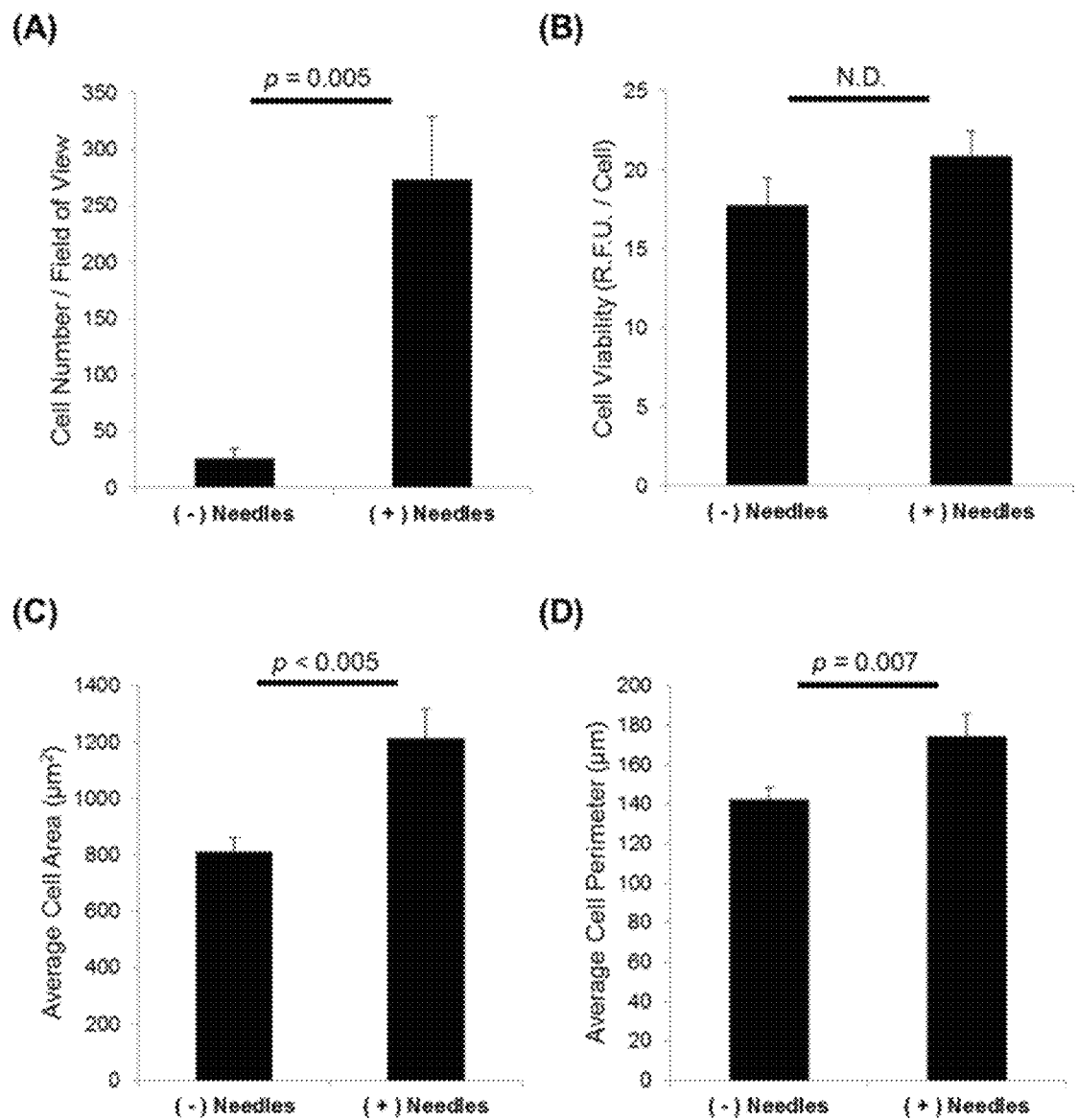
FIG. 44 illustrates a comparison between cellular response to flat silica and silica nanoneedles.

In embodiments of the present technology, the presence of silica nanoneedles can improve cell adhesion to the surface and stimulate cell spreading without substantially affecting viability. Qualitative analysis comparing cellular response to flat silica and silica nanoneedles is shown in FIG. 44. Silica nanoneedles were found to promote cell attachment and spreading. Significantly more cells attach to nanoneedle-containing surfaces (A) while cell viability is unaffected (B). Cell spreading (area, perimeter) are increased on nanoneedle-containing surfaces (C and D). It can be seen that direct interactions between fibroblasts and the silica nanoneedles can interrupt the formation of large cell aggregates that can be seen on flat silica surfaces. Parallel rows of nanoneedles effectively can constrain the cells and regulated the geometry of small aggregates that form (FIG. 45). Furthermore, the cellular response can be dependent upon nanoneedles spacing. The ratio of nanoneedles spacing in orthogonal rows correlates with cell spreading in one versus two dimensions, suggesting that the cells may actively sense the 3D microenvironment and that nanoneedles spacing can be used as a parameter to regulate cell behavior.

Figure 59:
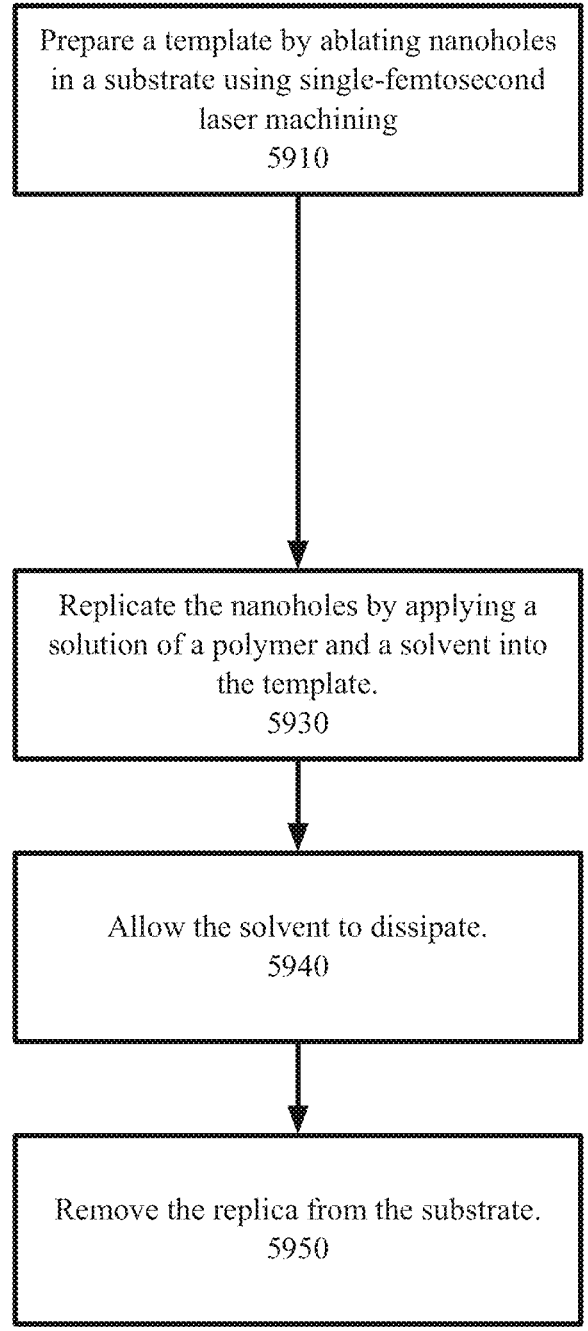
FIG. 59 example methods for casting a nanostructure in accordance with embodiments of the present technology are illustrated.

Referring to FIG. 59 through FIG. 62, methods of the present technology are illustrated. Referring to FIG. 59, a method 5900 for solution casting a nanostructure is illustrated. In such method, a template can be prepared by ablating nanoholes in a substrate using single-femtosecond laser machining—Block 5910. The nanoholes can be replicated by applying a solution of a polymer and a solvent into the template—Block 5930. After the solvent has substantially dissipated (Block 5940), the replica can be removed from the substrate—Block 5950. In some embodiments, the polymer solution comprises one of: cellulose acetate in acetone, polycaprolactone (PCL) in chloroform, PCL-polyethylene glycol in chloroform, polydimethylsiloxane in heptane, polymethylmethacrylate in toluene, polyvinyl alcohol in de-ionized water, and collodion in amyl acetate. In some embodiments, the polymer is capable of forming a continuous film. In some such continuous film embodiments, the polymer is capable of forming a continuous film through the application of external energy. In some embodiments, the polymer solution comprises a two percent (2%) solution by weight of one of: cellulose acetate in acetone, polycaprolactone (PCL) in chloroform, PCL-polyethylene glycol in chloroform, and collodion in amyl acetate; while in other embodiments, the polymer solution comprises a solution between two percent (2%) and ten percent (10%) by weight of cellulose acetate in acetone. In yet further embodiments, the polymer solution comprises a twenty five percent (25%) solution by weight of polydimethylsiloxane in heptane; or a solution of between five percent (5%) and ten percent (10%) by weight of polymethylmethacrylate in toluene; or a five percent (5%) solution by weight of polyvinyl alcohol in de-ionized water.

Figure 60:
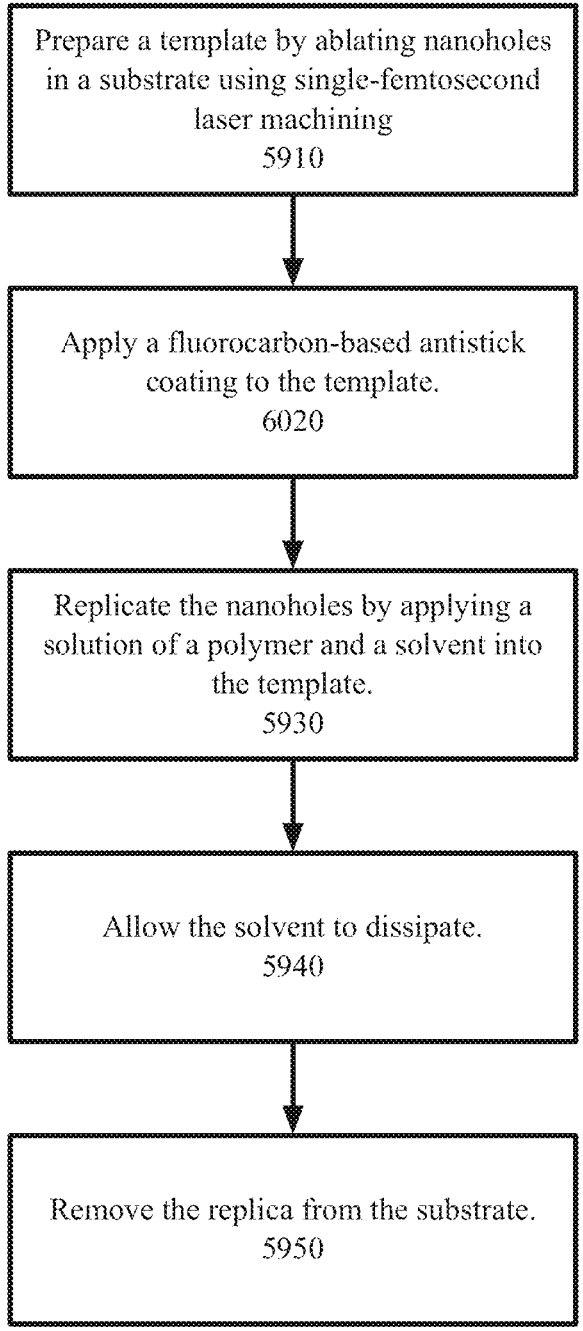
FIG. 60 example methods for casting a nanostructure in accordance with embodiments of the present technology are illustrated.

Referring to FIG. 60, and continuing to refer to FIG. 59 for context, further example methods 6000 for casting a nanostructure in accordance with embodiments of the present technology are illustrated in some embodiments, prior to applying a solution of a polymer and a solvent into the template (Block 5930), a fluorocarbon-based antistick coating can be applied to the template—Block 6020. In some such embodiments, the fluorocarbon-based antistick coating is prepared from perfluorodecyltrichlorosilane.

Figure 61:
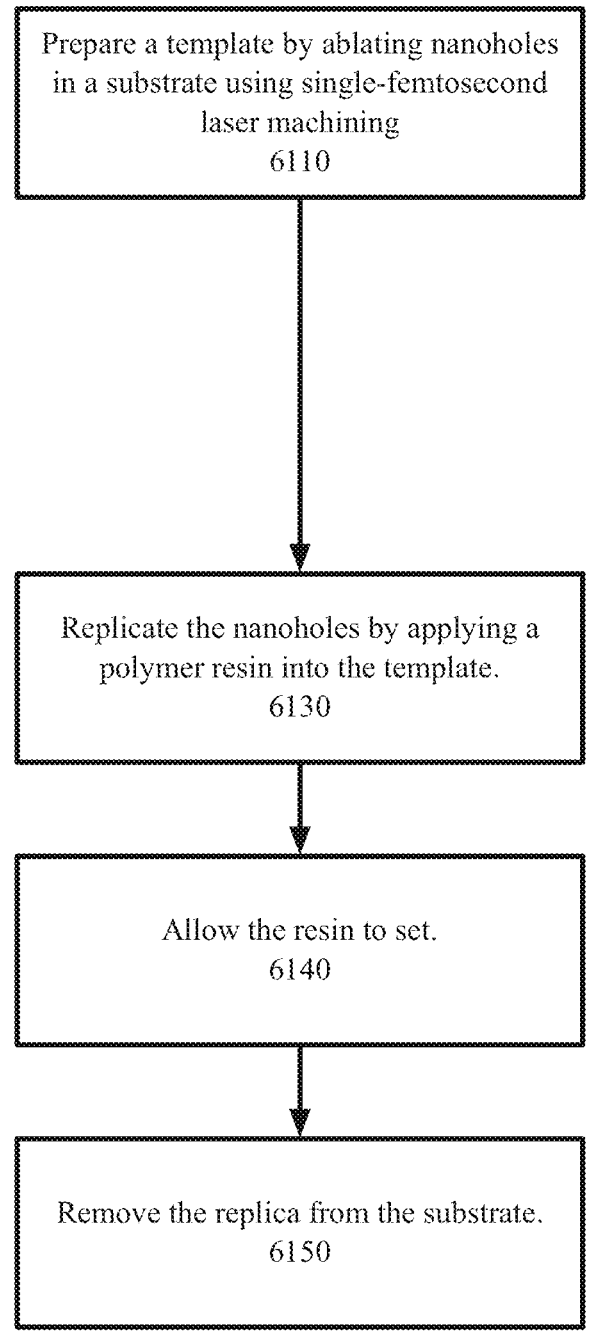
FIG. 61 example methods for casting a nanostructure in accordance with embodiments of the present technology are illustrated.

Referring to FIG. 61, an example method 6100 for casting a nanostructure is shown. In such methods, a template can be prepared by ablating nanoholes in a substrate using single-femtosecond laser machining—Block 6110. The nanoholes can be replicated by applying a polymer resin into the template—Block 6130. After allowing the resin to set (Block 6140), the replica can be removed from the substrate—Block 6150.

Figure 62:
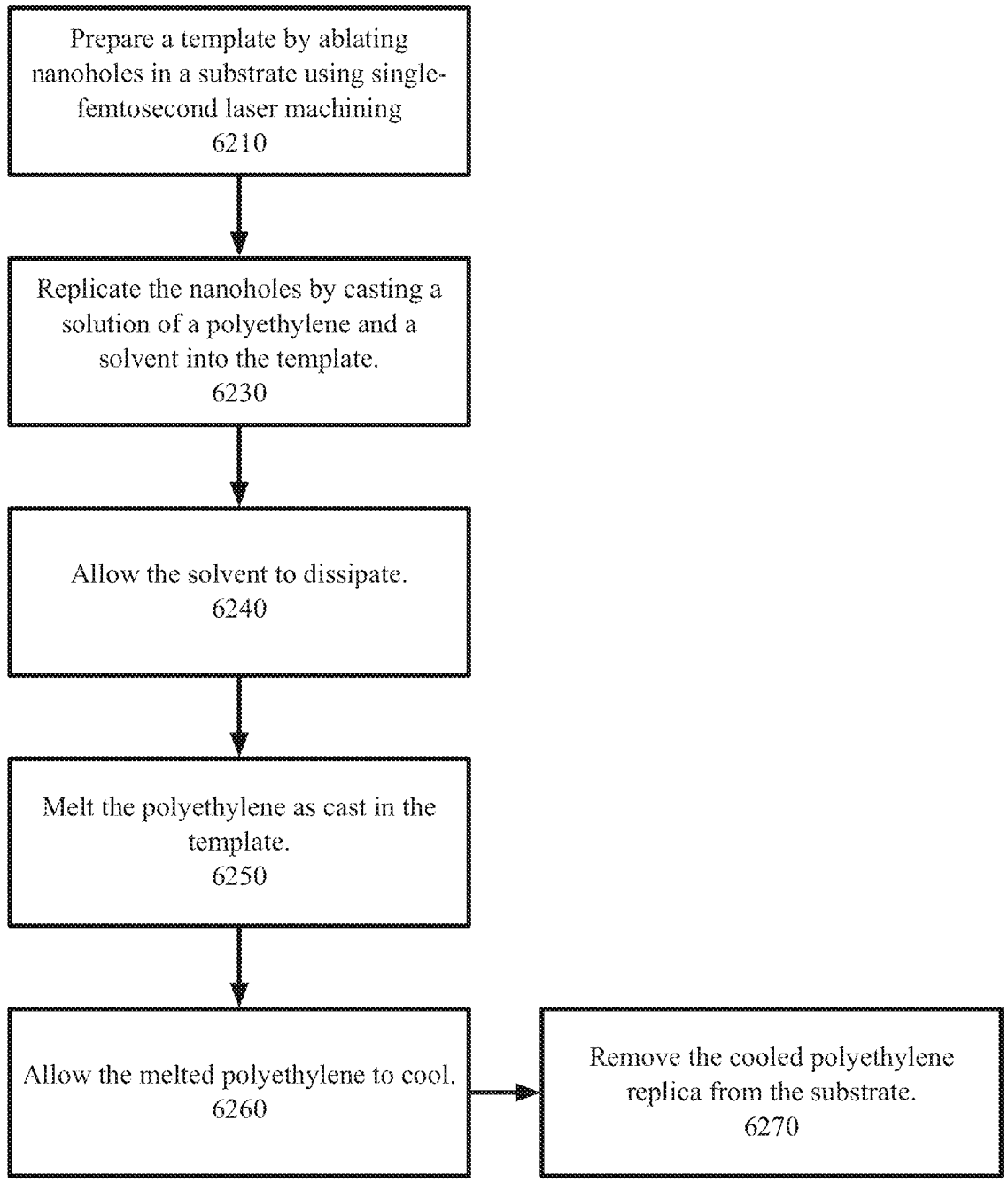
FIG. 62 example methods for casting a nanostructure in accordance with embodiments of the present technology are illustrated.

Referring to FIG. 62, an example method 6200, for casting a nanostructure is shown. In such methods, a template can be prepared by ablating nanoholes in a substrate using single-femtosecond laser machining—Block 6210. The nanoholes can be replicated by casting a solution of a polyethylene and a solvent into the template—Block 6230. After the solvent has been allowed to substantially dissipate (Block 6240), the polyethylene as cast in the template can be melted through application of energy—Block 6250. After allowing the melted polyethylene to cool (Block 6260), the cooled polyethylene replica can be removed from the substrate. In some such embodiments, the polymer solution comprises ten percent (10%) solution by weight of polyethylene in toluene. In some such embodiments, melting comprises heating to about one hundred fifty five (155) degrees Celsius for about two (2) minutes; and cooling comprises cooling at room temperature for at least about two (2) hours.

The nanostructures produced by the methods illustrated in FIG. 59 through FIG. 62 can find application in a wide variety of fields as disclosed herein throughout.

Consider two issues with regard to single pulse femtosecond laser machining First, the depth of the nanoholes produced can be greater than the depth of focus of the laser beam, i.e., the depth over which the beam remains tightly focused (measured as the depth over which the area of the beam increases by less than a factor of two). Second, the plasma formed due to optical breakdown and avalanche ionization, under most conditions, can become over-dense, opaque, reflective, and self-limiting, resulting in the formation of a shallow crater. Thus, mechanisms are needed to explain the formation of high aspect ratio and deep nanoholes. Three mechanisms have been proposed by different research groups: spherical aberration, self-focusing, and beam reshaping. These proposed mechanisms are not exclusive and may all play a role to some degree in the formation of deep, high aspect ratio features.

Spherical aberration is an optical phenomenon in which light rays passing through a spherical lens focus at different locations along the optical axis to cause to a prolonged focal region. The effect of spherical aberration on the formation of high aspect ratio nanoholes can be reasonably investigated using an aspheric lens. An aspheric lens has a non-spherical surface geometry designed to greatly reduce spherical aberration in the focal region of a perfectly collimated laser beam fully filling its entrance pupil. Thus, an aspheric lens (NA=0.68; Thorlabs, C330TME-B) was used for machining experiments and optical modeling. This particular aspheric lens was chosen because of its high numerical aperture and the availability of its detailed specifications and optical coefficients required for optical modeling.

Figure 46:
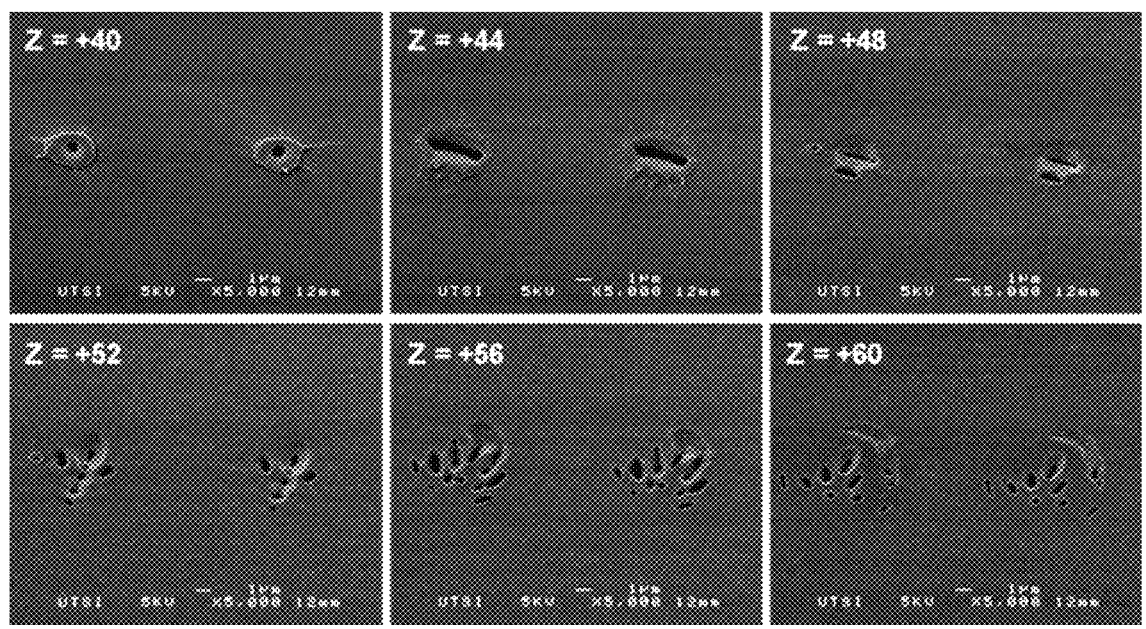
FIG. 46 presents SEM images of nanoholes made at the surface of fused silica by aspheric lens machining at different positions normal to the surface of the fused silica.
Figure 47:
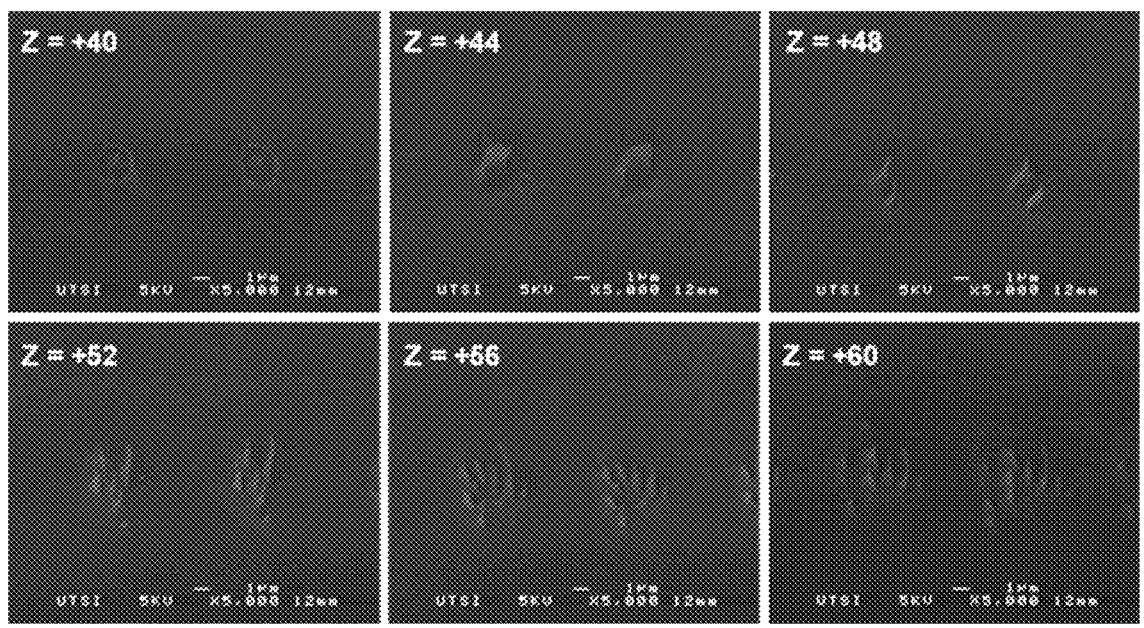
FIG. 47 presents SEM images of cellulose acetate replica of nanoholes shown in FIG. 46.

Aspheric lens machining of fused silica can be performed with the machining platform presented earlier. The lenses of the beam expander, shown in FIG. 6, can be adjusted so that the laser beam fully fills the entrance pupil of the aspheric lens. The entrance pupil of the aspheric lens is 5 min in diameter. The machining can be performed at different relative positions of the optical focus with respect to the substrate surface (Z) as explained elsewhere herein. The laser pulse energy can be kept constant at 5.2 µJ. SEM images of nanoholes made on a fused silica substrate by aspheric lens machining and their corresponding cellulose acetate (CA) replicas are shown in FIG. 46 and FIG. 47, respectively. It can be seen from these replicas that the depth of nanoholes decreases when the laser beam fully fills the entrance pupil of the aspheric lens. The deepest nanoholes can be around 4 µm for Z=+52 to Z=+60 from their CA replicas. The cellulose acetate replicas show that the aspheric lens machined nanoholes are not as deep as those machined by the 60× and 160× microscope objectives. The aspheric lens can minimize the spherical aberration in the focal region of the laser beam even when its entrance pupil is fully filled. Thus, the formation of shallow nanoholes (maximum 4 µm) by aspheric lens machining might be expected to be due to the reduced spherical aberration in the focal region of the laser pulse. However, it can be seen from the SEM images in FIG. 46 that the single amplified femtosecond laser pulse undergoes multiple fragmentations upon focusing through the aspheric lens to form several nanoholes arranged in a crescent shape that resembles the structure of a cat's paw (from Z=+52 to Z=+60). The formation of crescent-shaped laser damaged regions may be because the aspheric lens has a high numerical aperture and hence is very sensitive to minor beam misalignments, which may result in optical aberrations in the focal region. In fact, it is known that misalignment of a high-NA lens results in comatic aberration or coma.

Figure 48:
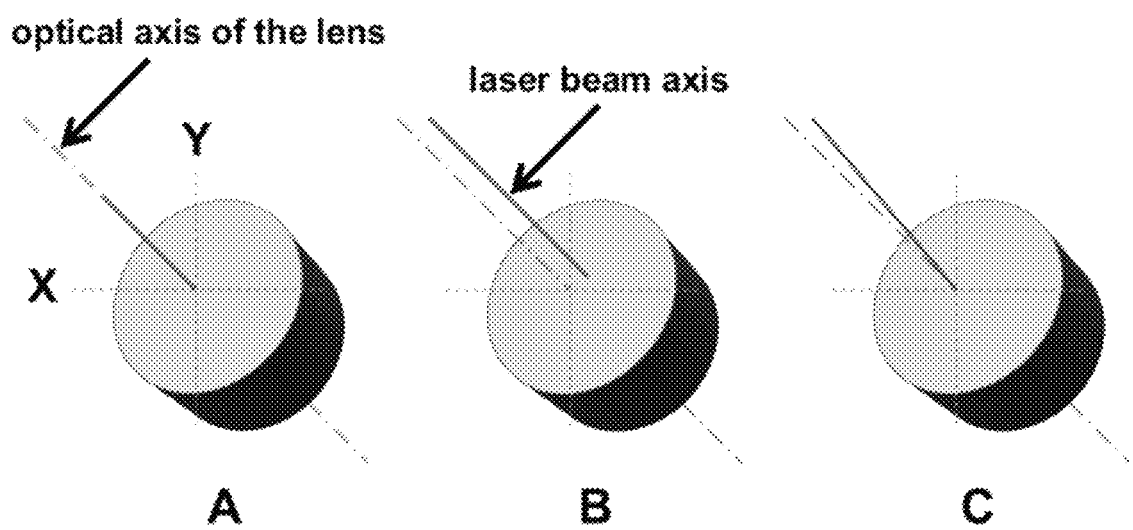
FIG. 48 are schematic representations of the single pulse femtosecond laser machining configurations modeled.

Three configurations were modeled in an optical design software application (Zemax by Radiant Zemax, LLC) to demonstrate that the cause of the structures is misalignment of the aspheric lens. These configurations are based on the propagation path of the laser beam (i.e., laser beam axis) with respect to the optical axis of the aspheric lens and are schematically shown in FIG. 48. The configurations modeled were: ideal condition (i.e., the laser beam axis coincides with the optical axis), the laser beam decentered 0.5 mm in both X-axis and Y-axis, and the laser beam tilted at an angle of 0.5° to the optical axis. In the model A) ideal condition: the laser beam axis is parallel to the optical axis of the aspheric lens and travels through the center of its entrance pupil, B) the laser beam axis is decentered 0.5 mm each in X and Y directions, and C) the laser beam axis is tilted by 0.5° to the optical axis of the lens. The red line shows the axis of the laser beam, where the actual laser pulse fully fills the entrance pupil of the aspheric lens.

The laser beam intensity profiles at and near the focal region for the aforementioned conditions were estimated by Zemax modeling. Two assumptions were made: the spatial profile of the laser beam is perfectly Gaussian; and, the entrance pupil of the aspheric lens is fully filled with the laser beam (i.e., the $1/e^2$ intensity radius of the Gaussian beam equals the 2.5 mm pupil radius of the lens).

Figure 49:
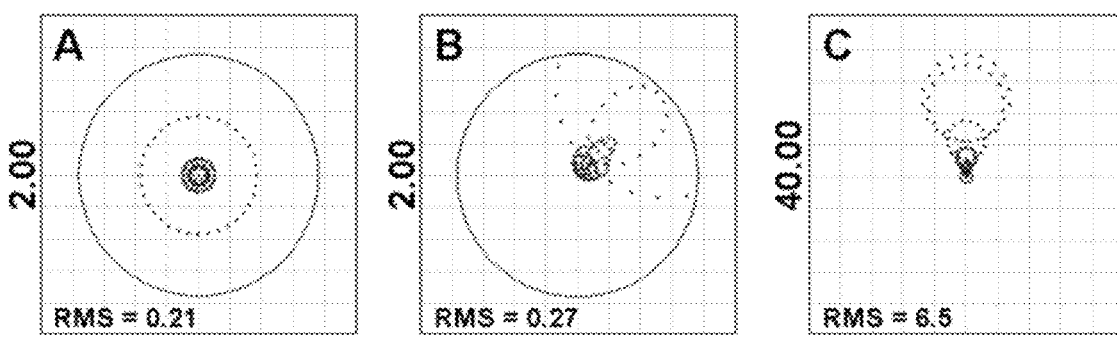
FIG. 49 illustrates the spot radius at the image plane after the laser beam focused through the aspheric lens.
Figure 50:
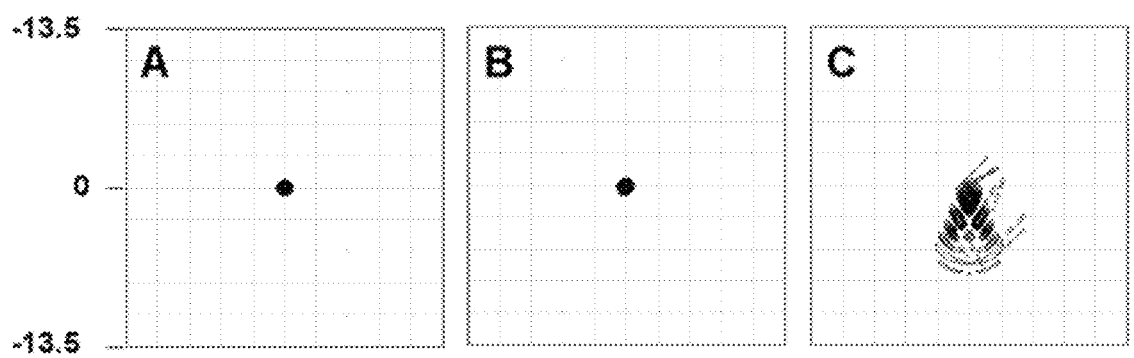
FIG. 50 illustrates the surface contour of the fast Fourier transform (FFT) of the Huygens point spread function (PSF) at the image plane corresponding to FIG. 49.

FIG. 49 and FIG. 50 show the focal spot diagrams and the corresponding Huygens point spread functions (PSF), respectively, for the three configurations modeled in Zemax. The PSF was obtained using a fast Fourier transform (FFT) function built-in in the Zemax. A represents the ideal condition; B represents a 0.5 mm decenter each in X-Y, and C represents 0.5 degree tilt with respect to the optical axis of the lens. The black circle represents the Airy Disk. The scale bar and RMS are in micrometers (μm). The spot radius is within the diffraction limit in the ideal condition, as indicated by the rays falling within the Airy disk (black circle) in FIG. 49 (A), and its root mean square value (RMS) of ~0.21 μm being less than the radius of the Airy disk. Similarly, the spot radius in the second case (the laser beam is decentered 0.5 mm each in X and Y directions) also appears to be within the diffraction limit, but with a slight increase in its RMS value to ~0.27 μm. The shape of the spot, however, is no longer completely circular and shifts marginally in the XY directions; some rays form elliptical shapes but yet remain within the Airy Disk as seen in FIG. 49 (B). It indicates that decentering the laser beam up to 0.5 mm each in X and Y directions is still close to the ideal condition. FIG. 49 (C) shows the spot diagram when the laser beam arrives at an incidence angle of 0.5° with respect to the optical axis of the aspheric lens. It can be seen that this slight tilt can result in pronounced comatic aberration as the spot radius is larger than the diffraction limit, and the spot radius RMS value has increased to ~6.5 μm (nearly 30 times larger than that in the ideal condition). This comatic aberration (or coma) due to tilting is most likely the cause for the laser damage region to acquire the crescent shape, see FIG. 46.

FIG. 50 shows the surface contours of the Huygens point spread functions (PSF) for the three configurations. The scale bar is in micrometers (μm). It estimates the intensity of the focused laser beam when diffraction is accounted for. As shown in FIG. 50, the 0.5 mm decentered laser beam and the ideal condition are similar in terms of intensity distribution as the intensity of the focused beam predominantly lies in a tight spot in both the cases. However, in the case of the laser beam being tilted with respect to the optical axis of the lens, the surface contour shows a distribution of intensity forming the shape of a tear drop, FIG. 50 (C), which resembles the cat's paw structure formed due to multiple fragmentations observed in nanoholes in FIG. 46. Based on these results, an angle as small as 0.5° between the incident laser beam axis and the optical axis of the aspheric lens can lead to comatic aberration in the focal region of the laser beam. Furthermore, the comatic aberration in the focal region of the laser beam can lead to multiple fragmentations of the intensity distribution resulting in the formation of cat's paw structure.

Figure 51:
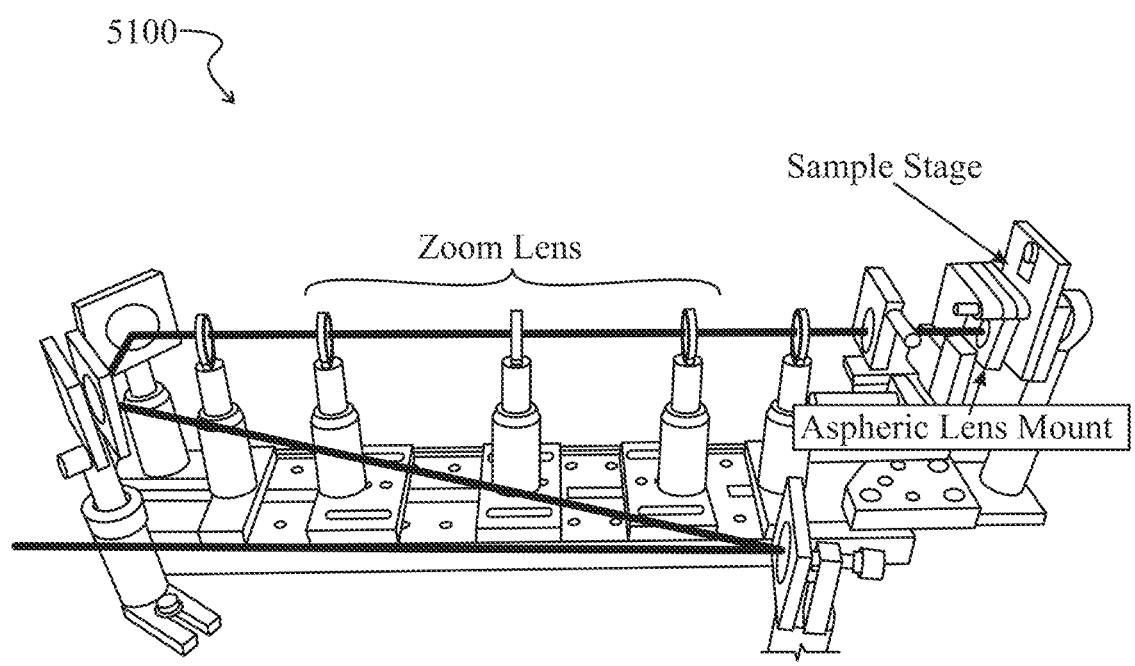
FIG. 51 illustrates a beam path originating from an amplified femtosecond laser set-up (bottom left), passing through the zoom lens, and focusing on the substrate (mounted on a motorized stage) through the aspheric lens used for single pulse femtosecond laser machining with an aspheric lens.
Figure 52:
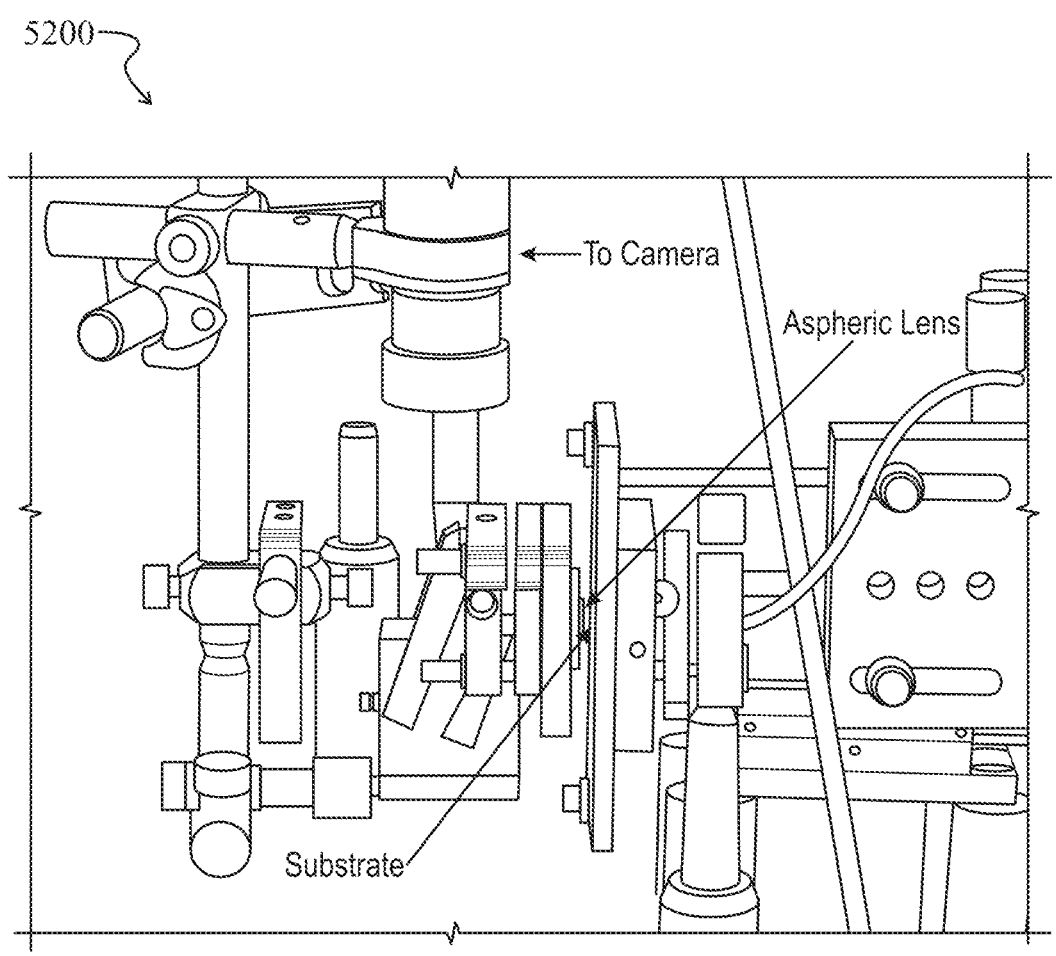
FIG. 52 illustrates a front view close-up of the aspheric lens and the substrate stage of the system of FIG. 51.

Optical modeling shows that aspheric lens machining of fused silica is influenced by tilt between the optical axis of the lens and the laser beam propagation axis. Thus, it is beneficial to remove angular deviation between the laser beam axis and the optical axis of the aspheric lens to conclusively study the role of spherical aberration on nanohole formation. In order to obtain beam alignment to reduce comatic aberration, a platform that allows the manipulation of spherical aberration in the focal region of the laser beam is presented. A set of three lenses, two identical plano-concave (f=−100 mm) and one biconvex (f=100 mm), referred to as zoom lens from this point onwards, can be placed before the aspheric lens in the machining platform. The arrangement of the zoom lens and the substrate stage is illustrates in FIG. 51.

Software can be used to model the zoom lens to find different configurations, i.e., lens separations, for which spherical aberration can be either minimum or significant in the focal region of the laser beam. Conditions for both positive and negative longitudinal spherical aberration can be determined using the software. Configurations obtained by modeling, i.e., with and without spherical aberration, can be subsequently used for laser machining of fused silica substrates. Fused silica substrates thus machined can be characterized by SEM analysis of the laser damaged regions and the respective cellulose acetate replicas to determine the size of the nanoholes. Results obtained can be compared and analyzed to understand the role of spherical aberration on the formation of high aspect ratio deep nanoholes.

This system consists of a 527 nm Q-switched Nd:YLF pump laser (Evolution, Coherent, Inc.), a titanium-sapphire laser oscillator (Micra, Coherent, Inc.), and a titanium-sapphire regenerative amplifier (Legend, Coherent, Inc.). The output from the amplifier is a train of up to 1 kHz laser pulses of wavelength 800 nm; but the laser is operated to give a single pulse on-demand. The pulse duration is 40 femtoseconds with maximum energy per pulse of 1.6 mJ. The LabVIEW™ program also generates a trigger pulse (from a DAQ card) to command the laser to give a single pulse when needed.

In order to understand the role of spherical aberration on nanohole formation, it is informative to compare nanoholes made with a laser beam exhibiting no longitudinal spherical aberration (LSA) and one exhibiting significant LSA in its focal region, while at the same time taking care to maintain the same numerical aperture and to avoid overfilling of the focusing lens, which leads to energy deposited around the focal point due to diffraction. A zoom lens consisting of three spherical lenses can be used to obtain minimum LSA and significant LSA in the focal region of the laser beam focused through an aspheric lens. There are two signs of LSA: negative LSA and positive LSA. Negative LSA (also called overcorrected spherical aberration) results when the marginal rays refract less than the paraxial rays, whereas positive LSA (undercorrected) results when the marginal rays refract more than the paraxial rays. Changing the degree of collimation of the beam that enters the aspheric focusing lens can introduce a significant amount of LSA in the focal region. A converging laser beam focused through the aspheric lens (but fully filling the entrance pupil) results in positive LSA, whereas a diverging laser beam results in negative LSA. Negative and positive LSAs can be introduced in the focal region of the laser beam by varying the amount of collimation.

Figure 53:
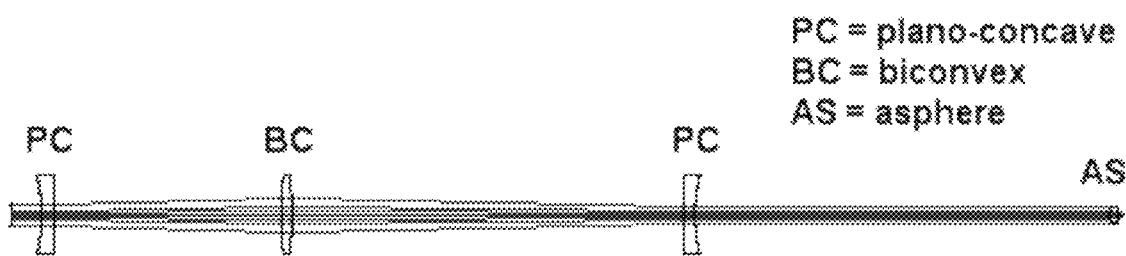
FIG. 53 illustrates a software model layout showing the zoom lens and the aspheric lens.
Figure 54:
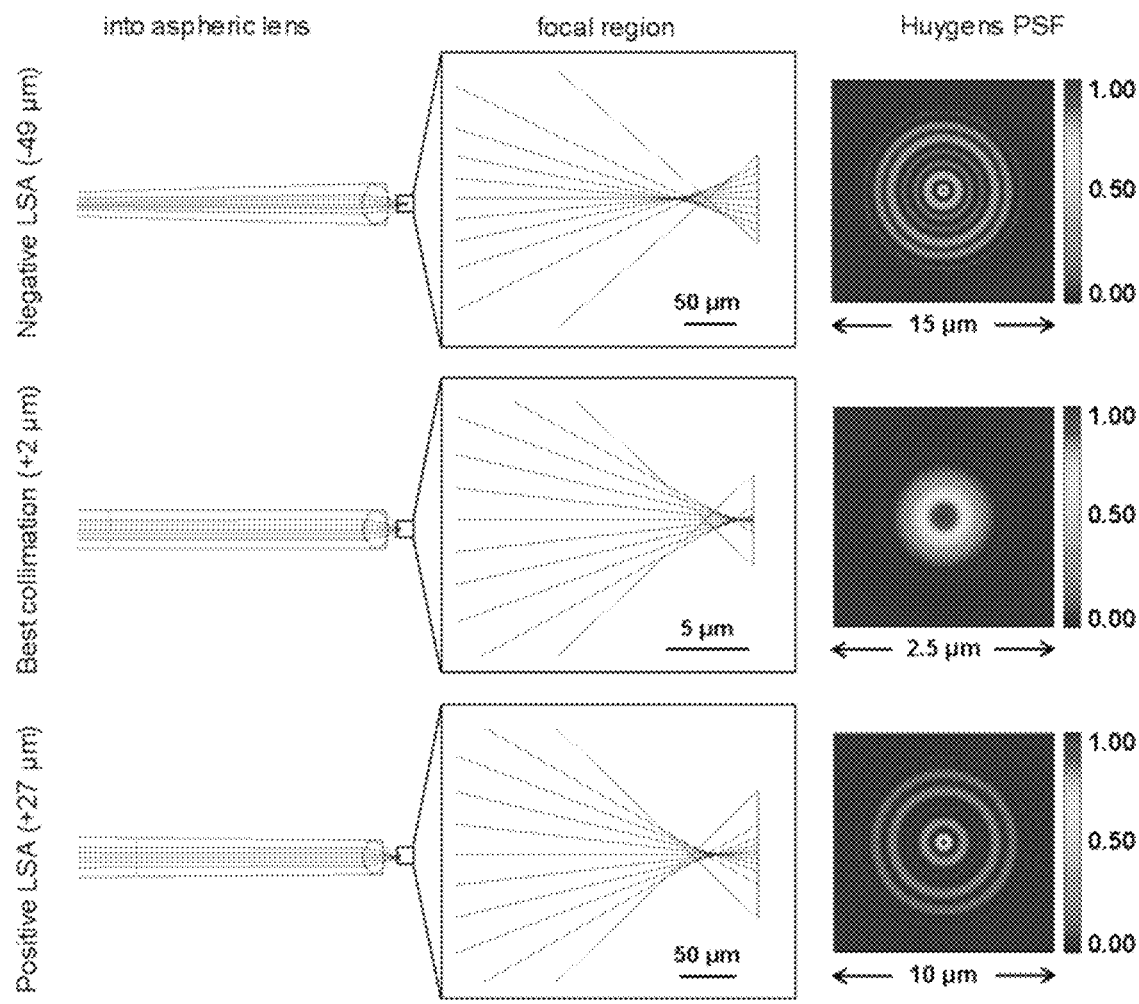
FIG. 54 illustrates a detail of a software model layout showing the zoom lens and the aspheric lens.

The lens separations in the zoom lens required to obtain these three conditions (positive LSA, minimum LSA, and negative LSA) can be found with the help of software modeling. In the model, the lens separations can be optimized so that the aspheric lens pupil is fully filled and so as to give the greatest divergence, maximum collimation, and greatest convergence of the beam entering the aspheric lens, which in turn results in most positive LSA, close to zero LSA, and most negative LSA in the focal region. The diameter of the laser pulse (1/e 2 value) and the beam divergence required for modeling were measured to be 6.44 mm and −0.122 milliradians, respectively, by using a power ratio method. The zoom lens can decrease the beam size to exactly fill the pupil of the asphere, without overfilling it, and it also can adjust the collimation of the beam before the asphere and hence the longitudinal spherical aberration in the focal region of the laser pulse. Since the zoom lens can be mounted on a rail of fixed length, the maximum achievable positive and negative LSAs are limited. The three conditions found by modeling used for aspheric lens machining experiments are: negative LSA of −49 μm, close to zero LSA (termed best collimation) of +2 μm, and positive LSA of +27 μm. FIG. 53 shows a ray tracing of these three conditions and the corresponding Huygens point spread function. It shows ray tracing of 800 nm wavelength laser beam entering the aspheric lens after going through the zoom lens (bottom). The Huygens PSF is plotted at the focal point from the front of the lens on the optical axis for the three machining conditions. The distance from the front of the lens to the focal position for each of these conditions are: 1.9 mm for negative LSA, 1.76 mm for best collimation, and 1.711 mm for positive LSA.

The aspheric lens machining experiments under these three conditions (negative LSA, best collimation, and positive LSA) can be done at three different values of laser pulse energy (1.2 μJ, 3.5 μJ, and 38 μJ) after aligning the optical elements and the substrate. In order to reduce comatic aberration arising due to angular deviation between the laser beam path and the aspheric lens optical axis, the three lenses of the zoom lens and the aspheric lens can be aligned with the help of a green laser pointer (532 nm wavelength). The green laser is in the visible range and is reflected by the aspheric lens coated with an anti-reflective coating for the 600 nm-1050 nm wavelength range. Furthermore, the optical leveling of the fused silica substrate also can be performed with the green laser beam in lieu of the stylus, so that substantially identical holes are machined for analysis. Note that the calibration of the surface profile with the stylus prior to femtosecond machining provides the advantage that the focal position of the sample can be adjusted to compensate for surface irregularities in the substrate. SEM images of the cellulose acetate replicas of the aspheric lens machined nanoholes are shown in FIG. 55.

SEM images of the CA replicas show that the aspheric lens machining of fused silica with negative LSA did not usually produce deep nanoholes for the three pulse energies tested. However, some of the nanoholes made with 38 μJ appear to be ~8 μm deep from their CA replicas. Note, with respect to the nanoholes made with negative LSA, the appearance of concentric rings in the laser damaged region (or the laser footprint) as seen from their CA replicas. The concentric rings appear to be due to diffraction of the laser pulse and can be seen in the Huygens point spread function (PSF) in FIG. 53 for negative LSA.

Figure 55:
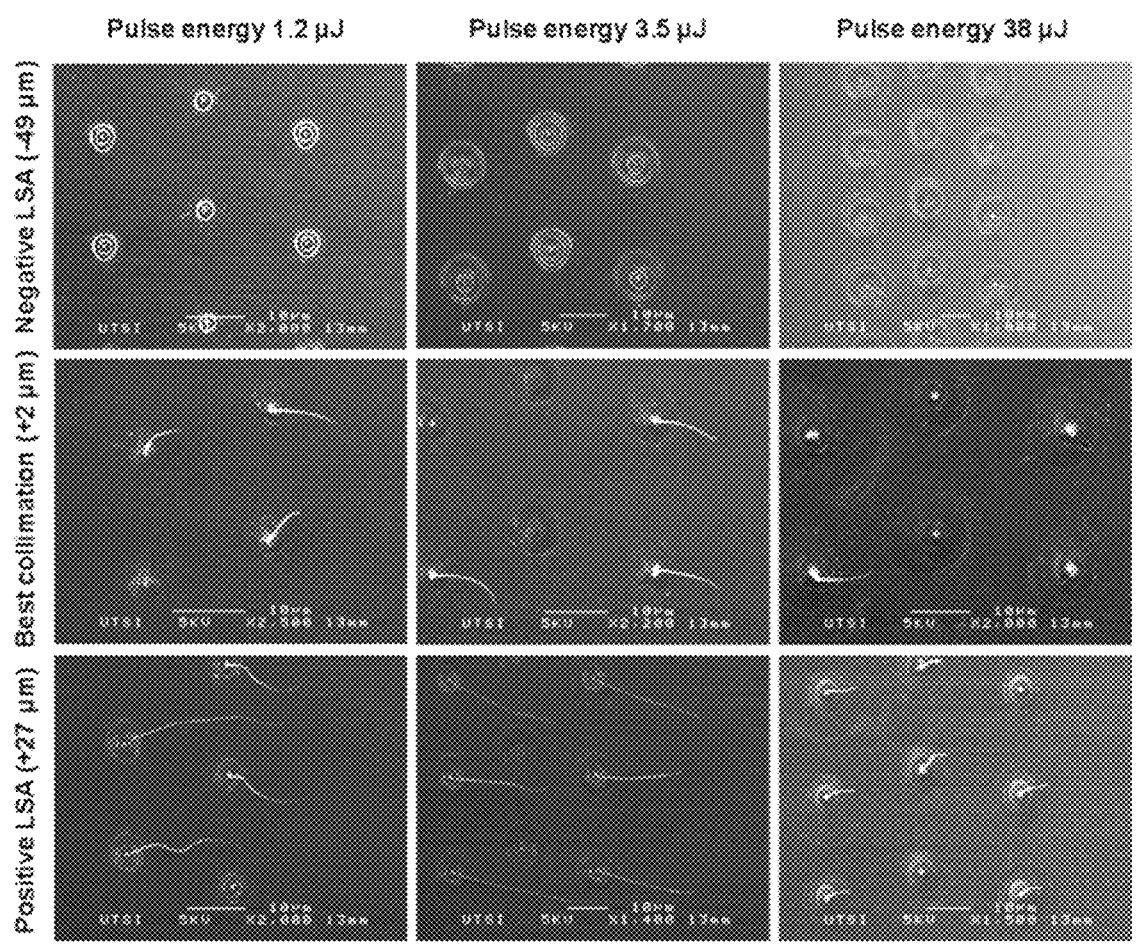
FIG. 55 present zero degree tilt SEM images of cellulose acetate replicas of nanoholes made at the surface of fused silica by aspheric lens machining.

It can be deduced from the SEM images, shown in FIG. 55, that the nanoholes produced in best collimation condition (+2 μm LSA) are deeper than the expected depth of focus of the tightly focused laser beam and are also deeper than the shallow crater that is usually observed from a self-limiting over-dense laser-induced plasma. The average length of the CA nanowires imprinted from these nanoholes is 10 μm for all the values of laser pulse energy, thus the nanoholes are at least up to 10 μm in depth.

It can be seen from the SEM images that even deeper nanoholes are produced with positive LSA. For LSA of +27 μm and pulse energy of 3.5 μJ the length of the CA nanowires can be measured to be ~32 μm, which indicates that the nanoholes can be at least as deep as 32 μm. Furthermore, the nanoholes made at 1.2 μJ pulse energy with the positive LSA of +27 μm also appear to be around 30 μm deep as indicated by their cellulose acetate replicas. However, the nanoholes made by 38 μJ pulse energy are only −8 μm in depth. The size of the laser footprint, as depicted by the CA replica, can increase with laser pulse energy irrespective of the sign and the magnitude of LSA. The depth of the nanohole, however, was not found to increase with the laser pulse energy. In fact, the deepest nanoholes were machined with 1.2 μJ (30 μm deep) and 3.5 μJ (32 μm deep) laser pulse energy values compared to 38 μJ (8 μm deep) in positive LSA conditions.

Figure 56:
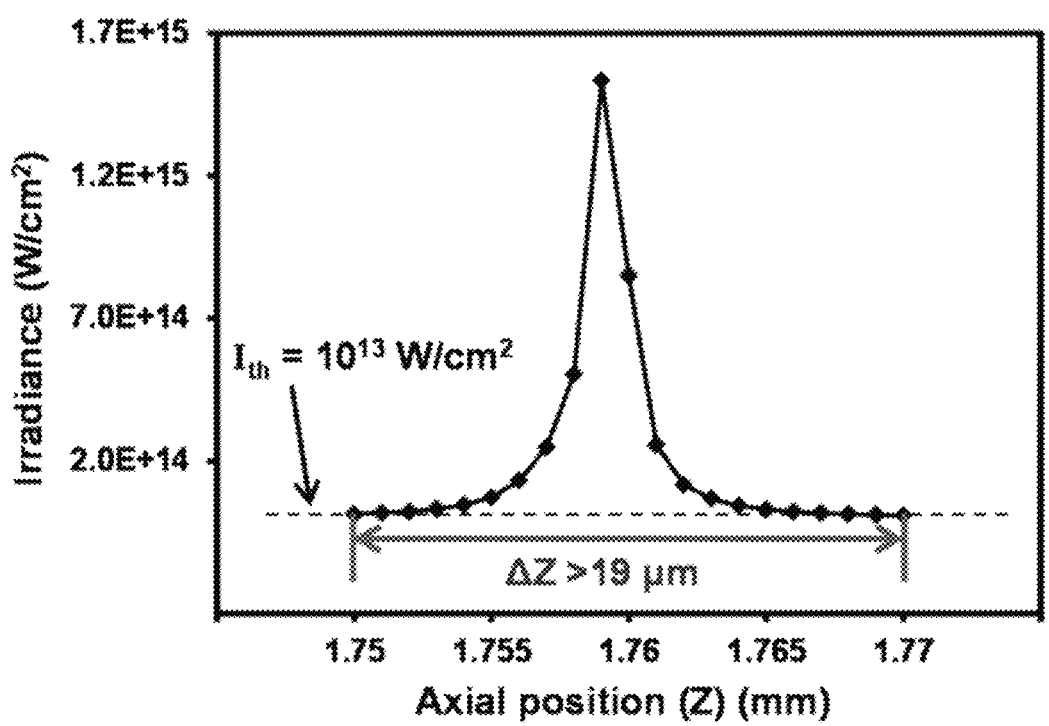
FIG. 56 is an irradiance profile of a femtosecond laser pulse with +2 µm LSA (best collimation) as a function of axial position near the focal region (focal position=1.76 mm).

The formation of 10 μm deep nanoholes in fused silica with reduced spherical aberration in the focal region (best collimation condition, LSA+2 μm) indicates that spherical aberration is not required to create holes deeper than the depth of focus of the beam. For a diffraction-limited focused Gaussian beam, in the paraxial approximation (NA=sin θ≈θ (radians)), the depth of focus is two times the Rayleigh range, $2z_R=2\lambda/(n\pi NA^2)$, where $z_R$ is the Rayleigh range, λ=0.8 μm is the laser wavelength, n=1.47 is the refractive index of fused silica, and NA is the numerical aperture of the focusing lens. For the aspheric lens with NA=0.68, this gives $2z_R$=0.75 μm. However, the plasma may be created over a greater depth provided the laser irradiance is above the damage threshold, which is about $10^{13}$ W/cm$^2$ for fused silica. FIG. 56 shows the irradiance of the femtosecond laser pulse as a function of axial position around the focal region for the best collimation condition (focus at 1.76 mm) in air computed using software modeling for a pulse energy of 1.2 μJ. The depth of damage threshold (ΔZ) was found to be >19 μm. The damage threshold for fused silica is Ith=1013 W/cm2. It can be seen that the depth over which the irradiance is above the damage threshold is more than 19 μm. This depth of damage threshold (AZ) is adequate to account for the observed nanohole depths (10 μm) made by focusing laser pulses with essentially no spherical aberration if the laser pulse energy can propagate through the plasma. While only a shallow feature might be expected because laser-induced plasmas are reflective if overdense (when the electron density is high enough such that the plasma frequency is above the optical frequency), in the case of breakdown induced by a femtosecond laser pulse, deeper features can be produced if a sufficient amount of the pulse energy propagates before the plasma is created.

Figure 57:
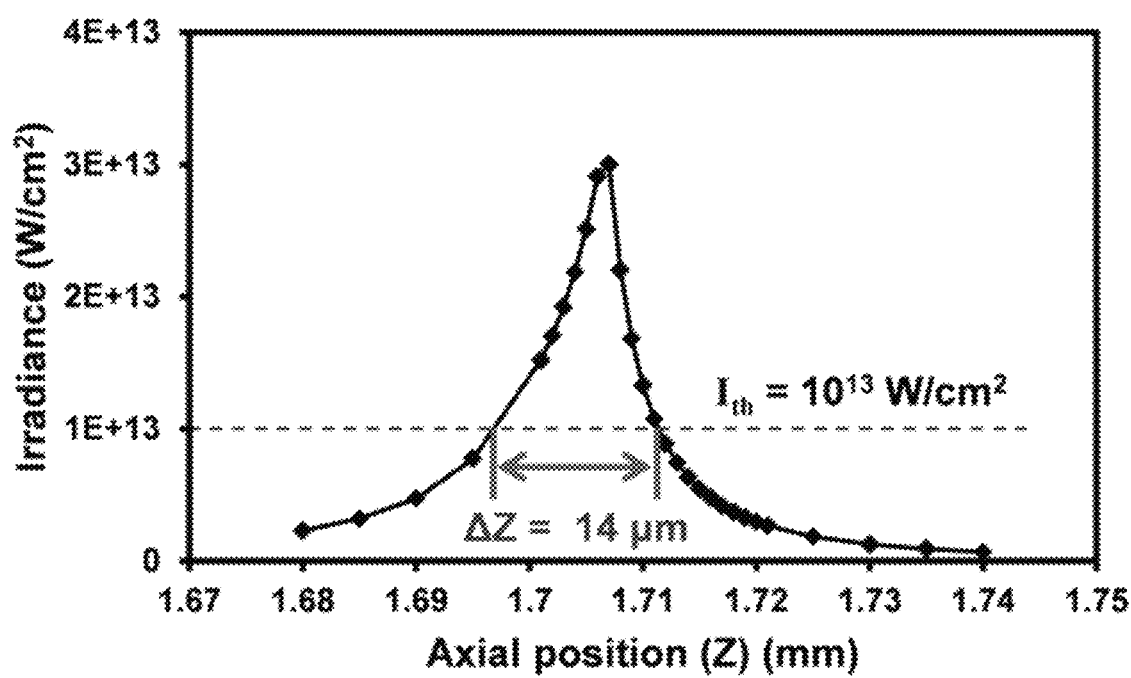
FIG. 57 is and irradiance profile of a femtosecond laser pulse with +27 µm LSA as a function of axial position near the focal region (focal position=1.711 mm).
Figure 58:
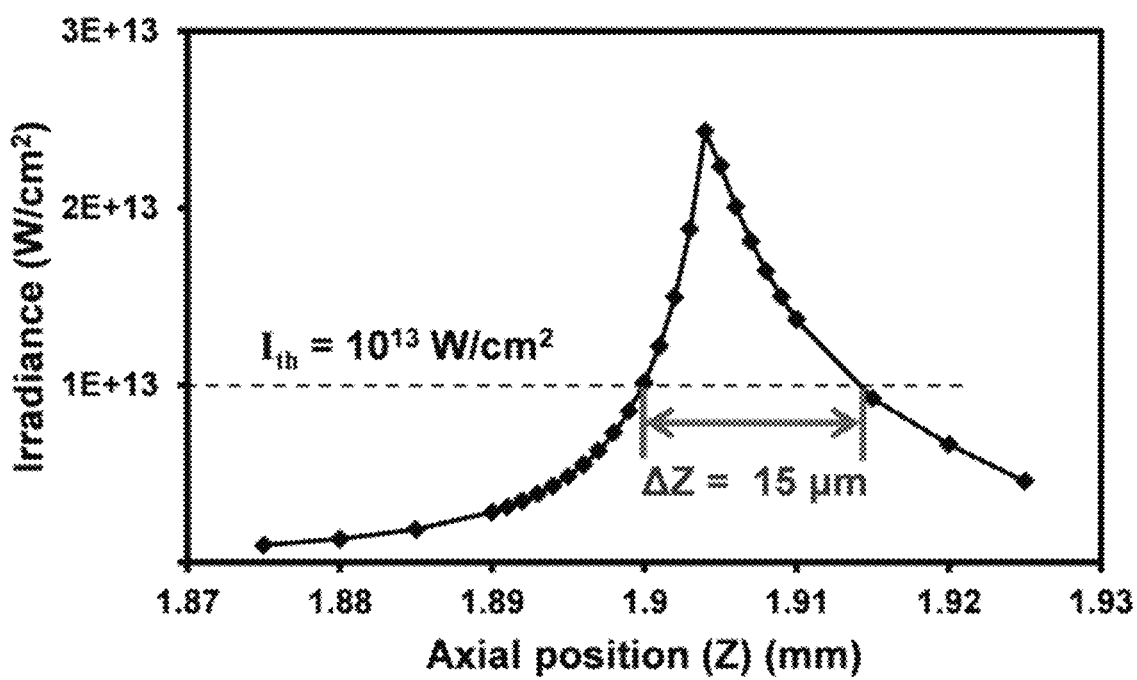
FIG. 58 is and irradiance profile of a femtosecond laser pulse with +49 µm LSA as a function of axial position near the focal region (focal position=1.711 mm).

When significant positive spherical aberration is introduced in the focal region of the laser pulse (LSA of +27 μm), the depth of the nanoholes can be up to 32 μm, which is much deeper than those made with no or negative spherical aberration. The increase in the nanohole depth occurs even though the calculated depth of damage threshold is less than that for no spherical aberration. When greater negative spherical aberration is introduced (LSA of −49 μm), the nanoholes can be very shallow at pulse energies of 1.2 and 3.5 μJ and up to about 8 μm for 38 μJ. As seen in FIG. 57 and FIG. 58, the depth of damage threshold in air along the axis was calculated to be ~14 μm for LSA of +27 μm and ~15 μm for LSA of −49 μm. The depth of damage threshold (ΔZ) was found to be ~14 μm. However, it should be noted that, refraction of the beam as it enters the surface induces spherical aberration near the focus that is not accounted for above. It is possible that this surface-induced aberration will further extend the depth of damage threshold along the axis to enable >30 μm deep nanoholes to be created in fused silica for the case of initial positive spherical aberration. In addition, the above calculations do not account for non-linear effects, such as Kerr-induced self-focusing and/or possible beam front reshaping into a diffraction-free Bessel beam at the surface of fused silica. Such effects may contribute as mechanisms for deep-hole formation. In summary, spherical aberration can alter the depths of the created holes, with positive LSA creating deeper holes than no or negative LSA.

Single-pulse amplified femtosecond laser machining has been developed into a new nanofabrication technology for production of templates on transparent substrates. It is essentially a direct-write nanolithography technique, which can pattern the surface of wide band gap materials like fused silica with user-defined arrangements of nanoholes with aspect ratios >10:1 and depths >10 µm. The lateral and vertical dimensions of the nanoholes are shown to be controllable during laser machining by regulating processing conditions and by chemical etching post-machining. The process is shown to be simple, economical, and less time consuming than other processes, thus making it useful for large scale production of templates.

Nanoholes made by amplified femtosecond laser single pulses, e.g., of energy 5.2 µJ, pulse duration 160 femtosecond, and wavelength 780 nm focused through a microscope objective lens of numerical aperture NA=1.25 in air, can be at least as deep as 14 ßµm by cellulose acetate replication of the patterned fused silica surface.

The diameter and the depth of the nanoholes can be affected by the relative position of the optical focus with respect to the substrate surface during laser machining. The deepest nanoholes can form when the optical focus is within the bulk of the substrate at a certain location from the substrate surface. Furthermore, the size and the morphology of the nanoholes made on fused silica substrates can be modified by a combination of sequential etching in hydrofluoric acid and potassium hydroxide.

The templates made by single-pulse amplified femtosecond laser machining can be useful as molds for imprinting high aspect ratio polymer structures by replication procedures. Two replication methods for imprinting polymer structures are shown to be beneficial: film based replication and solution casting. The film based replication procedure can use commercially available polymer films, whereas solution casting can be based on polymer solutions made in common organic solvents. Solution casting presents several advantages over film-based replication. Solution casting offers a measure of control over the final chemistry of the imprinted polymer structures, and can allow imprinting of thermoset polymers, which are otherwise not possible with film-based replication. Nanocones and micropillars of polycaprolactone (PCL), PCL—polyethylene glycol (PEG), cellulose acetate (CA), polyethylene (PE), polyvinyl alcohol (PVA), polymethylmethacrylate (PMMA), Collodion, and polydimethylsiloxane (PDMS) can be imprinted from as-machined and etched fused silica templates, respectively, by solution casting. PCL and PCL-PEG structures imprinted from as-machined templates can stretch during imprint lift-off and take the form of nanocarpets or nanomats with very high surface area and aspect ratios greater than 200:1. All the aforementioned polymers except PCL and PCL-PEG can adopt the shape and dimensions close to that of the nanoholes they are imprinted from, though some stretching of the nanocones is also observed. Furthermore, most of the PDMS nanocones can fall over, but without breaking or stretching, because of the low Young's modulus of PDMS. None of the polymer micropillars have been found to stretch, break, or fall over due to stiffness.

Polymer structures imprinted from amplified femtosecond laser machined fused silica substrates can be functionalized by coating with thin layers of gold, platinum, and palladium by sputter coating and silica by chemical vapor deposition. Sputter coating of noble metals can be performed at cryogenic temperatures to mitigate bending or collapsing of polymer nanowires by impact of fast moving ions. For this purpose, the sputtering system can include a liquid nitrogen cold finger so that the polymer nanowires become stiff below their glass transition temperatures and withstand the impact of ions during coating deposition. A low-temperature chemical vapor deposition process can deposit silica on cellulose acetate nanowires to fabricate silica nanowires, based on the hydrolysis of silicon tetrachloride molecules adsorbed at the surface of CA nanowires, which completes in two separate beakers and results in the formation of a thin layer of silica. The thickness of the silica coating can increase with the increase in the exposure time to silicon tetrachloride.

Silica nanowires produced by this technique can be useful as synthetic cell culture substrates with tunable 3D microenvironment for cell behavioral studies. The cells can adhere and align along silica nanowires, thus making silica nanowires a useful material for tissue engineering. Furthermore, focused ion beam sectioning of a silica nanowire tip demonstrates the utility of fabricating open-tip silica nanoneedles that can find applications as cellular patch clamps for intravital imaging and electrophysiological studies.

The role of spherical aberration on the formation of high aspect ratio and deep nanoholes was investigated with the help of aspheric lens machining and optical modeling using Zemax software. An aspheric lens of NA=0.68 can be used to machine nanoholes at the surface of fused silica by varying the amount of longitudinal spherical aberration (LSA) in the focal region of the laser pulse determined by optical modeling. Negative LSA, minimum possible LSA, and positive LSA can be introduced in the focal region of a 40 femtosecond laser pulse of wavelength 800 nm by varying the collimation at the entrance pupil of the aspheric lens. The depths of the nanoholes thus produced can be determined by cellulose acetate replication, and it the deepest nanoholes can be made by positive LSA, the next deepest by minimum LSA and the shallowest by negative LSA. The nanoholes made by minimum LSA of +2 µm can be 10 µm deep for pulse energy in the range 1.2-38 µJ, which indicates that spherical aberration is not required to create holes deeper than the depth of focus of the beam. However, if sufficient pulse energy can pass through or around the plasma, the calculated depth of damage threshold along the axis is adequate to account for the observed hole depths. When positive longitudinal spherical aberration of 27 µm is introduced in the focal region of the femtosecond laser pulse, the depth of the nanoholes can increase to 30-32 µm for pulse energies of 1.2-3.5 µJ, even though the calculated depth of damage threshold decreases to 14 µm.

The formation of deep and high aspect ratio nanoholes cannot be exclusively attributed to the presence of spherical aberration in the focal region of the laser pulse, though hole-depth can increase with the increase in positive longitudinal spherical aberration up to a certain pulse energy. Transmission of a significant part of the pulse energy through or around the first part of the laser-induced plasma as well as self-focusing due to Kerr nonlinearity and/or nonlinear laser pulse reshaping into a non-diffractive Bessel beam could also be important in the formation of deep and high aspect ratio nanoholes at the surface of fused silica by single-pulse femtosecond laser ablation.

Although specific example embodiments of the present technology have been described above in detail, the description is for purposes of illustrating the range of embodiments of the technology conceived by the inventors. Various modifications of, and equivalent elements corresponding to, the disclosed aspects of the technology, in addition to those described above, can be made by those having ordinary skill in the art without departing from the spirit and scope of the following claims, the scope of which is to be accorded an interpretation to encompass such modifications and equivalent structures.

We claim:

1. A method for fabricating a nanofiber array, comprising:
providing a mold comprising a surface in which is formed a plurality of nanoholes [,] wherein each nanohole of the plurality is laser-ablated in the surface of the mold;
applying a flowable polymer into the plurality of nanoholes; and
extracting an array of polymer nanofibers from the mold.

2. The method of claim 1, wherein the nanofibers are not hollow or porous.

3. The method of claim 1, wherein the nanofibers have an aspect ratio of at least ten-to-one.

4. The method of claim 1, wherein the nanofibers have a diameter of less than 1000 nanometers.

5. The method of claim 1, wherein the nanofibers have an aspect ratio of at least ten-to-one and a diameter of less than 1000 nanometers.

6. The method of claim 1, wherein:
the mold comprises a transparent substrate; and
the surface in which the plurality of nanoholes is formed is on the transparent substrate.

7. The method of claim 1, wherein the flowable polymer is a polymer solution.

8. The method of claim 1, wherein the array of polymer nanofibers comprises a plurality of freestanding polymer nanofibers extending from a surface of a polymer substrate.

9. The method of claim 8, wherein the polymer nanofibers are positioned on the polymer substrate in a non-random, user-defined pattern.

10. The method of claim 1, wherein said extracting is lifting or peeling the array of polymer nanofibers away from the surface of the mold.

11. The method of claim 1, wherein applying a flowable polymer into the plurality of nanoholes comprises applying the flowable polymer into the nanoholes until the flowable polymer covers at least a portion of the surface of the mold and connects at least some of the plurality of nanoholes.

12. The method of claim 1, wherein extracting an array of polymer nanofibers from the mold comprises allowing the flowable polymer to form a continuous film on a portion of the surface of the mold and removing the continuous film from the surface of the mold.

13. The method of claim 1, wherein:
the flowable polymer includes a polymer capable of forming a continuous film; and
the flowable polymer overflows the plurality of nanoholes and covers at least a portion of the surface of the mold such that the flowable polymer connects at least some of the plurality of nanoholes and forms the continuous film on the portion of the surface of the mold.

14. A method for fabricating a nanofiber array, comprising:
providing a mold comprising a transparent substrate having a surface in which a plurality of nanoholes is laser-ablated;
applying a flowable polymer into the plurality of nanoholes; and
extracting an array of polymer nanofibers from the mold.

* * * * *

UNITED STATES PATENT AND TRADEMARK OFFICE
CERTIFICATE OF CORRECTION

| | |
|---|---|
| PATENT NO. | : 12,109,737 B2 |
| APPLICATION NO. | : 18/139335 |
| DATED | : October 8, 2024 |
| INVENTOR(S) | : Hofmeister et al. |

It is certified that error appears in the above-identified patent and that said Letters Patent is hereby corrected as shown below:

In the Claims

At Column 39, Line 17, of Claim 1, "nanoholes [,]" should read "nanoholes,"

Signed and Sealed this
Third Day of December, 2024

Katherine Kelly Vidal
*Director of the United States Patent and Trademark Office*